(12) United States Patent
Momma et al.

(10) Patent No.: US 9,431,445 B2
(45) Date of Patent: Aug. 30, 2016

(54) REFLECTIVE OPTICAL SENSOR, IMAGE FORMING APPARATUS, AND SURFACE INFORMATION DETECTING METHOD

(71) Applicants: Susumu Momma, Kanagawa (JP); Kazuya Miyagaki, Kanagawa (JP); Koji Masuda, Kanagawa (JP); Hidemasa Suzuki, Kanagawa (JP)

(72) Inventors: Susumu Momma, Kanagawa (JP); Kazuya Miyagaki, Kanagawa (JP); Koji Masuda, Kanagawa (JP); Hidemasa Suzuki, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 14/815,028

(22) Filed: Jul. 31, 2015

(65) Prior Publication Data

US 2016/0033914 A1 Feb. 4, 2016

(30) Foreign Application Priority Data

Aug. 1, 2014 (JP) .................................. 2014-157620
Nov. 21, 2014 (JP) .................................. 2014-236442

(51) Int. Cl.
*G03G 15/20* (2006.01)
*H01L 27/146* (2006.01)
*G03G 15/00* (2006.01)

(52) U.S. Cl.
CPC ..... *H01L 27/14625* (2013.01); *G03G 15/2053* (2013.01); *G03G 15/553* (2013.01); *G03G 15/2039* (2013.01); *H01L 27/14618* (2013.01)

(58) Field of Classification Search
CPC ................... G03G 15/0856; G03G 15/0862; G03G 15/0855; G03G 15/105
USPC .......................................................... 399/33
See application file for complete search history.

(56) References Cited

U.S. PATENT DOCUMENTS

| | | | |
|---|---|---|---|
| 6,229,972 B1* | 5/2001 | Rushing | G03G 15/5041 399/49 |
| 2005/0018038 A1* | 1/2005 | Ramanujan | G02B 13/22 347/241 |
| 2006/0109478 A1* | 5/2006 | Tearney | A61B 5/0066 356/479 |
| 2006/0170810 A1* | 8/2006 | Kim | G02B 3/0018 348/340 |
| 2009/0060381 A1* | 3/2009 | Dunki-Jacobs | A61B 1/0008 382/275 |
| 2009/0238590 A1* | 9/2009 | Masuda | G03G 15/0178 399/49 |
| 2010/0008686 A1 | 1/2010 | Masuda et al. | |

(Continued)

FOREIGN PATENT DOCUMENTS

| | | |
|---|---|---|
| JP | 5-113739 | 5/1993 |
| JP | 2006-251165 | 9/2006 |

(Continued)

OTHER PUBLICATIONS

Machine translation of Saito JP 2006-251165, publication date: Sep. 21, 2006.*

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A reflective optical sensor for detecting surface information on a moving element moving in a certain direction includes at least one light emitter, a light emitting lens provided between the light emitter and a surface of the moving element and formed to become conjugated with the light emitter in the moving direction of the moving element in a longer distance from the light emitter than in a vertical direction relative to the moving direction, at least one light receiver, and a light receiving lens provided between the light receiver and the surface of the moving element.

21 Claims, 78 Drawing Sheets

(56) References Cited

U.S. PATENT DOCUMENTS

| | | |
|---|---|---|
| 2010/0266302 A1 | 10/2010 | Suzuki et al. |
| 2010/0310284 A1 | 12/2010 | Funato et al. |
| 2011/0043810 A1 | 2/2011 | Suzuki et al. |
| 2011/0044713 A1 | 2/2011 | Masuda et al. |
| 2012/0268750 A1 | 10/2012 | Masuda |
| 2013/0216267 A1 | 8/2013 | Masuda et al. |
| 2013/0243446 A1 | 9/2013 | Masuda |
| 2013/0243458 A1 | 9/2013 | Suzuki et al. |
| 2013/0243466 A1* | 9/2013 | Taishi ............... G03G 15/5025 399/74 |
| 2013/0251389 A1 | 9/2013 | Suzuki et al. |
| 2013/0308966 A1 | 11/2013 | Masuda et al. |
| 2014/0023391 A1 | 1/2014 | Masuda |
| 2014/0044460 A1 | 2/2014 | Kudo et al. |
| 2014/0071443 A1 | 3/2014 | Suzuki et al. |
| 2014/0219670 A1 | 8/2014 | Masuda et al. |
| 2014/0268180 A1 | 9/2014 | Takaura et al. |
| 2015/0037057 A1 | 2/2015 | Masuda |
| 2015/0043936 A1 | 2/2015 | Masuda et al. |
| 2015/0063844 A1 | 3/2015 | Masuda et al. |
| 2015/0078767 A1 | 3/2015 | Momma et al. |
| 2015/0168310 A1 | 6/2015 | Suzuki et al. |

FOREIGN PATENT DOCUMENTS

| | | |
|---|---|---|
| JP | 2010-78498 | 4/2010 |
| JP | 2013-242398 | 12/2013 |
| JP | 2014-55989 | 3/2014 |
| JP | 2014-56018 | 3/2014 |
| JP | 2014-59442 | 4/2014 |

* cited by examiner

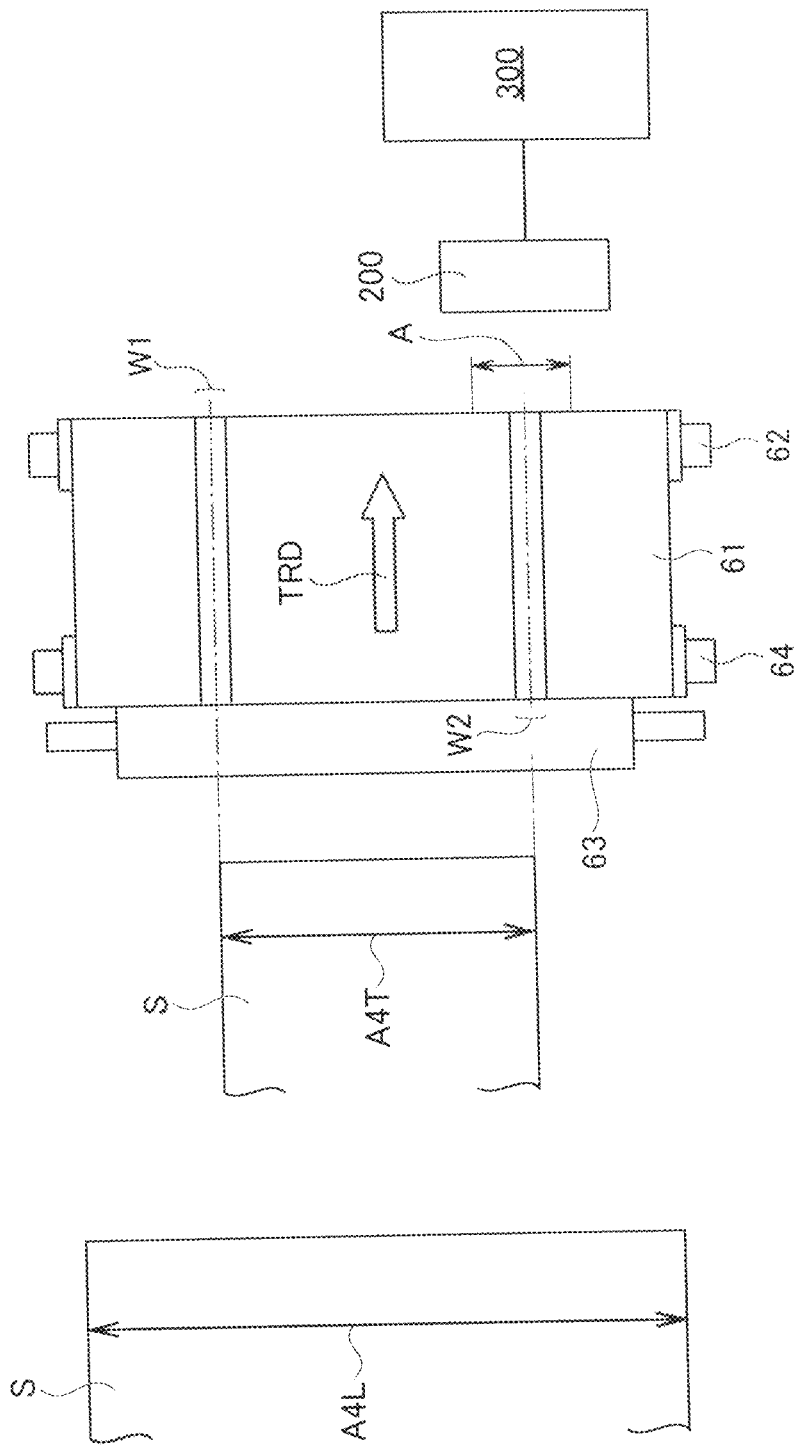

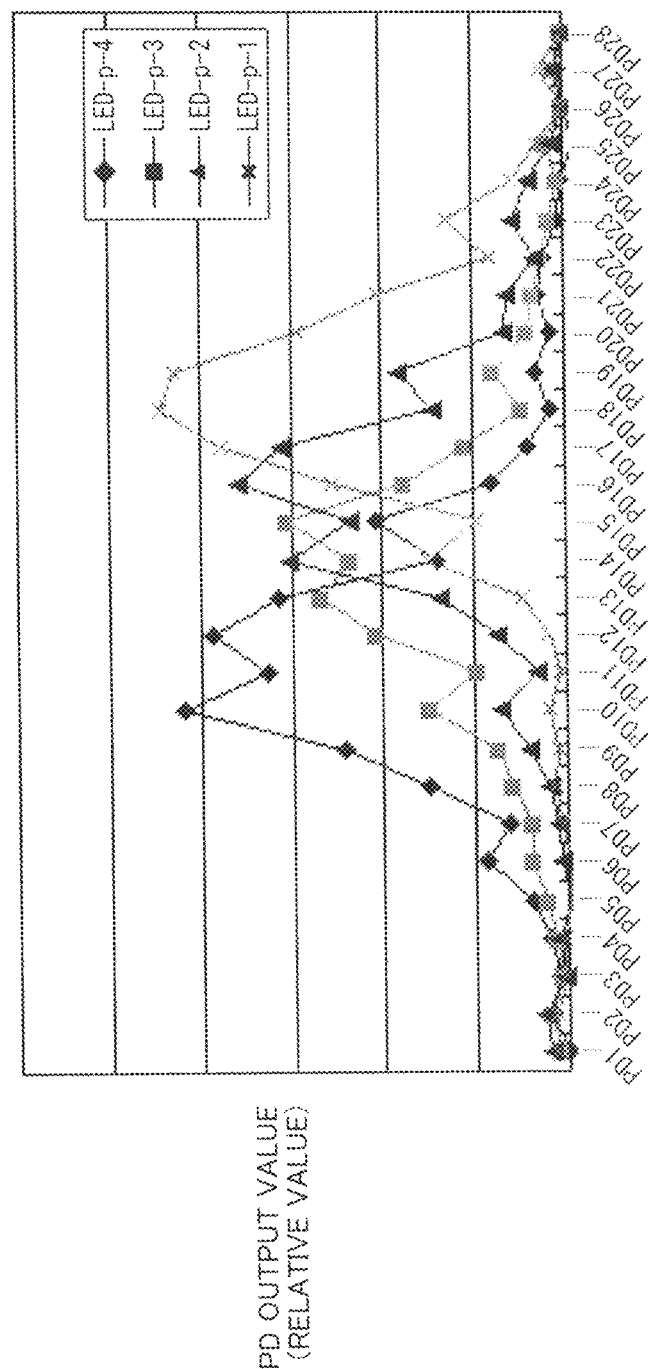

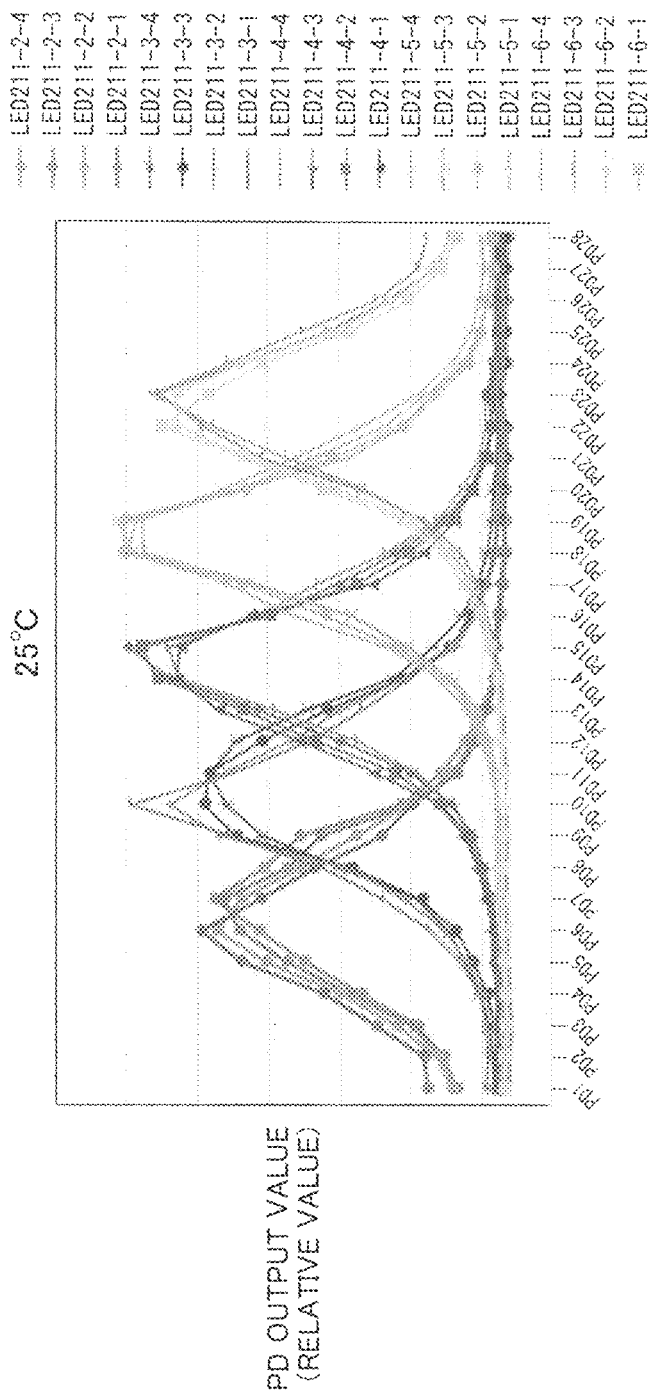

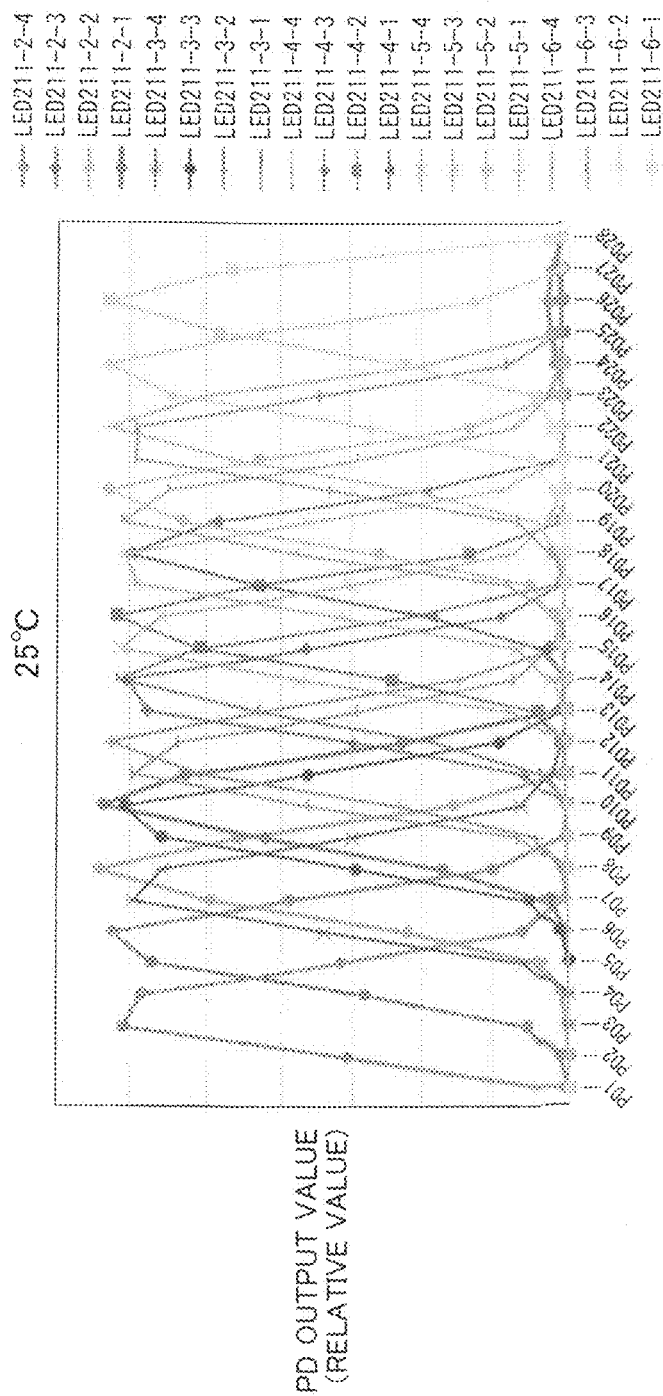

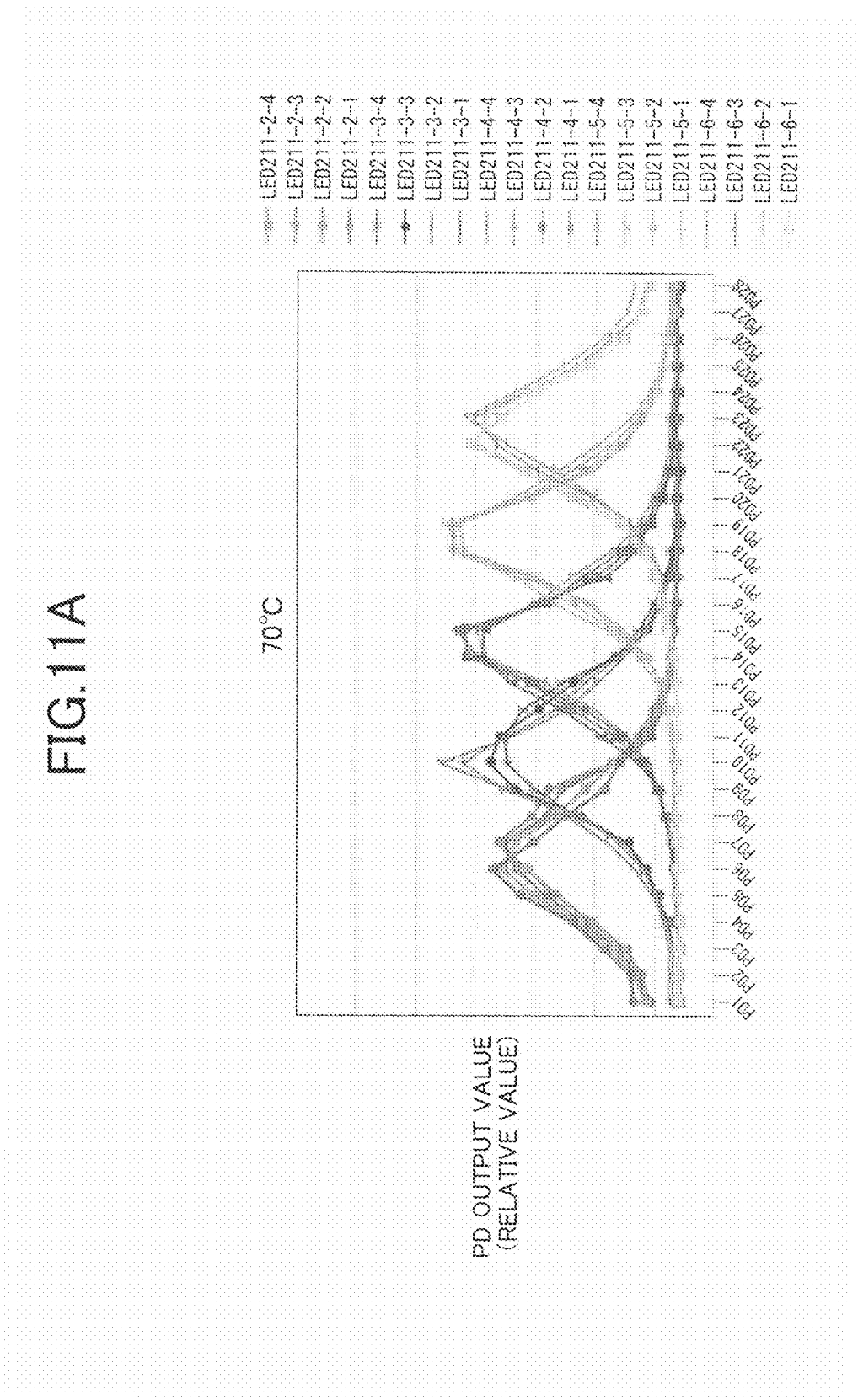

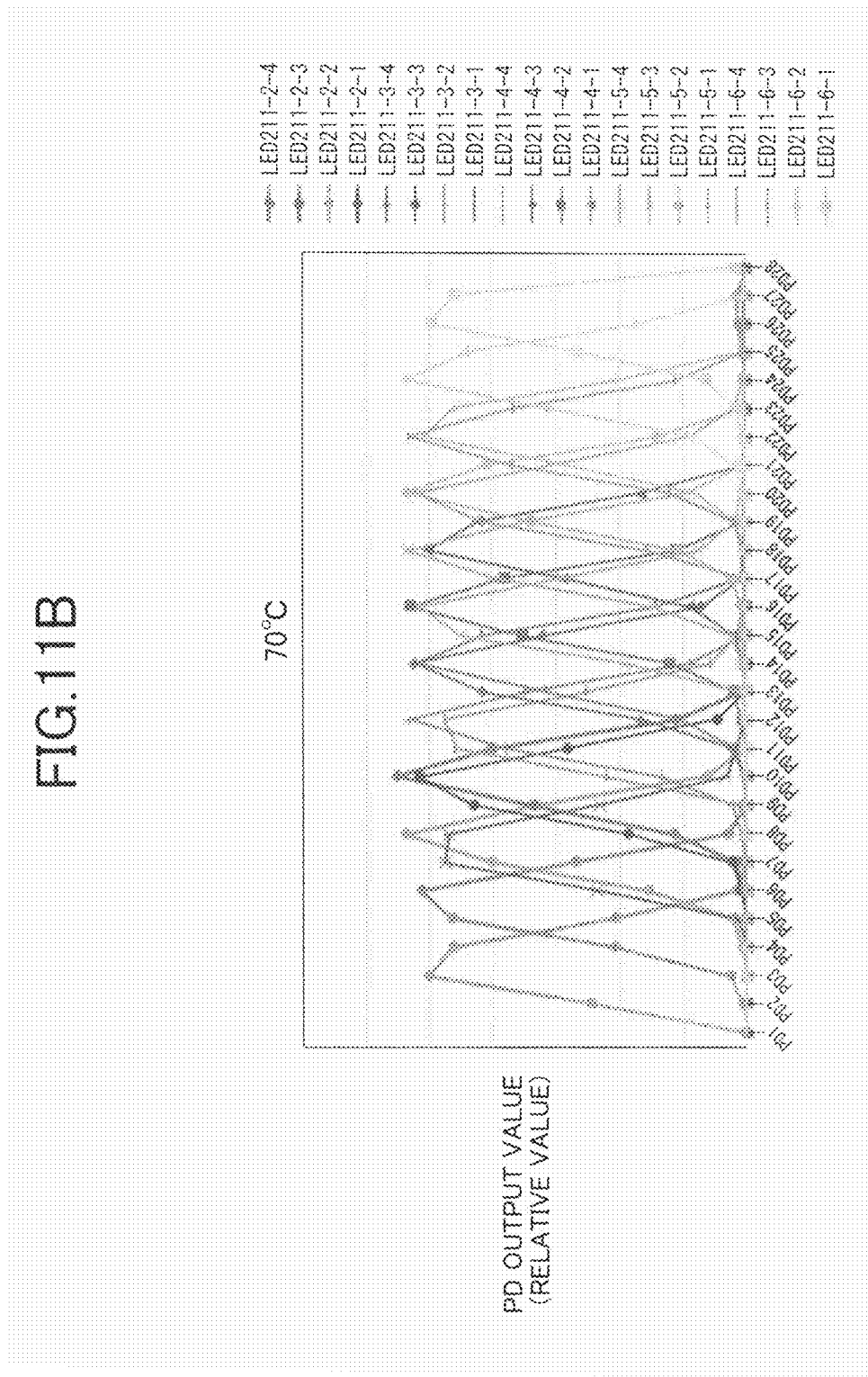

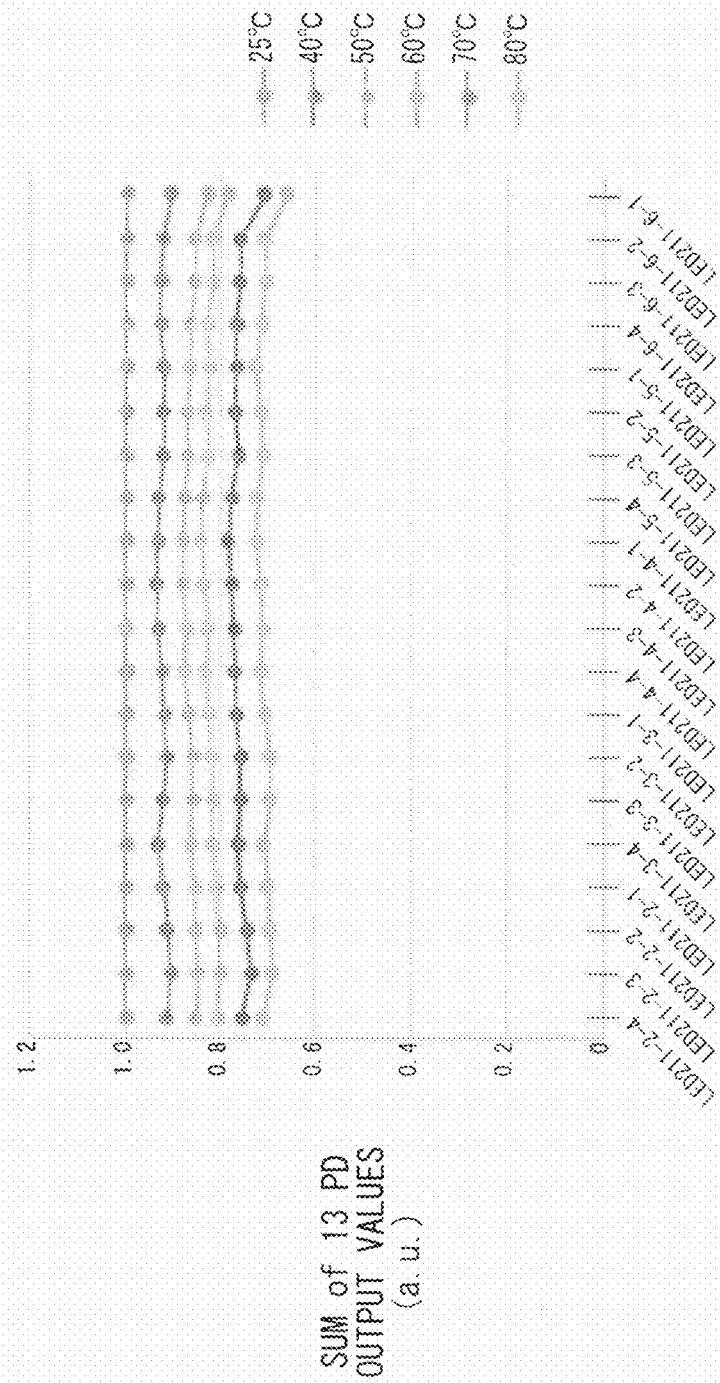

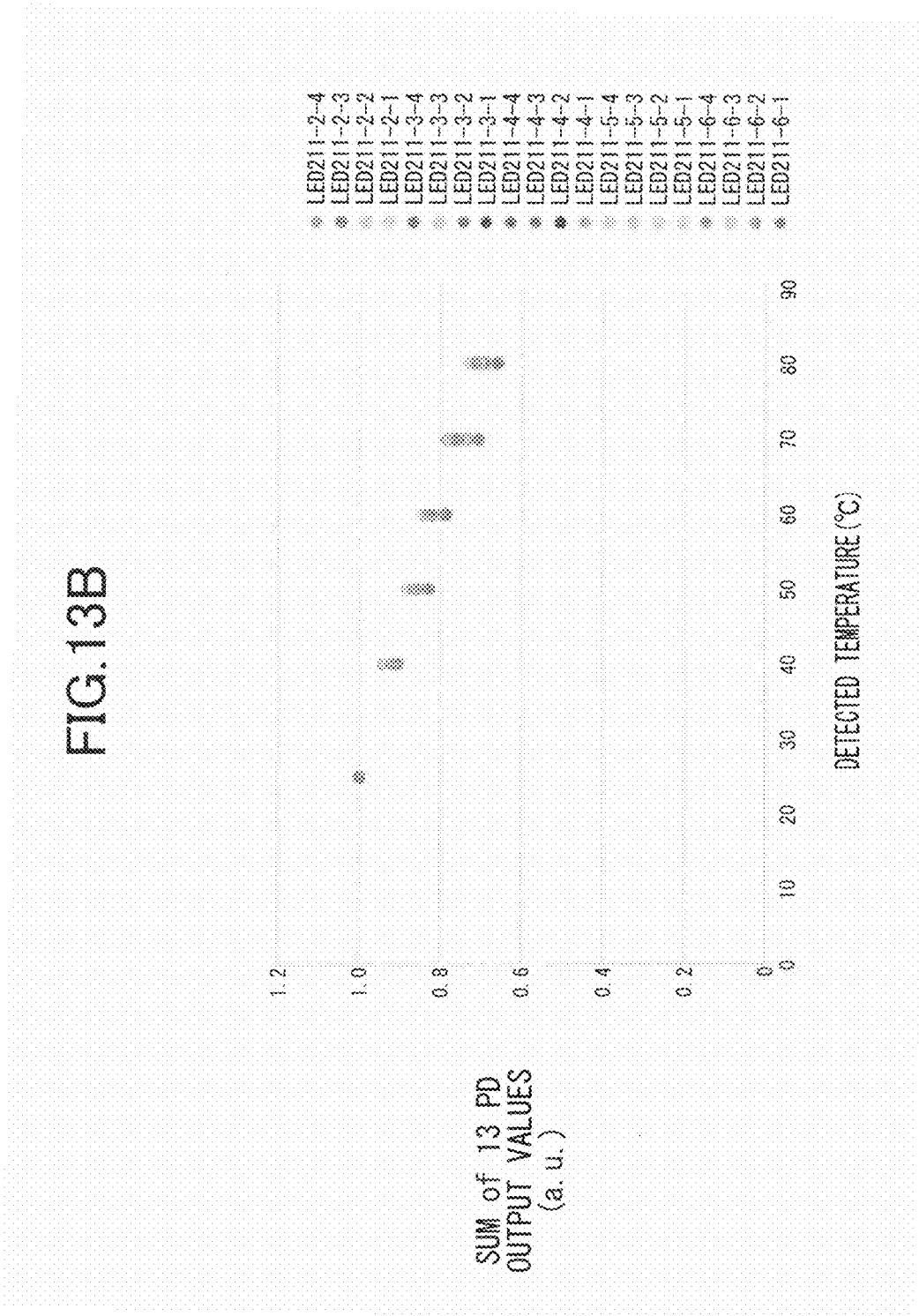

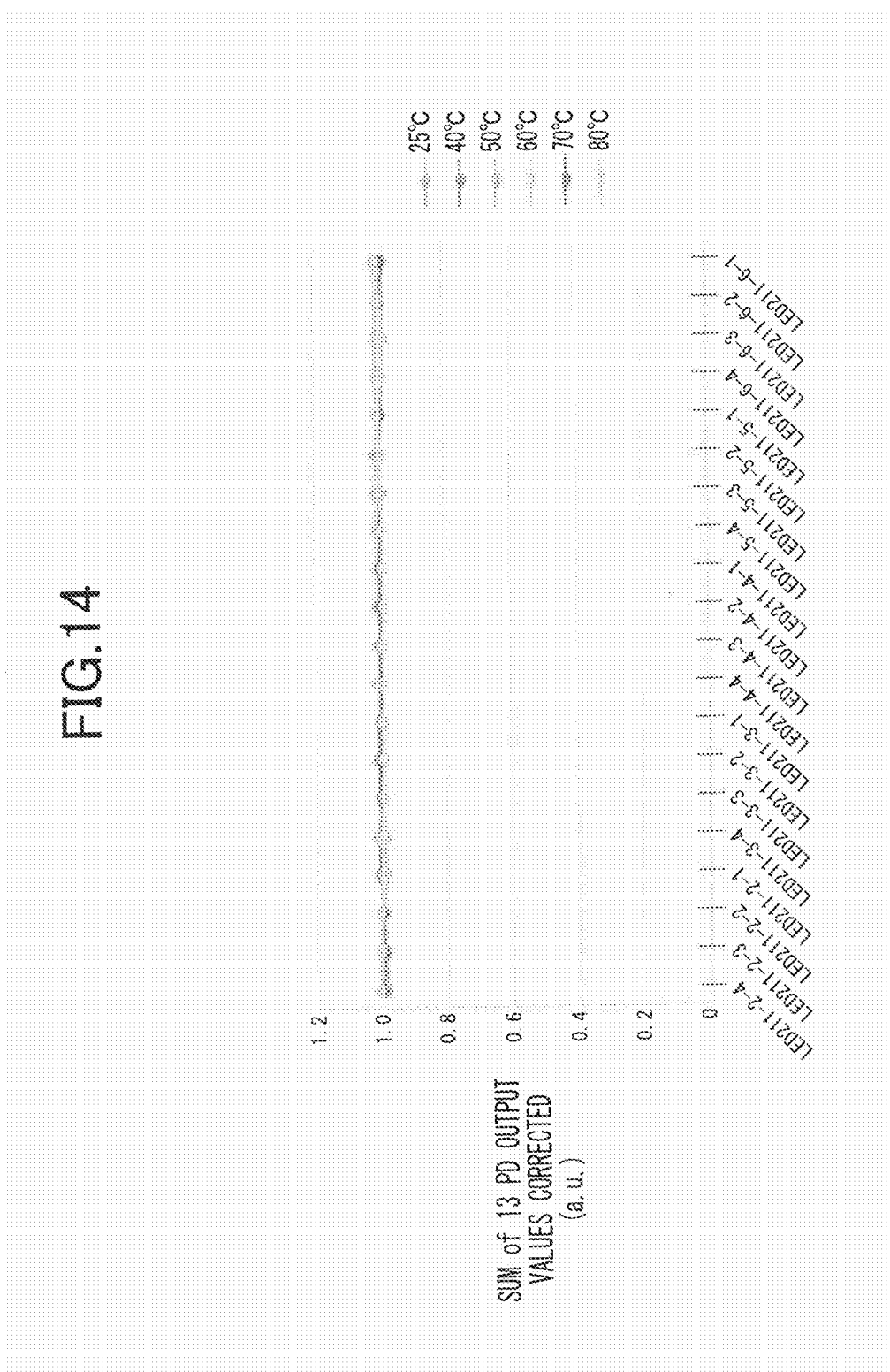

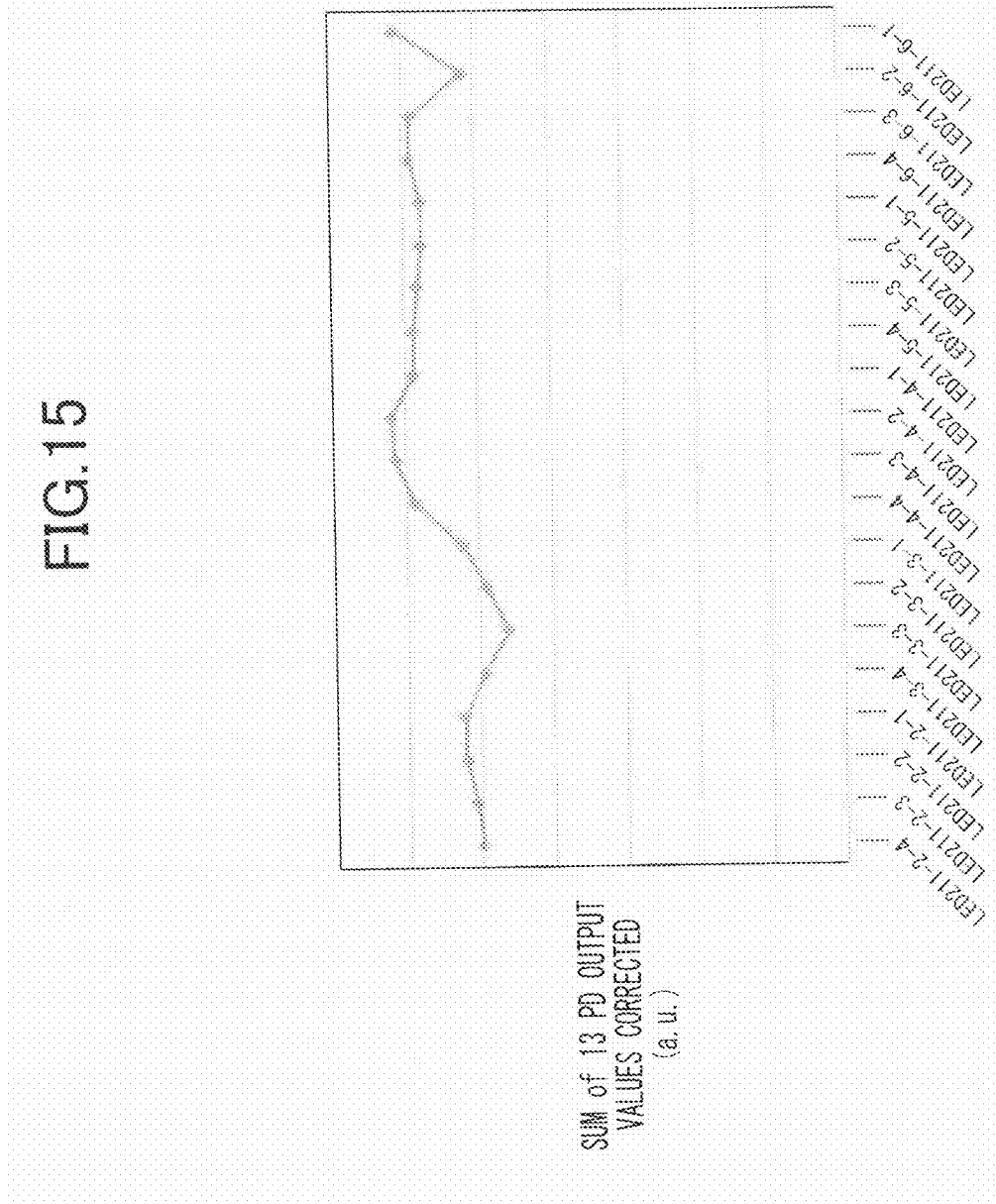

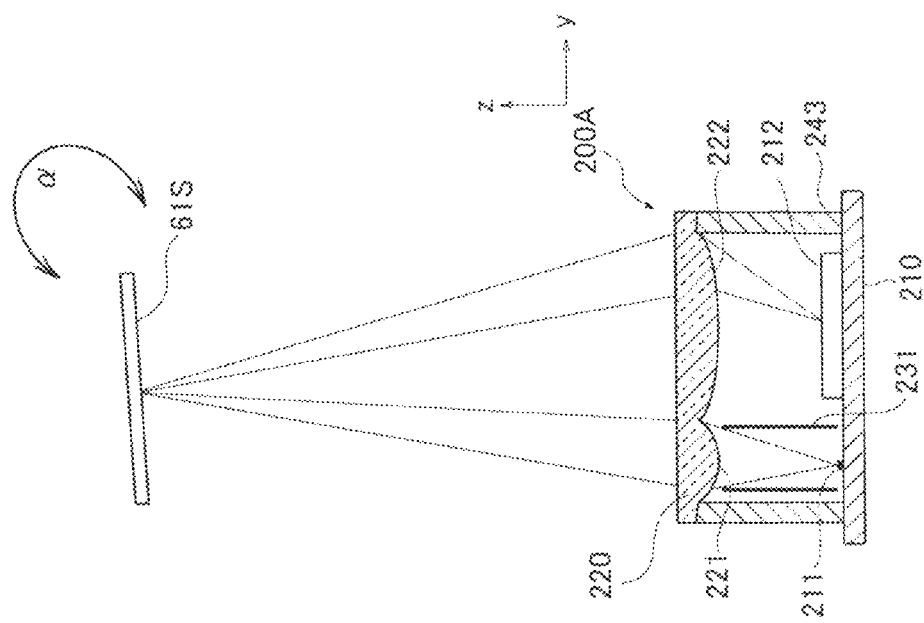
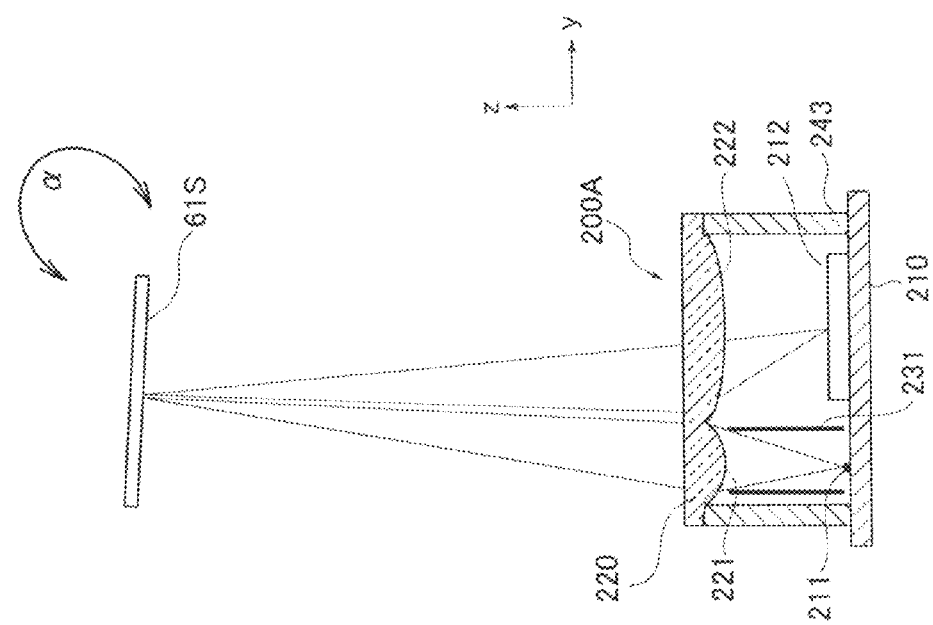

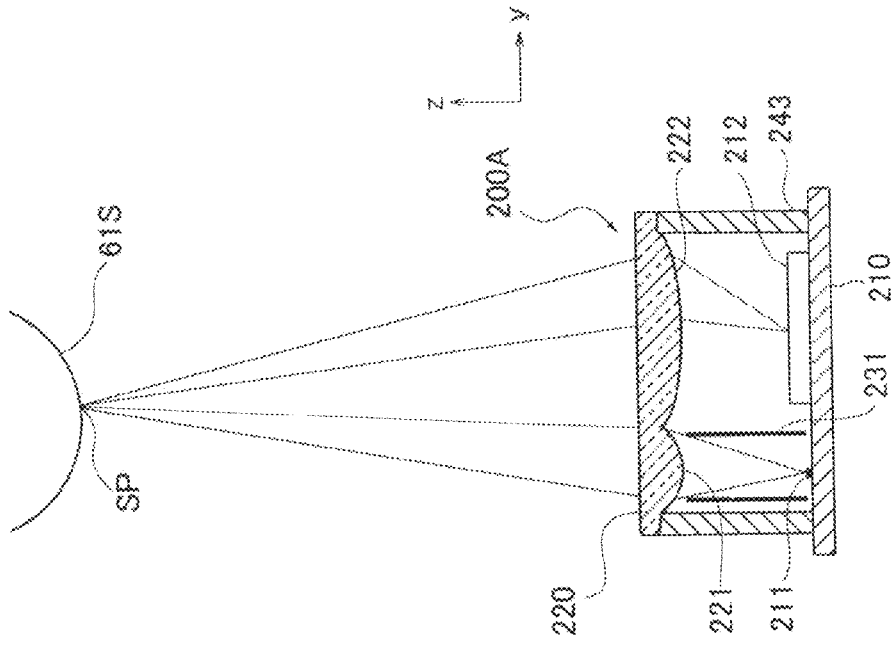
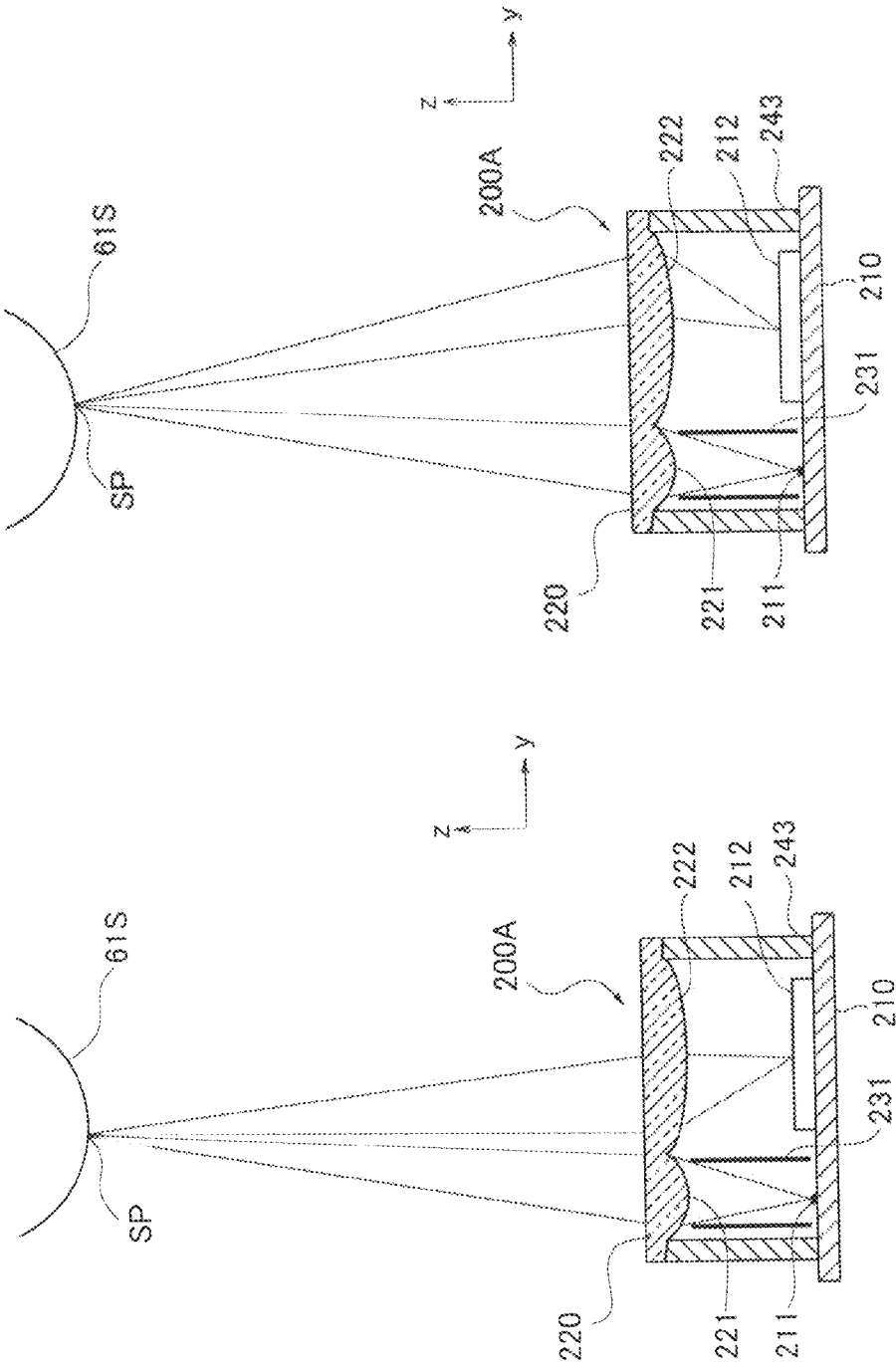

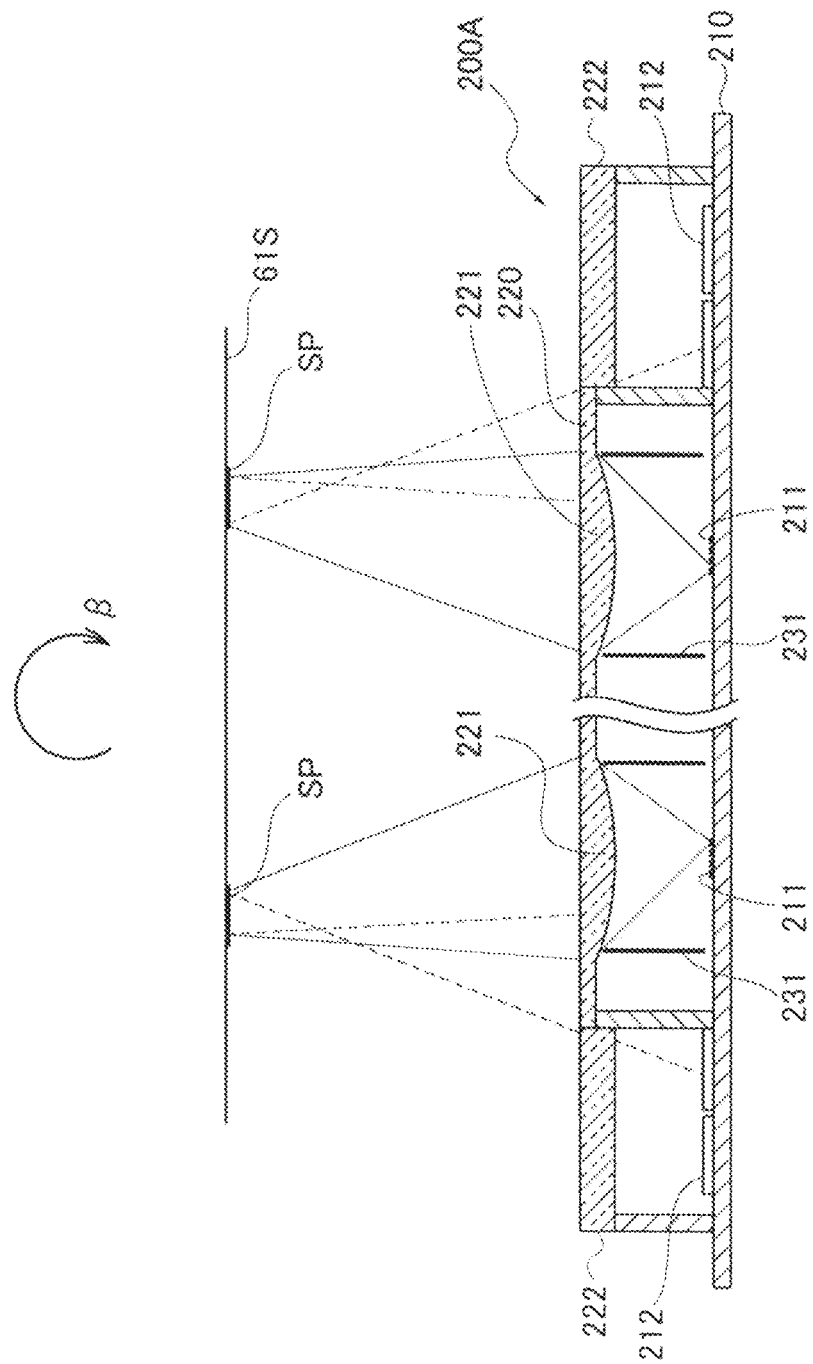

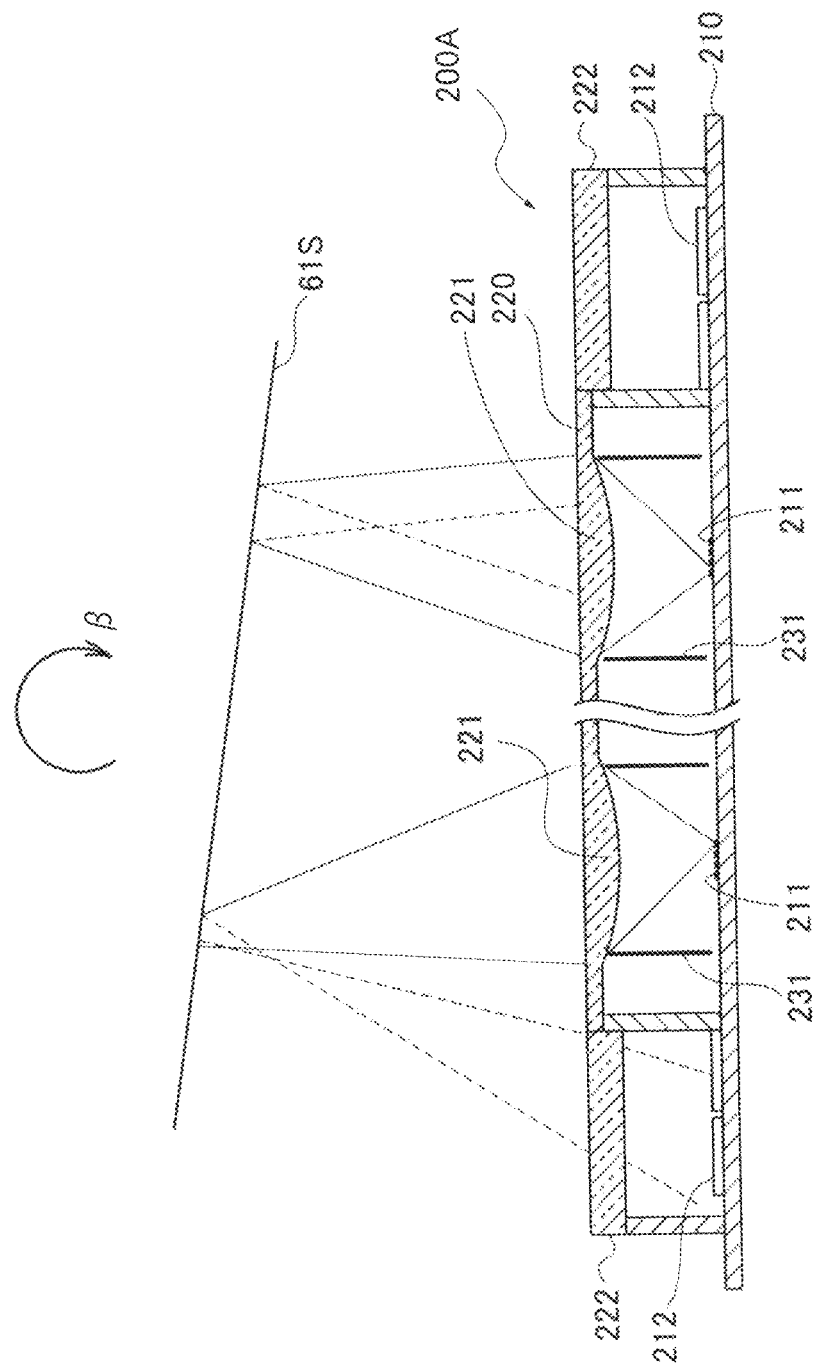

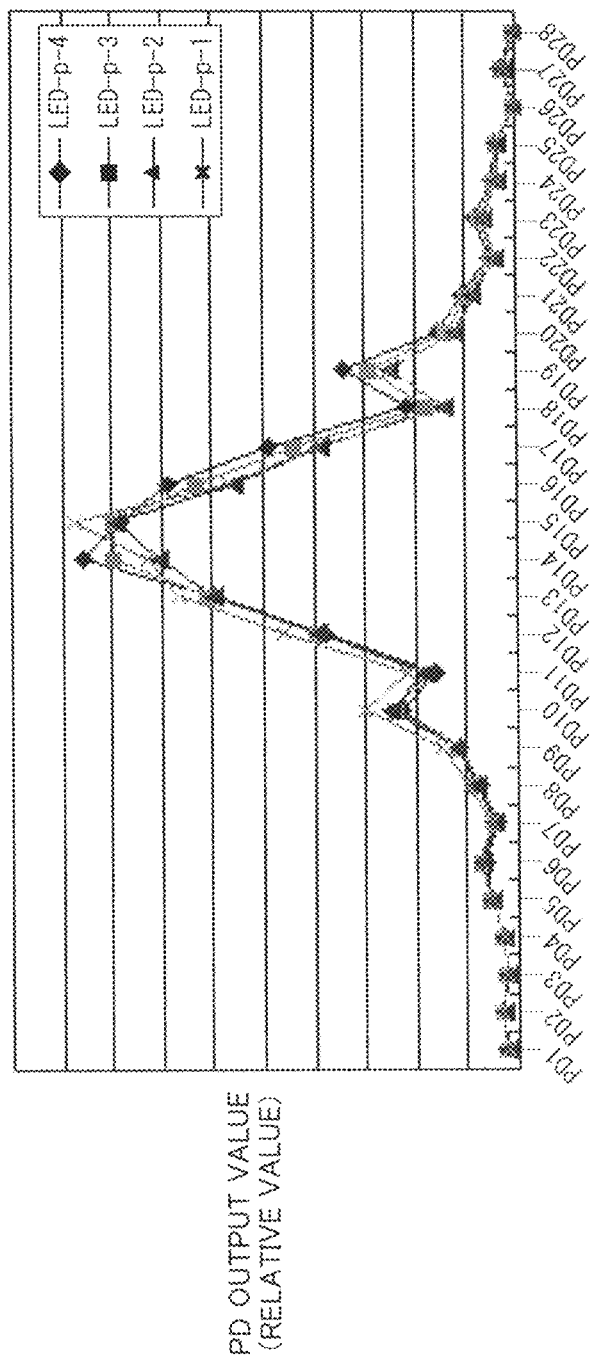

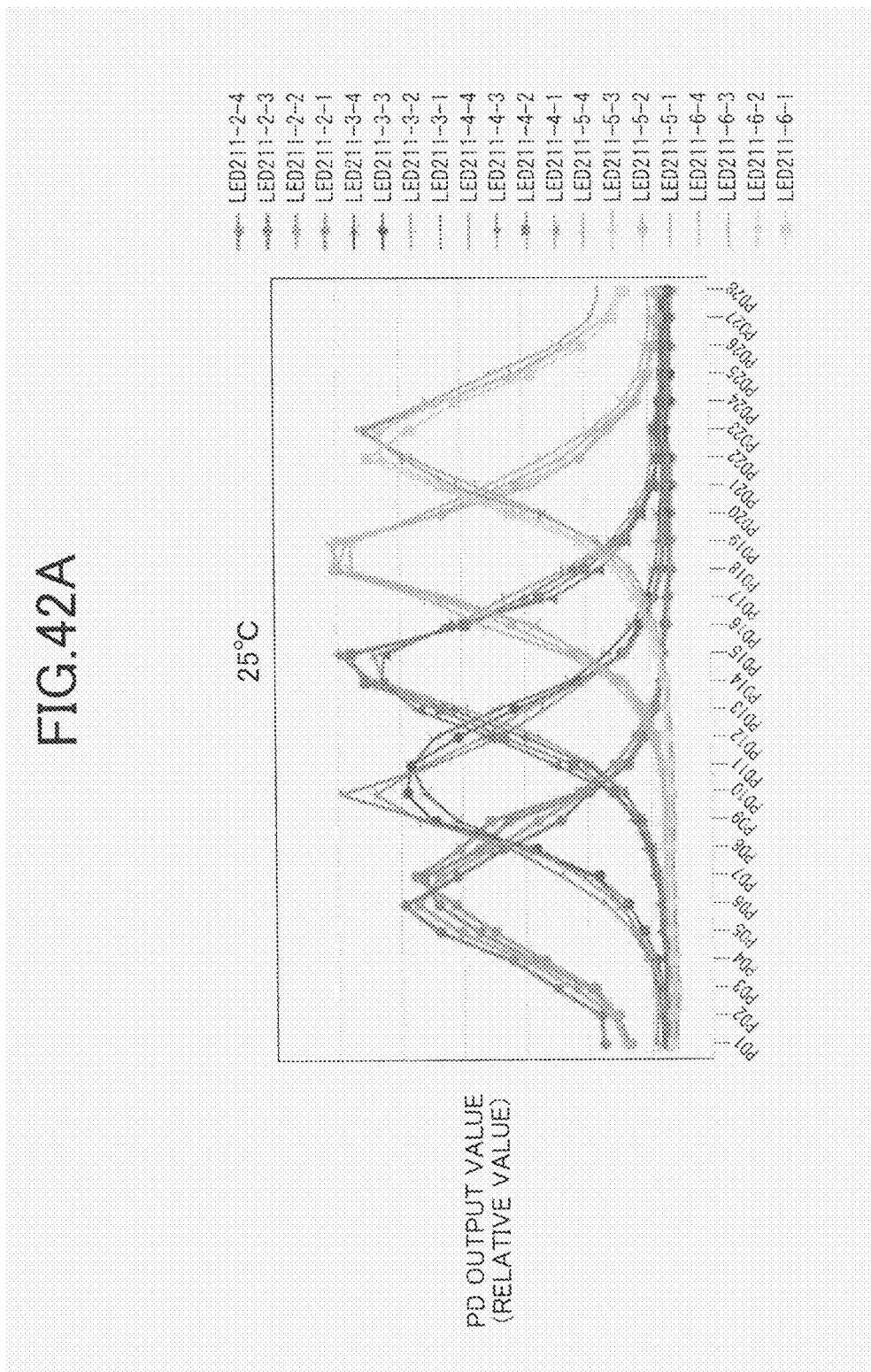

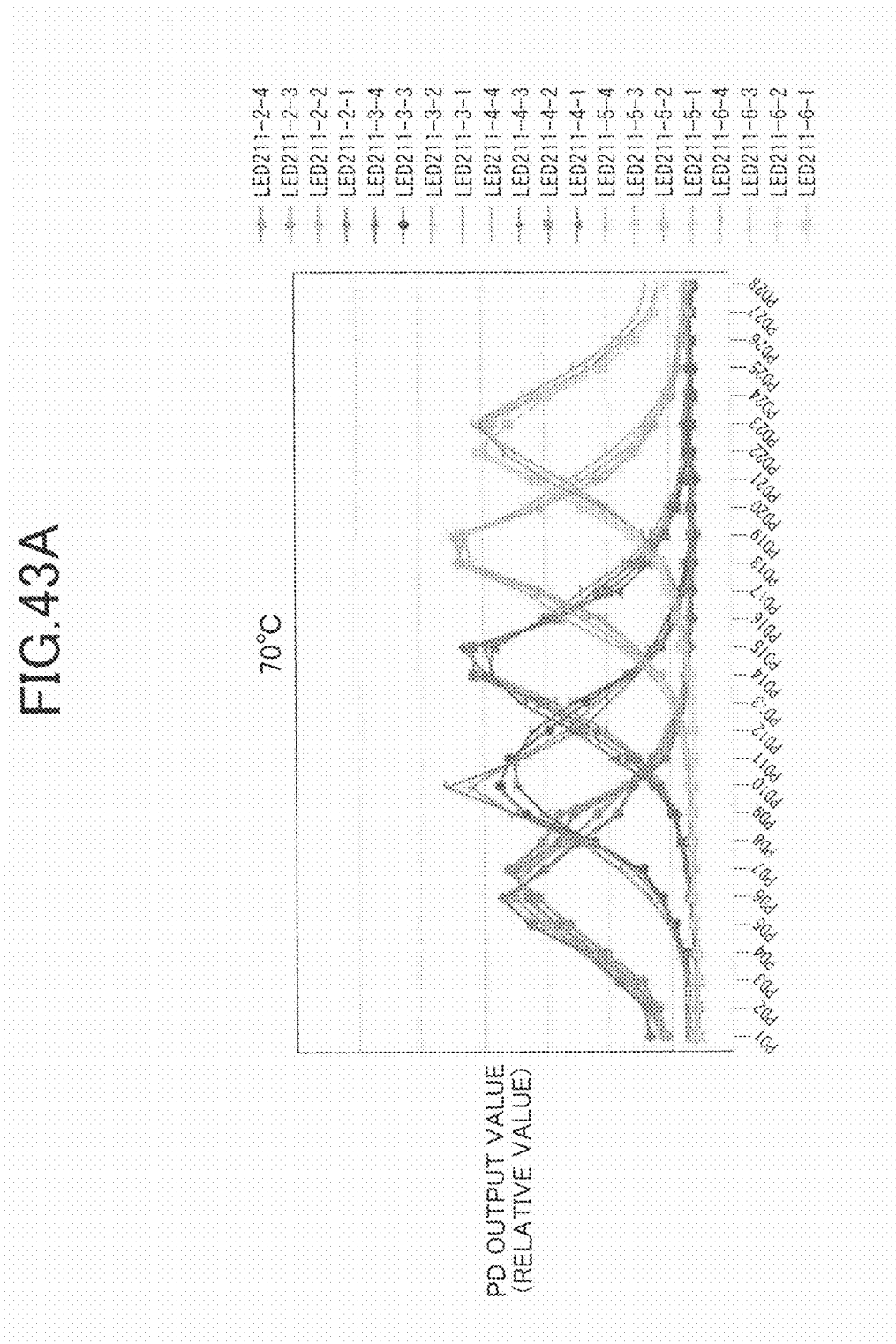

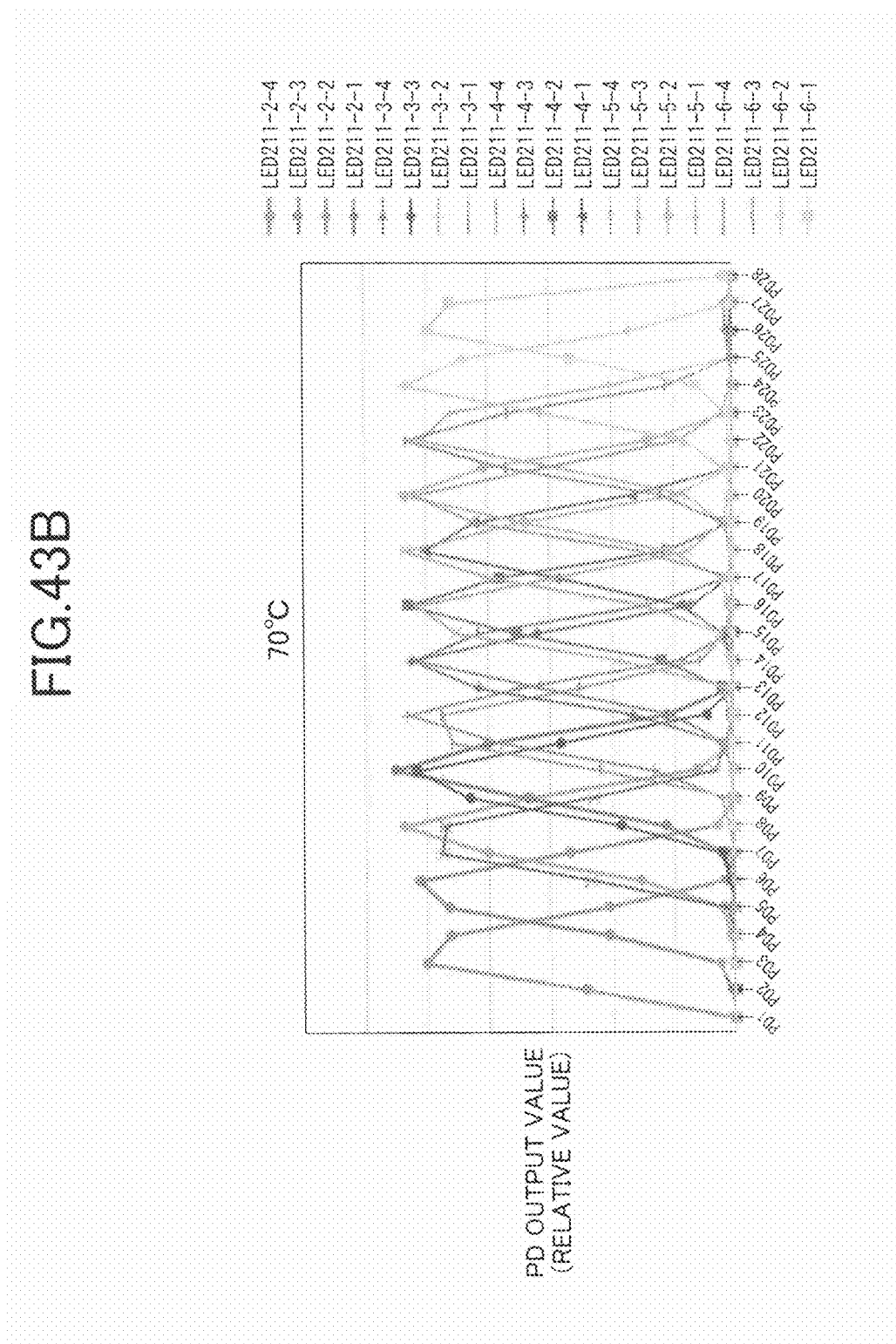

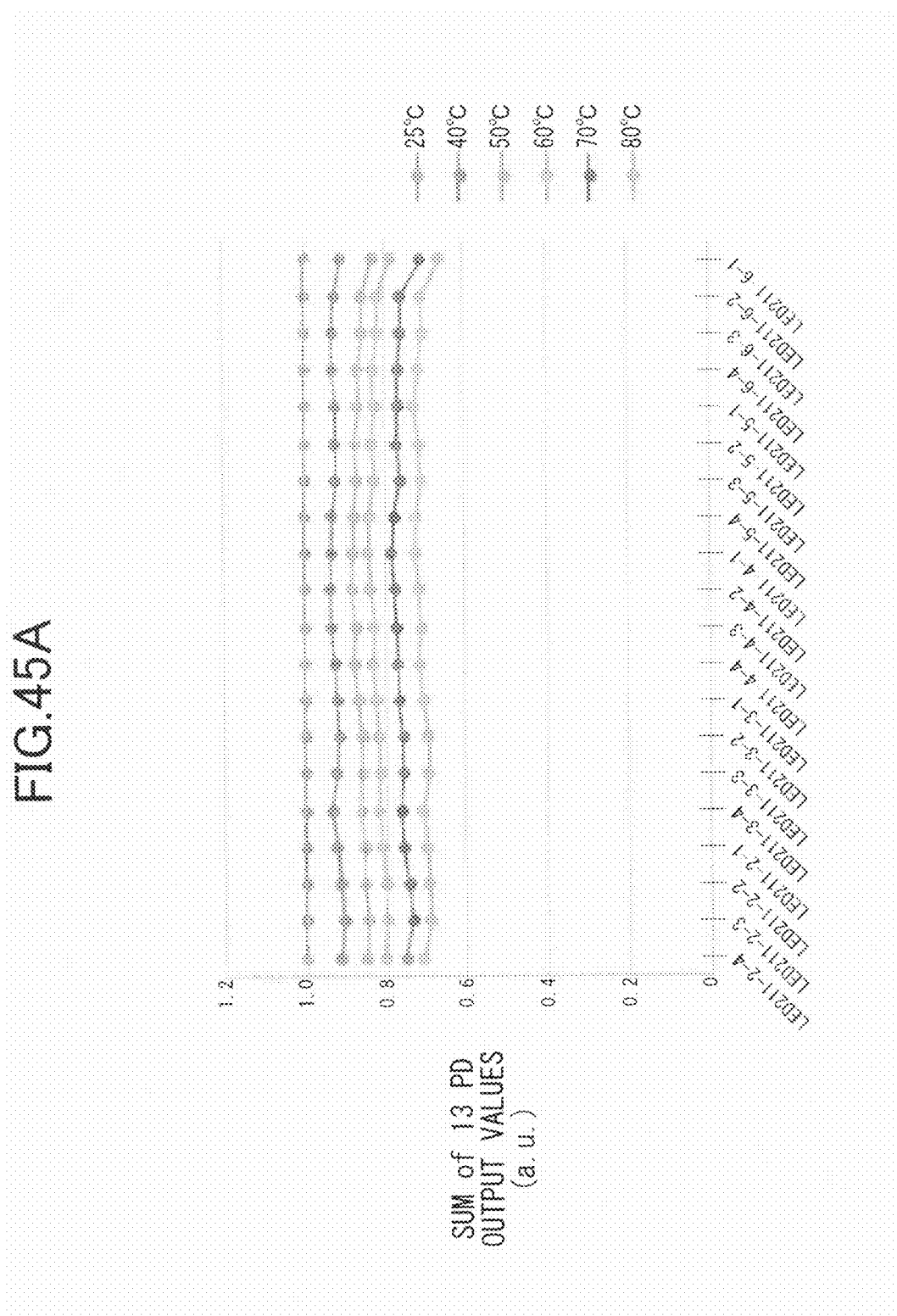

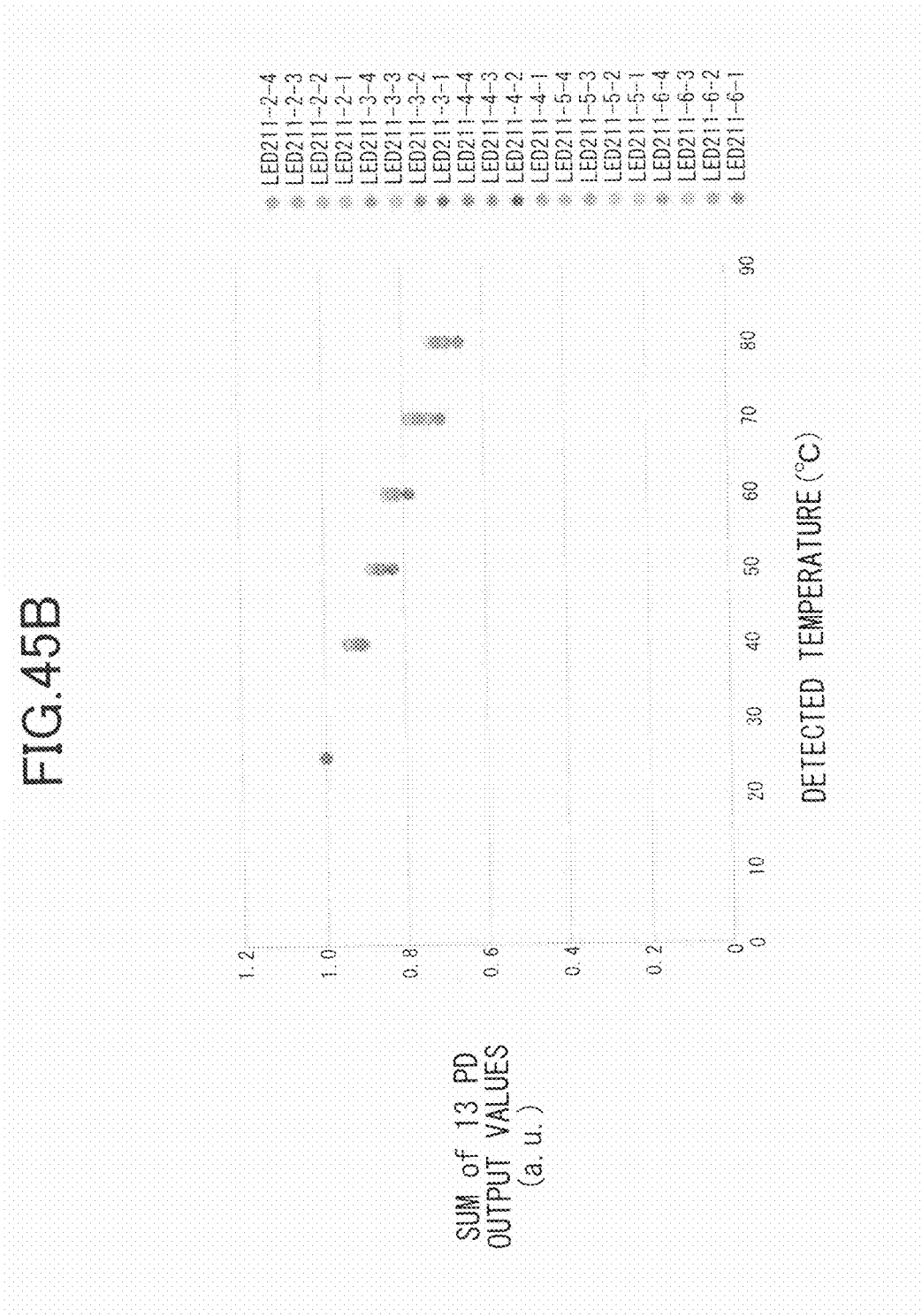

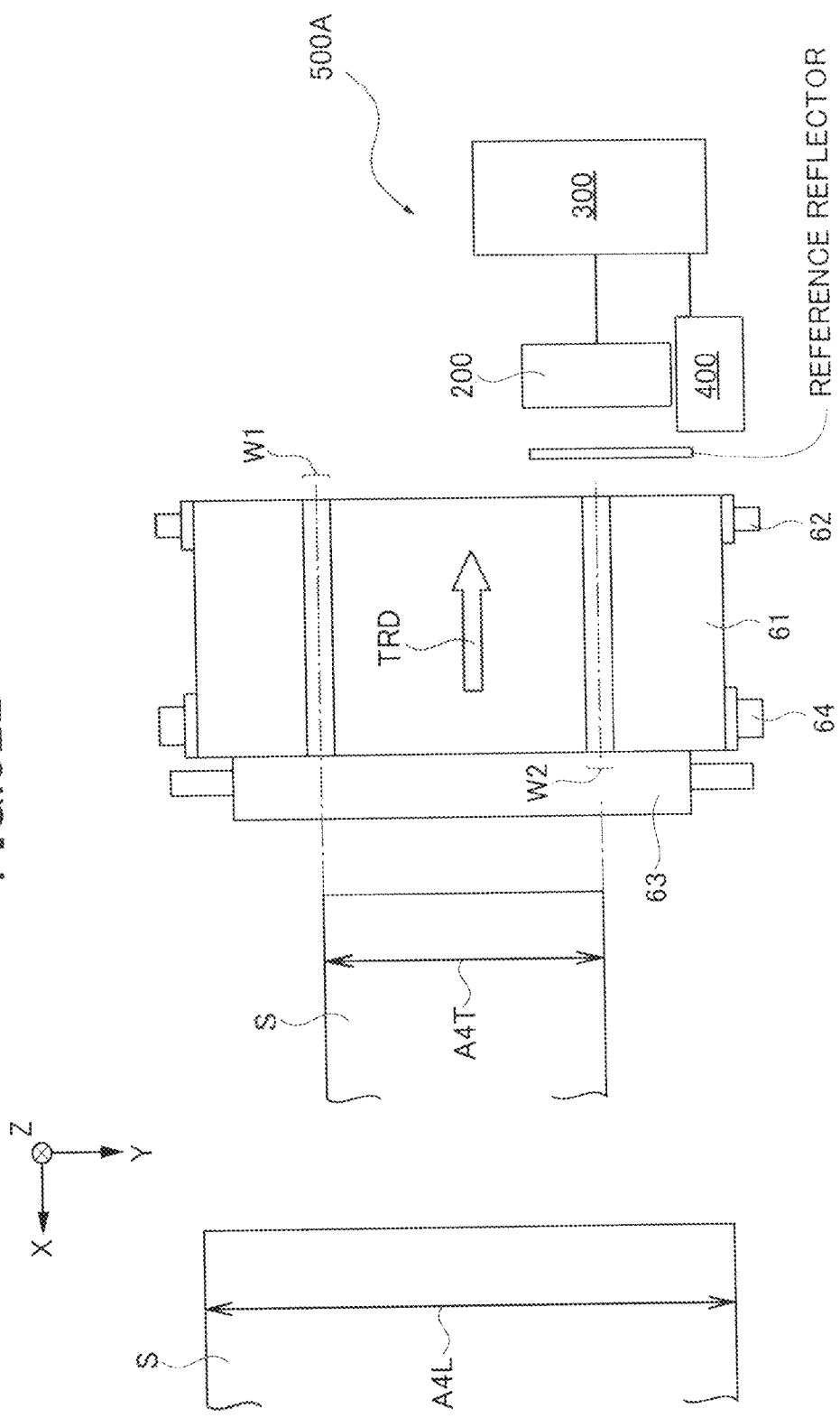

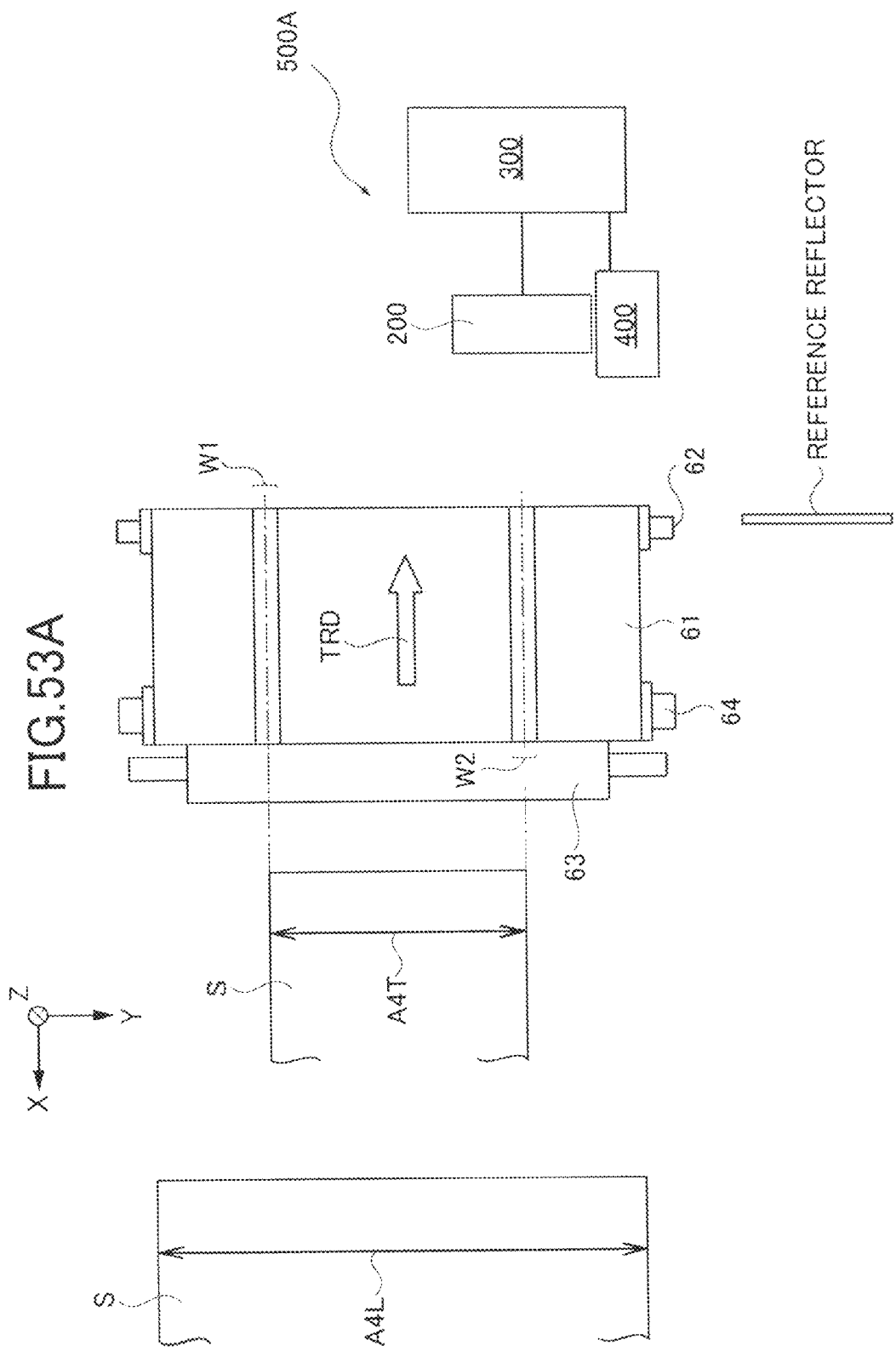

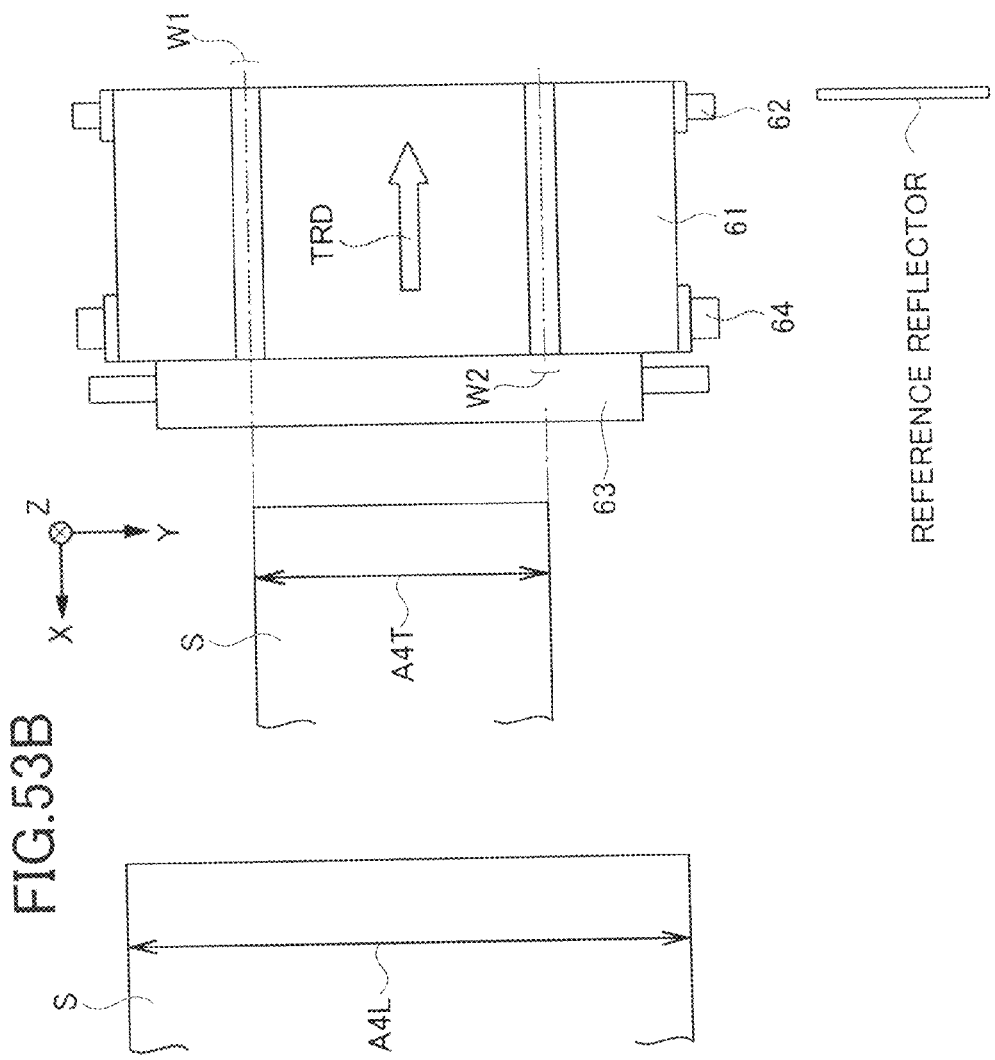

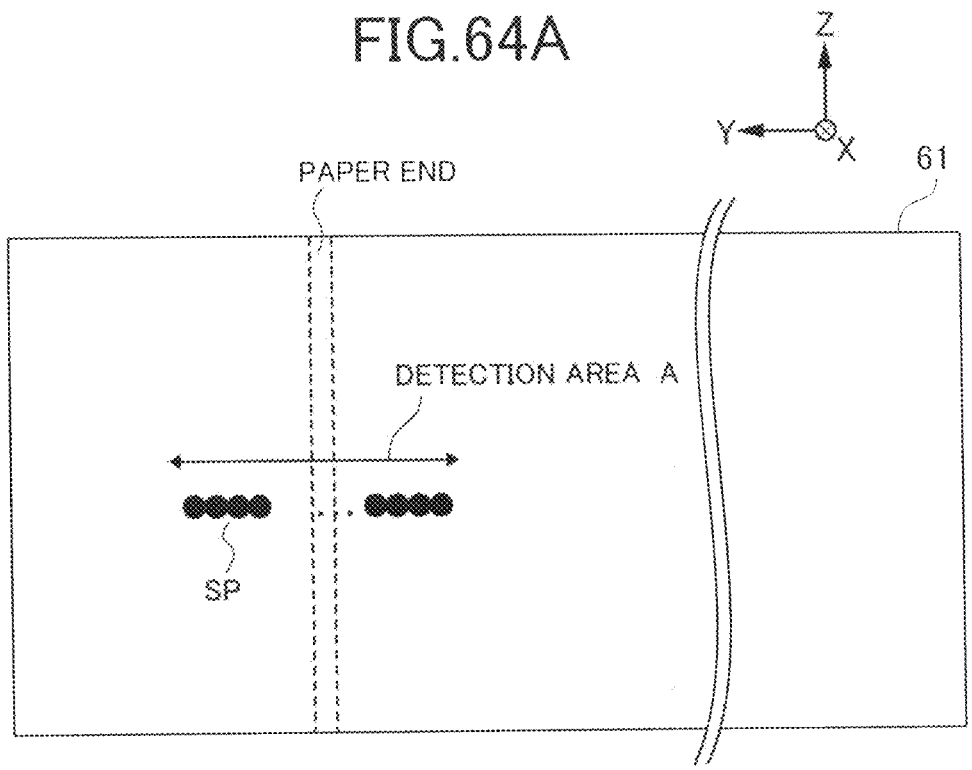
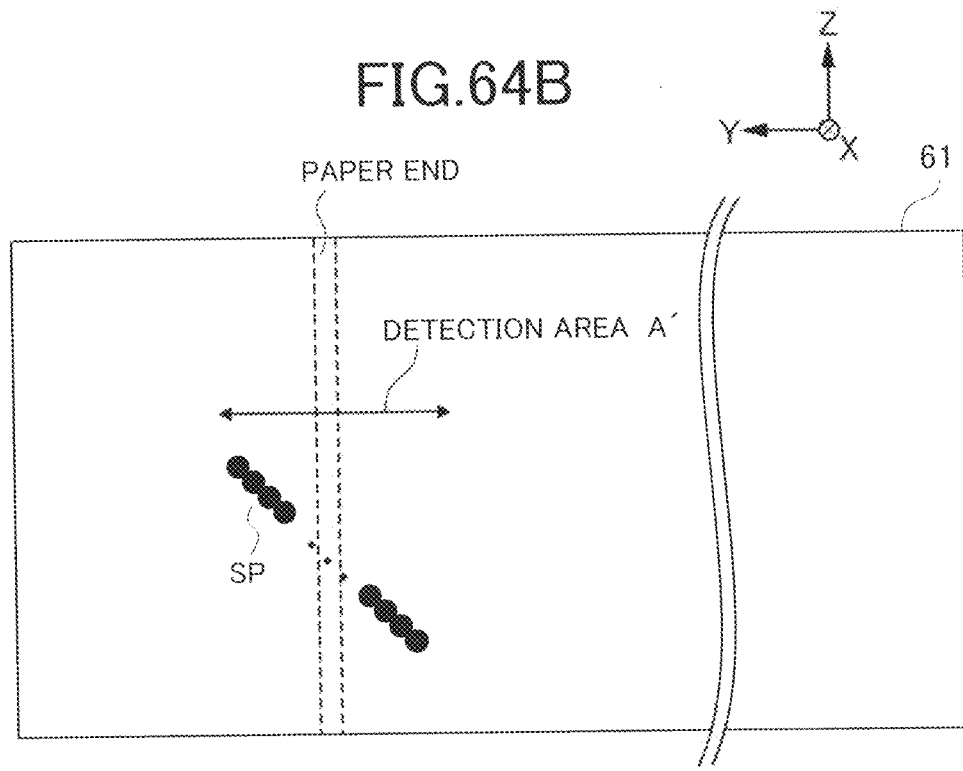

REFLECTIVE OPTICAL SENSOR, IMAGE FORMING APPARATUS, AND SURFACE INFORMATION DETECTING METHOD

CROSS-REFERENCE TO RELATED APPLICATION

The present application is based on and claims priority to Japanese patent application No. 2014-157620, filed Aug. 1, 2014 and No. 2014-236442, filed Nov. 21, 2014, the disclosure of which is hereby incorporated by reference herein in its entirety.

BACKGROUND

1. Technical Field

The present invention relates to a reflective optical sensor and an image forming apparatus.

2. Description of Related Art

An image forming apparatus forming color images with different color toners have been widely implemented such as an analog or digital color copier, a printer, a facsimile machine or a multi-function printer (MFP).

For example, Japanese Laid-open Patent Application Publication No. 5-113739 (Reference 1), Japanese Patent No. 4632820 (Reference 2), and Japanese Laid-open Patent Application Publication No. 2014-56018 (Reference 3) disclose such an image forming apparatus which writes an electrostatic latent image on the surface of an image bearer, visualizes the electrostatic latent image by attaching a developer including toner, transfers the image onto a recording medium as paper, and fixes the image onto a fixing element such as a fixing belt.

A repetition of image fixation may cause a defect such as scratches on the surface of the fixing element, which results in adversely affecting image quality. To prevent an adverse effect on image quality, the image forming apparatus in Reference 1 includes photosensors which receive light emitted from a light source and reflected by the surface of a fixing roller, to detect a defect on the surface of the fixing roller on the basis of the intensity of the received reflected light.

Further, the image forming apparatus in Reference 2 includes a detector such as a photosensor which senses a scratch and the periphery of the scratch on the fixing belt, so as to attach a larger amount of developer onto a scratch portion and make the scratch less conspicuous on an image. Reference 3 discloses a reflective optical sensor having a number of light emitters and a light receiving element to illuminate the surface of the fixing belt with light spots from the light emitting elements and receive light reflected by the fixing belt at the light receiving element to detect a surface condition of the fixing belt.

However, a moving element as the fixing belt may meander and flop, causing a variation in detected values of the photosensor and affecting the accuracy at which the surface condition of the moving element is detected.

SUMMARY

The present invention aims to provide a reflective optical sensor which can reduce a variation in detected values of a photosensor due to a flopping of a moving element to precisely detect a surface condition of the moving element.

According to one embodiment, a reflective optical sensor for detecting surface information on a moving element moving in a certain direction, includes at least one light emitter, a light emitting lens provided between the light emitter and a surface of the moving element and formed to become conjugated with the light emitter in the moving direction of the moving element in a longer distance from the light emitter than in a vertical direction relative to the moving direction, at least one light receiver, and a light receiving lens provided between the light receiver and the surface of the moving element.

BRIEF DESCRIPTION OF THE DRAWINGS

FIG. 5 shows the fixing of the fixing unit.

FIG. 8B is a graph showing a PD output value obtained by subtracting a PD output value with no use of the fixing belt from a PD output value with use of the fixing belt when the reflective optical sensor of FIG. 6A is operated following the flowchart in FIG. 7.

FIG. 10A is a graph showing the PD output value acquired when the light shield is closed at a temperature of 25° C. before the use of the image forming apparatus is started.

FIG. 10B is a graph showing a PD output value obtained by subtracting a PD output value when the light shield in FIG. 10A is closed from a PD output value when the light shield is opened, at a temperature of 25° C. before the use of the image forming apparatus is started.

FIG. 11A is a graph showing a PD output value acquired when the light shield is closed at a temperature of 70° C. before the use of the image forming apparatus is started.

FIG. 11B is a graph showing a PD output value obtained by subtracting a PD output value when the light shield in FIG. 11A is closed from a PD output value when the light shield is opened, at a temperature of 70° C. before the use of the image forming apparatus is started.

FIG. 13A is a graph showing values obtained by dividing the results at 25° C., 40° C., 50° C., 60° C., 70° C., and 80° C. by the results at 25° C. in FIG. 12.

FIG. 13B is the graph of FIG. 13A rewritten with detected temperature on the abscissa axis.

FIG. 14 is a graph of corrected results of a reference reflector at 25° C., 40° C., 50° C., 60° C., 70° C., and 80° C.

FIG. 15 is a graph showing detected surface conditions of the fixing belt after the image forming apparatus is used.

FIGS. 18A and 18B show a trajectory of a light beam from a target surface with use of the reflective optical sensor in FIG. 17 when the target surface is inclined clockwise and counterclockwise, respectively.

FIGS. 19A and 19B show a trajectory of a light beam when a target surface of the reflective optical sensor is the fixing belt on a heating roller in FIG. 17, with a detected position shifted leftward and rightward in the Y-direction, respectively.

FIG. 24 shows a trajectory of a light beam from the reflective optical sensor according to the second embodiment when a target surface is not inclined.

FIG. 25 shows a trajectory of a light beam from the reflective optical sensor according to the second embodiment when a target surface is inclined in β-direction.

FIG. 27 shows trajectories of light beams of the reflective optical sensor according to a fourth embodiment when two LEDs are simultaneously turned on.

FIG. 28 shows trajectories of light beams of the reflective optical sensor according to the fourth embodiment when two LEDs are simultaneously turned on.

FIGS. 29A and 29B show trajectories of light beams of a reflective optical sensor according to a fifth embodiment when a target surface is a plan surface and a curved surface, respectively, when two LEDs arranged in the Y-direction are simultaneously turned on.

FIGS. 40A and 40B are graphs showing PD outputs when the light shield is in a closed position and in an opened position, respectively.

FIG. 42A is a graph showing a PD output value at 25° C. when the light shield is in the closed position

FIG. 43A is a graph showing a PD output value at 70° C. when the light shield is in the closed position and FIG. 43B is the same showing a PD output value obtained by subtracting the PD output value in FIG. 43A from a PD output value when the light shield is in the opened position at 70° C.

FIG. 45A is a graph showing a temperature coefficient obtained by dividing the light variation correction coefficient of each LED at different temperatures by the light variation correction coefficient of each LED at 25° C., and FIG. 45B is a graph of FIG. 45A rewritten with detected temperature on the abscissa axis.

FIGS. 52A and 52B show moving operation of the surface information detector.

FIGS. 53A and 53B show moving operation of the reflective optical sensor.

FIGS. 64A and 64B show examples of the arrangement of the reflective optical sensor.

DETAILED DESCRIPTION

Figure 1A:
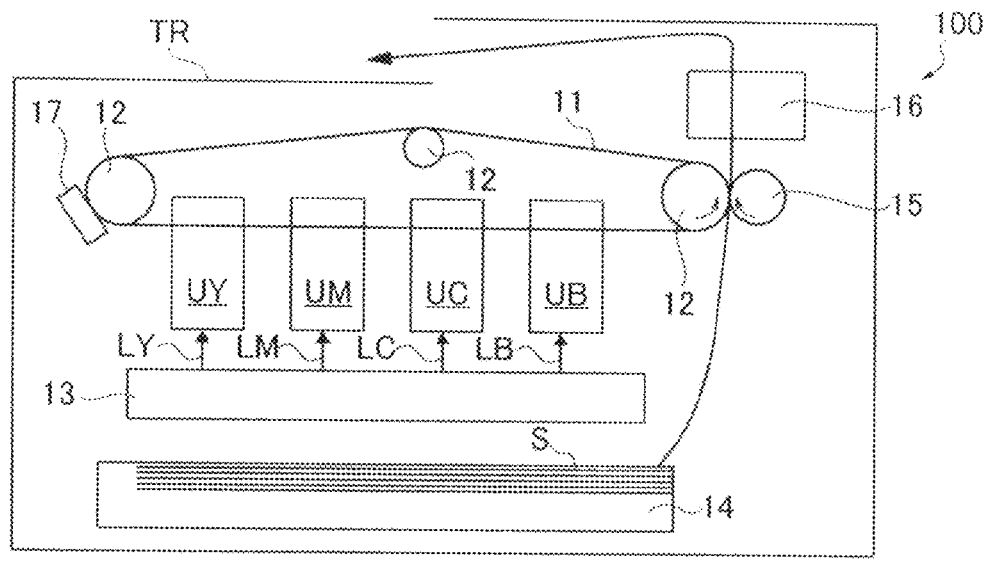
FIG. 1A schematically shows the overall structure of an image forming apparatus according to one embodiment of the present invention, FIG. 1B schematically shows an image forming unit and FIG. 1C schematically shows a fixing unit.
Figure 1B:
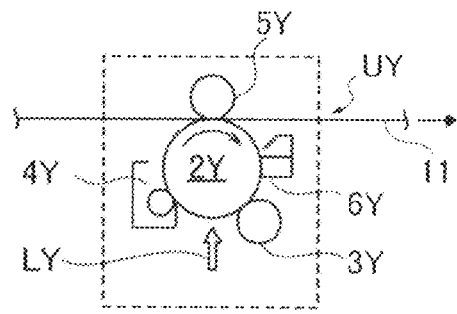
Figure 1C:
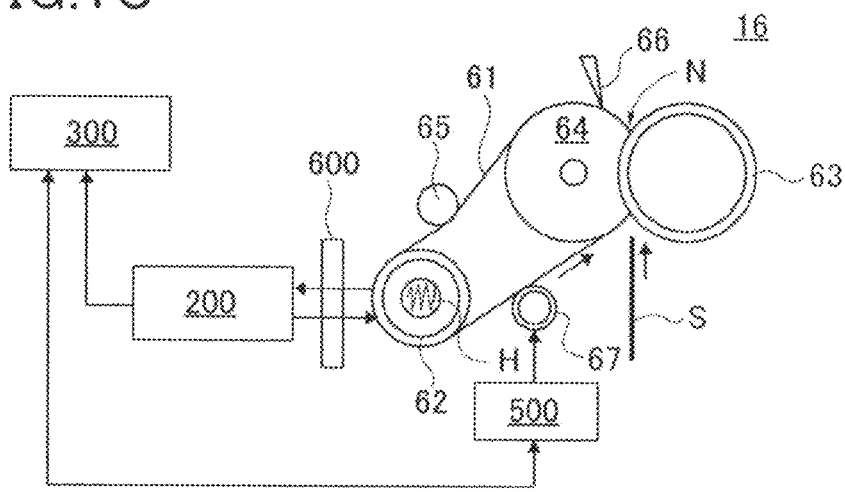

Hereinafter, embodiments of an image forming apparatus including a reflective optical sensor will be described with reference to the accompanying drawings. FIGS. 1A to 1C show a color printer 100 as one example of the image forming apparatus. The image forming apparatus should not be limited to the color printer 100 in FIGS. 1A to 1C and can be implemented as a monochrome printer, a monochrome or color copier, a facsimile machine, a plotter, a multifunction peripheral (MFP), or an FA (factory automation) inspection machine. In the following an XYZ three-dimensional Cartesian coordinate system shown in FIG. 1A is used.

First Embodiment

FIG. 1A shows the essential part of the color printer 100 which is a tandem type printer. A transfer belt 11 is an endless belt wound around rollers (three in the drawing) 12 and rotates along Y-axis and driven by one of the rollers 12, a drive roller, in a certain direction (counterclockwise in FIG. 1).

The lower part of the transfer belt 11 in FIG. 1 is extended flatly in which image forming units UY, UM, UC, UB to form yellow, magenta, cyan, black images respectively are arranged. The codes, "Y, M, C, and B" represent yellow, magenta, cyan, and black colors, respectively.

An optical scanner 13 as an image writing device is placed below the image forming units UY, UM, UC, UB and a cassette 14 containing papers S as a sheet-type recording medium is placed below the optical scanner 13.

The image forming units UY, UM, UC, UB have the same structure, therefore, the image forming unit UY is described simply as an example, referring to FIG. 1B. The image forming unit UY includes a photoconductor drum 2Y as an image bearer, a charger 3Y, a developing unit 4Y, a transfer roller 5Y, and a cleaning unit 6Y placed around the photoconductor drum 2Y.

The charger 3Y is a contact-type charge roller. An image is written with a scanning light beam LY in an area between the charger 3Y and the developing unit 4Y. The transfer roller 5Y is placed opposite to the photoconductor drum 2Y via the transfer belt 11 and contacts the back surface of the transfer belt 11.

Similarly, the image forming units UM, UC, UB include photoconductor drums 2M, 2C, 2B, chargers 3M, 3C, 3B, developing units 4M, 4C, 4B, transfer rollers 5M, 5C, 5B, and cleaning units 6M, 6C, 6B, respectively.

The color image printing process of the color printer 100 will be simply described in the following. The rectangular indicated by the broken line in FIG. 1B intends to collectively show the image forming unit UY but does not necessarily show the substantiality of a casing or the like.

Upon a start of the color image forming process, the photoconductor drums 2Y, 2M, 2C, 2B and the transfer belt 11 start rotating. The photoconductor drums 2Y, 2M, 2C, 2B rotate clockwise and the transfer belt 11 rotates counterclockwise in FIG. 1, for example.

The surfaces of the photoconductor drums 2Y, 2M, 2C, 2B are evenly charged by the chargers 3Y, 3M, 3C, 3B. The optical scanner 13 scans the photoconductor drums 2Y, 2M, 2C, 2B with light beams LY, LM, LC, LB, respectively to write images. Various kinds of optical scanner for writing images are known and any of them can be arbitrarily used for the optical scanner 13.

The photoconductor drum 2Y is scanned with the laser beam LY intensity-modulated for a yellow image to write a yellow image on the surface and form an electrostatic latent image. The electrostatic latent image is a negative latent image and visualized as a yellow toner image by the reversal development with the developing unit 4Y using yellow toner. Then, the yellow toner image is primarily transferred onto the transfer belt 11 electrostatically.

The photoconductor drum 2M is scanned with the laser beam LM intensity-modulated for a magenta image to write a magenta image on the surface and form an electrostatic latent image. The electrostatic latent image is visualized as a magenta toner image by the reversal development with the developing unit 4M using magenta toner. The photoconductor drum 2C is scanned with the laser beam LC intensity-modulated for a cyan image to write a cyan image on the surface and form an electrostatic latent image. The electrostatic latent image is visualized as a cyan toner image by the reversal development with the developing unit 4C using cyan toner.

The photoconductor drum 2B is scanned with the laser beam LB intensity-modulated for a black image to write a black image on the surface and form an electrostatic latent image. The electrostatic latent image is visualized as a black toner image by the reversal development with the developing unit 4B using black toner.

Then, the magenta toner image is primarily transferred by the transfer roller 5M electrostatically and superimposed onto the yellow toner image on the transfer belt 11. Likewise, the cyan toner image is primarily transferred by the transfer roller 5C electrostatically and superimposed onto the magenta and yellow toner images on the transfer belt 11. The black toner image is primarily transferred by the transfer roller 5B electrostatically and superimposed onto the cyan, yellow, and magenta toner images on the transfer belt 11.

Thus, the yellow, magenta, cyan, and black toner images are superimposed onto the transfer belt 11 to form a four-color toner image. After the transfer of the toner images, remaining toner and paper powder on the photoconductor drums 2Y, 2M, 2C, 2B are cleaned by the cleaning units 6Y, 6M, 6C, 6B.

The color toner images are secondarily electrostatically transferred by the secondary transfer roller 15 onto a paper S from the transfer belt 11, fixed by the fixing unit 16 and discharged outside the printer.

The papers S are contained in the cassette 14, fed by a known feeding system, stand by with a tip end held by a registration roller pair, and are sent to a secondary transfer unit at timing at which the color toner image is transferred onto the transfer belt 11.

The secondary transfer unit is an abutment part with the transfer belt 11 and the secondary transfer roller 15 rotated with the transfer belt 11. The papers S are sent to the secondary transfer unit by the registration roller pair at timing at which the color toner image is transferred from the transfer belt 11 to the secondary transfer unit. Thereby, the color toner image is electrostatically transferred onto the papers S on the transfer belt 11.

Then, the secondarily transferred color toner image is fixed on the papers S while passing through the fixing unit 16, and discharged to a tray TR on the top of the color printer 100.

The color printer 100 generally performs the color image printing process as above.

Next, the fixing unit 16 of the color printer 100 in FIG. 1A is described referring to FIG. 1C. The fixing unit 16 is a fixing belt system and includes a fixing belt 61 as a moving element, a heating roller 62, a fixing roller 64, a pressure roller 63, a tension roller 65, and a peeler 66. Further, it includes a surface changing roller 67, a driver of the surface changing roller 67, and a surface information detector. The surface information detector needs to be provided in the color printer 100 but does not have to be in the fixing unit 16.

The fixing belt 61 is made from nickel and polyimide as a base material including a PFA or PTFE demolding layer and an elastic layer made from silicon rubber between the base material and demolding layer, for example. Thus, the surface of the fixing belt 61 is resin such as PFA or PTFE, and surface information thereon is a subject of detection by the reflective optical sensor 200.

The fixing belt 61 is an endless belt wound around the heating roller 62 and the fixing roller 64 and given a required tension by the tension roller 65. The fixing belt 61 should not be limited to an endless belt and can be any known belt. A moving element should not be limited to the fixing belt 61 and can be any known element.

The heating roller 62 is a hollow roller made from aluminum or iron and contains a thermal source H such as a halogen heater. The thermal source H heats the fixing belt 61 via the heating roller 62. Further, a thermal sensor such as a thermopile is provided in non-contact manner on the surface of the fixing belt 61 to detect the surface temperature of the fixing belt 61. In place of the non-contact thermal sensor, a contact thermal sensor such as a thermistor is also usable.

The fixing roller 64 is made of a metal core surrounded with silicone rubber to be elastic and rotates the fixing belt 61 counterclockwise.

The pressure roller 63 is made of an aluminum or iron metal core having an elastic layer such as a silicon rubber and a surface layer as a PFA or PTFE demolding layer. The pressure roller 63 is positioned corresponding to the fixing roller 64 to press the fixing belt 61 and deform the fixing roller 64 to form a nip which is a fixing portion N.

The tension roller 65 is made of a metal core on which a silicon rubber is provided. A number of peelers 66 are placed along the axis (vertical direction in the drawing) of the fixing roller 64A with tip ends abutting on the surface of the fixing belt 61.

In the above fixing unit 16 the fixing belt 61 is rotated counterclockwise and the pressure roller 63 is rotated clockwise while heated by the thermal source H. When the surface temperature of the fixing belt 61 arrives a fixable temperature, a paper S on which the color toner image has been transferred is carried in the direction indicated by the arrow in FIG. 1C and enters the fixing portion N. The color toner image receives heat at the fixing portion N from the fixing belt 61 and receives pressure from the pressure roller 63 to be pressed fixed on the paper S on the fixing belt 61.

In addition, the color printer 100 includes a cleaner 17 to clean the transfer belt 11. The cleaner 17 includes a brush and a blade opposing and abutting on the transfer belt 11 wound around the roller 12 on the left side of the image forming unit UY in FIG. 1A. The cleaner 17 removes foreign materials as remaining toner and paper powder from the transfer belt 11 with the brush and the blade. The cleaner 17 further includes a discharger to discharge and discard the remaining toner removed from the transfer belt 11.

According to the image forming apparatus in FIGS. 1A to 1C, the color toner images are primarily transferred from the photoconductor drums 2Y, 2M, 2C, 2B and superimposed in order on the transfer belt 11, and secondarily transferred onto the paper S by the secondary transfer roller 15, by way of example. However, a transfer method should be not limited to this example.

For instance, it is possible to carry papers S on the transfer belt 11 and have them contact the photoconductor drums, thereby directly superimposing the toner images on the papers S. The color toner images are fixed thereon in the same manner as above.

In the color printer 100 in FIGS. 1A to 1C the fixing unit 16 includes the surface information detector which detects surface information on the fixing belt 61 as a moving element. The surface information detector according to the present embodiment will be described by way of example. The surface information detector is configured to emit light spots to the surface of the moving element in a direction crossing a moving direction of the moving element and receive reflected light by each light spot to detect surface information on the moving element on the basis of detected results. The surface information detector includes a reflective optical sensor 200 and a surface information detector 300 in the present embodiment.

Figure 2A:
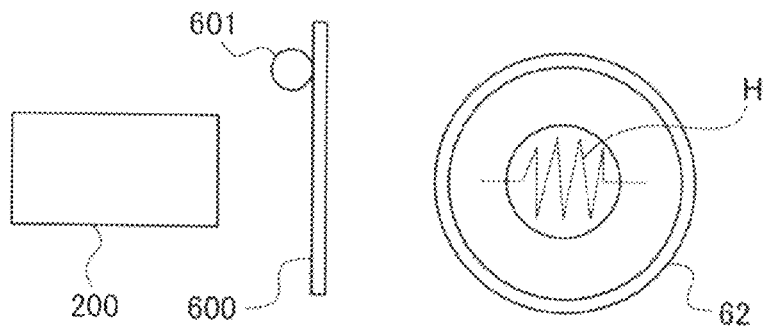
FIG. 2A shows a light shield in a closed state and FIG. 2B shows the light shield in an open state by way of example.
Figure 2B:
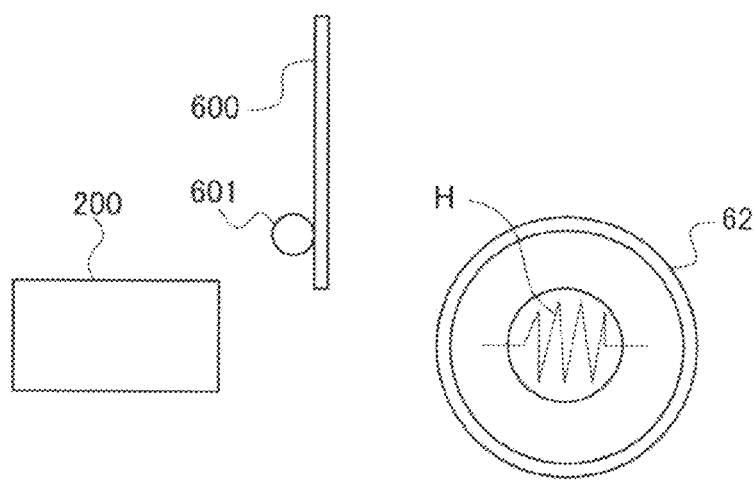

Referring to FIGS. 1C, 2A, and 2B, the surface information detector further includes a light shield movable between the reflective optical sensor 200 and the fixing belt 61 to block an optical path therebetween. FIGS. 2A, 2B show one example of shutter type light shield 600.

Figure 3:
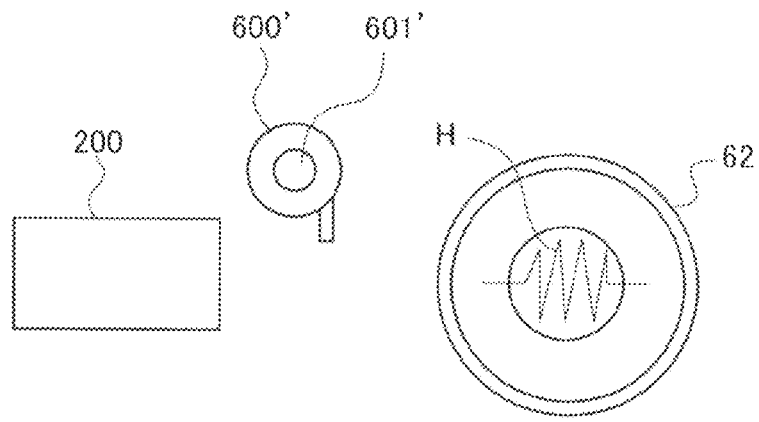
FIG. 3 shows another example of the light shield.

As shown in the drawings, the light shield 600 is moved by an arbitrary known mover 601 when needed to open or close the optical path. The light shield 600 is not limited to a shutter type. For example, a winding light shield 600' driven by an arbitrary known winder 601' can be also used, as shown in FIG. 3.

The reflective optical sensor 200 is placed to face the portion of the fixing belt 61 wound around the heating roller 62, emit light to the surface of the fixing belt 61, form light spots SP on different positions of the surface in a direction crossing the moving direction, and receive reflected light by the fixing belt 61, as shown in FIG. 1C.

The direction crossing the moving direction on the fixing belt 61 corresponds to a main scanning direction in which images are written by optical scanning, and may be referred to as a main direction. The moving direction corresponds to a sub scanning direction and may be referred to as sub direction.

The surface information detector 300 is connected to the reflective optical sensor 200 in the color printer 100 to receive a detection signal from the reflective optical sensor 200 and detect a surface condition of the fixing belt 61 as surface information.

The surface changing roller 67 is made of a metal core with a surface layer of a certain roughness. The surface layer includes, for instance, unevenness of several 10 µm. The surface roughness of the layer is larger than that of the fixing belt 61. When the surface changing roller 67 is rotated on the fixing belt 61, the surface of the fixing belt 61 is scraped by the abrasion by the surface changing roller 67 and a new surface is exposed. Thus, a damaged portion of the fixing belt 61 can be removed by scraping to expose a new surface free from damage such as scratches or scars.

The surface condition controller 500 is connected to the surface changing roller 67 in the color printer 100 to control the operation of the surface changing roller 67 according to a result of the detection of the surface information detector 300.

The surface changing roller 67 is controlled by a driver to move to or move away from and slide on the fixing belt 61. The driver includes a rod 69 to support the surface changing roller 67 and a rotational shaft 68 connected to the rod 69, referring to FIGS. 4A and 4B. The driver is controlled by the surface condition controller 500.

Figure 4A:
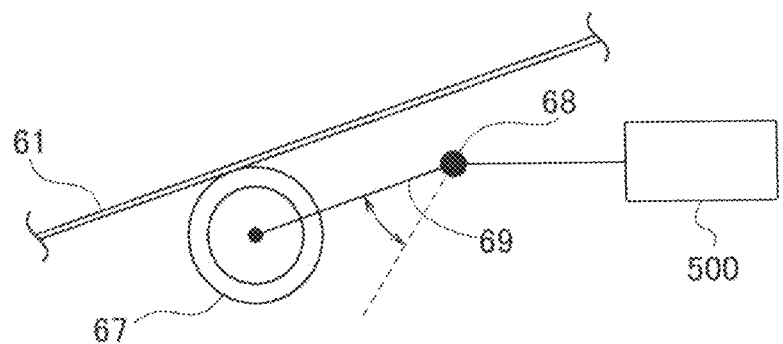
FIG. 4A shows a surface changing roller placed to contact the surface of the fixing belt by a surface condition controller and FIG. 4B shows the surface changing roller separated from the surface of the fixing belt.
Figure 4B:
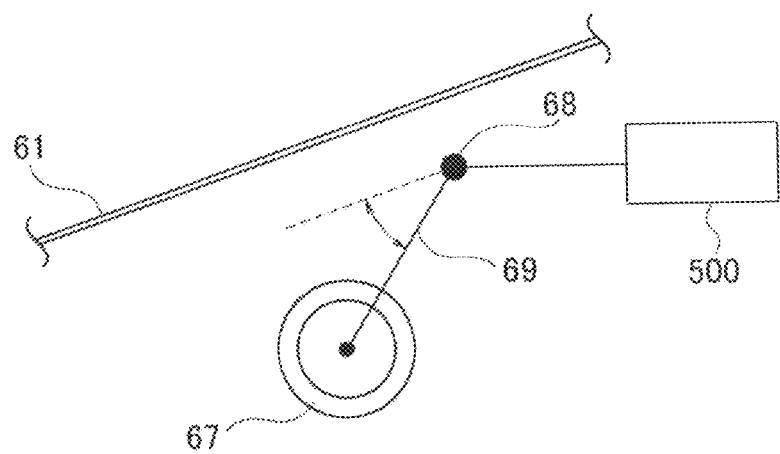

FIG. 4A shows the surface changing roller 67 contacting the surface of the fixing belt 61. FIG. 4B shows the surface changing roller 67 separated from the fixing belt 61. Upon receipt of a result of detection of a damage from the surface information detector 300, the surface condition controller 500 drives the driver to control the surface changing roller 67 to scrape off the damaged portion on the surface of the fixing belt and expose a new surface free from damage.

A controller of the surface information detector 300 and the surface condition controller 500 can be formed as a micro-computer or CPU, or can be incorporated as a control program in the same computer.

The surface of the fixing belt 61 is initially free from any damage. However, along with repeated fixing operation, linear scratches or scars can occur due to offset, contact with the peeler or a sheet-type recording medium. Surface information refers to a condition of surface on which damage such as scratches, scars or offset has occurred, i.e., presence or absence and degree of offset and a degree and a position of damage.

The causes of a linear scratch or scar by a sheet-type recording medium are now described. For instance, images are repeatedly fixed on A4-size papers in a portrait orientation in an image forming apparatus using A4 and A3-size papers as a recording medium. Vertically long scratches may occur on the surface of the fixing belt 61 at positions corresponding to both ends of the width of an A4 paper in the portrait orientation. This is caused by paper powder attached on the ends of the paper and roughening the surface of the fixing belt 61. When fixing is performed in this belt condition, the vertically long scratches cause glossy streaks on the surface of an image, affecting image quality.

In the following the detection of surface information on a linear scratch by the surface information detector will be described. FIG. 5 shows the fixing of the fixing unit 16. The vertical direction in FIG. 5 corresponds to a direction crossing the moving direction TRD on the fixing belt surface, that is, main scanning direction.

The code S denotes an A4-size paper including a color toner image to fix, in this example. The paper S can be carried in longitudinal and width directions. The code A4T denotes the width of the paper S carried in the longitudinal direction and the code A4L is the width of the same carried in the width direction.

The width A4L is approximately equal to the width of the fixing belt 61, therefore, linear scratches at the longitudinal ends do not practically matter when the paper S is carried in the width direction. Meanwhile, the width A4T is shorter than the width of the fixing belt 61, and linear scratches occur inside the width A4L, which may affect image quality.

The codes W1 and W2 in FIG. 5 indicate widths of allowance of the ends of the paper S moving in the main scanning direction when the paper S is carried in the longitudinal direction. The reflective optical sensor 200 is placed to oppose the end of the paper S in the main scanning direction and emit light spots in the main scanning direction. A detection area A is an area which is illuminated with the light spots. Since the reflective optical sensor 200 forms a long detection area A, a relative position of the reflective optical sensor 200 and the ends of the width of the paper S in the main scanning direction can be roughly set.

The surface information detector 300 can detect the surface condition of the fixing belt in the detection area A which is long in the main scanning direction, upon receiving a detection signal from the reflective optical sensor 200. When the detection area A includes the ends of the paper width, information on the linear scratches, that is, a scratch level and/or a scratch position in the main scanning direction are quantified as surface information of the fixing belt 61. Herein, the scratch level refers to a degree of scratch or depth (roughness) and width (size) of scratch.

The depth of a scratch is supplementally described. A contact pressure between a damaged portion (scratch by contact with a thermistor or a peeler or linear scratch) on the surface of the fixing element and a toner image is weakened. A fixing failure may occur depending on the degree of a scratch. Thus, an anomalous image including white spots which lower in density occurs in a fixed image. Herein, the depth of a scratch is a quantified correlation between such a scratch and a defect in an image caused by the scratch and refers to a parameter representing a degree of the defect.

Hereinafter, the structure and basic operation of the reflective optical sensor 200 according to the present embodiment will be described by way of example, referring to FIG. 6A to FIG. 6E. In FIGS. 6A to 6D and subsequent drawings, X-direction is defined to be a direction crossing the moving direction or the main scanning direction. Y-direction is defined to be the moving direction or sub scanning direction. Z-direction is defined to be a direction orthogonal to both the X and Y directions. The Z-direction is a direction toward a surface portion 61S including the detection area A of the fixing belt 61 from the reflective optical sensor 200.

Figure 6A:
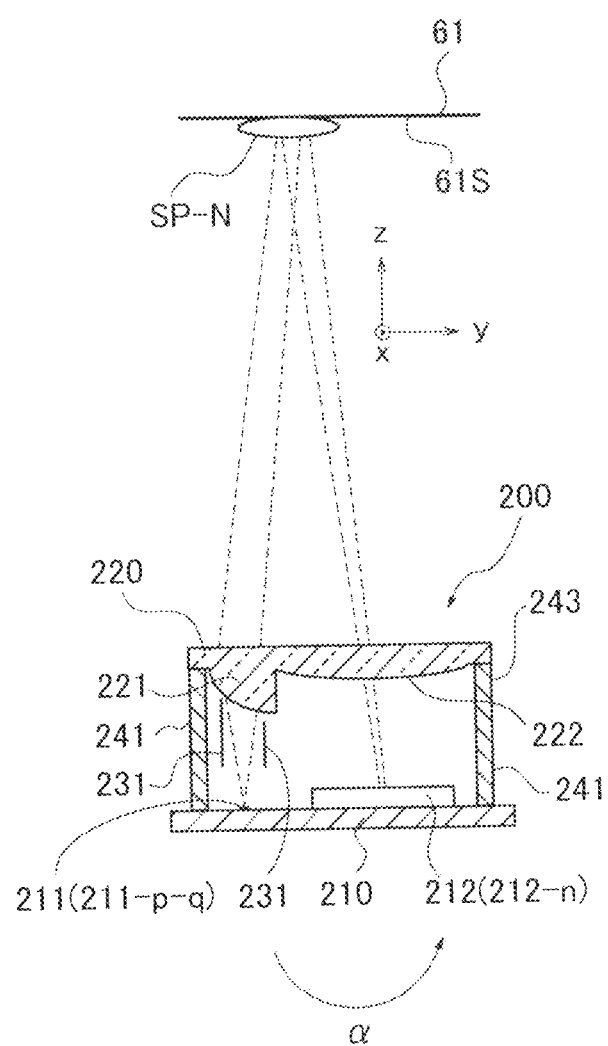
FIG. 6A is a schematic cross section of the reflective optical sensor as viewed from a moving direction and a vertical direction (X-direction).
Figure 6B:
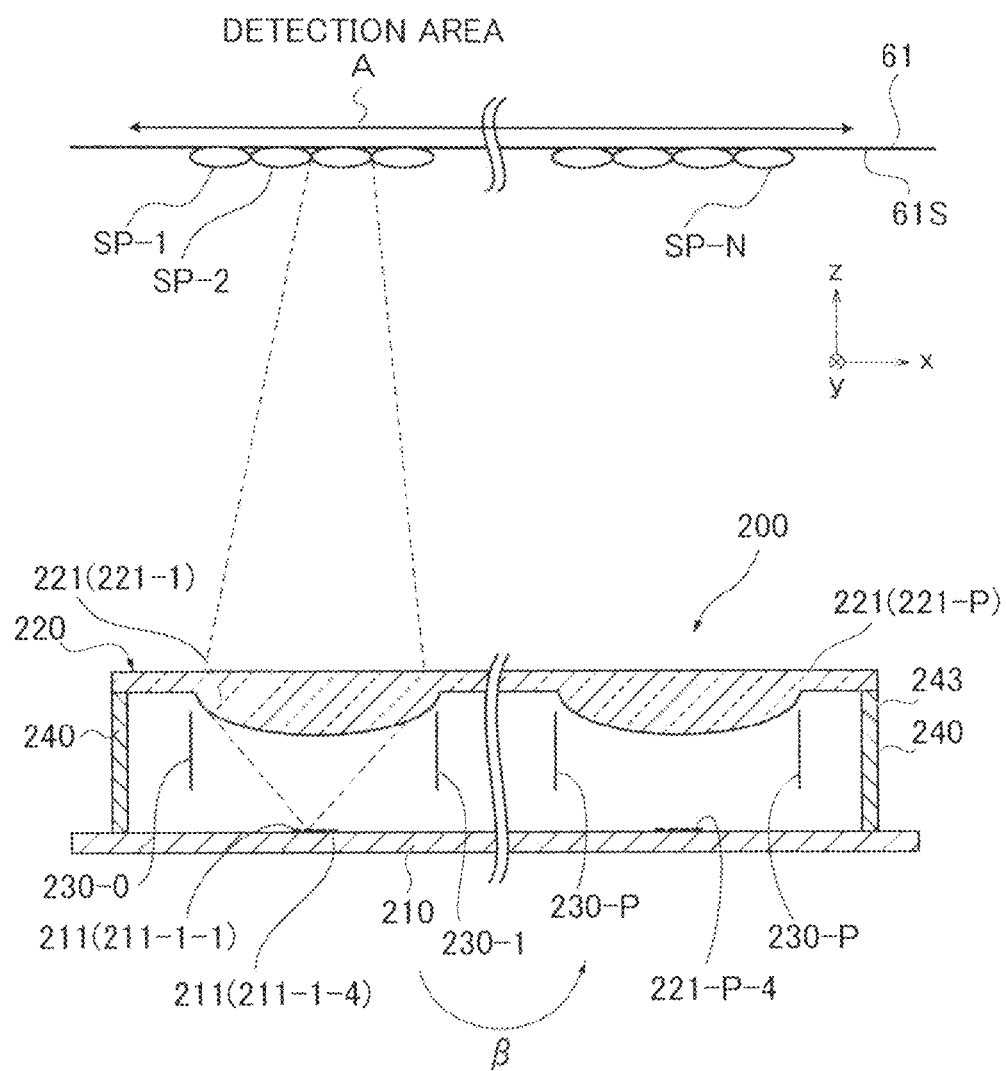
FIG. 6B is a schematic cross section of the reflective optical sensor of FIG. 6A as view from LEDs to a moving direction (Y-direction).
Figure 6C:
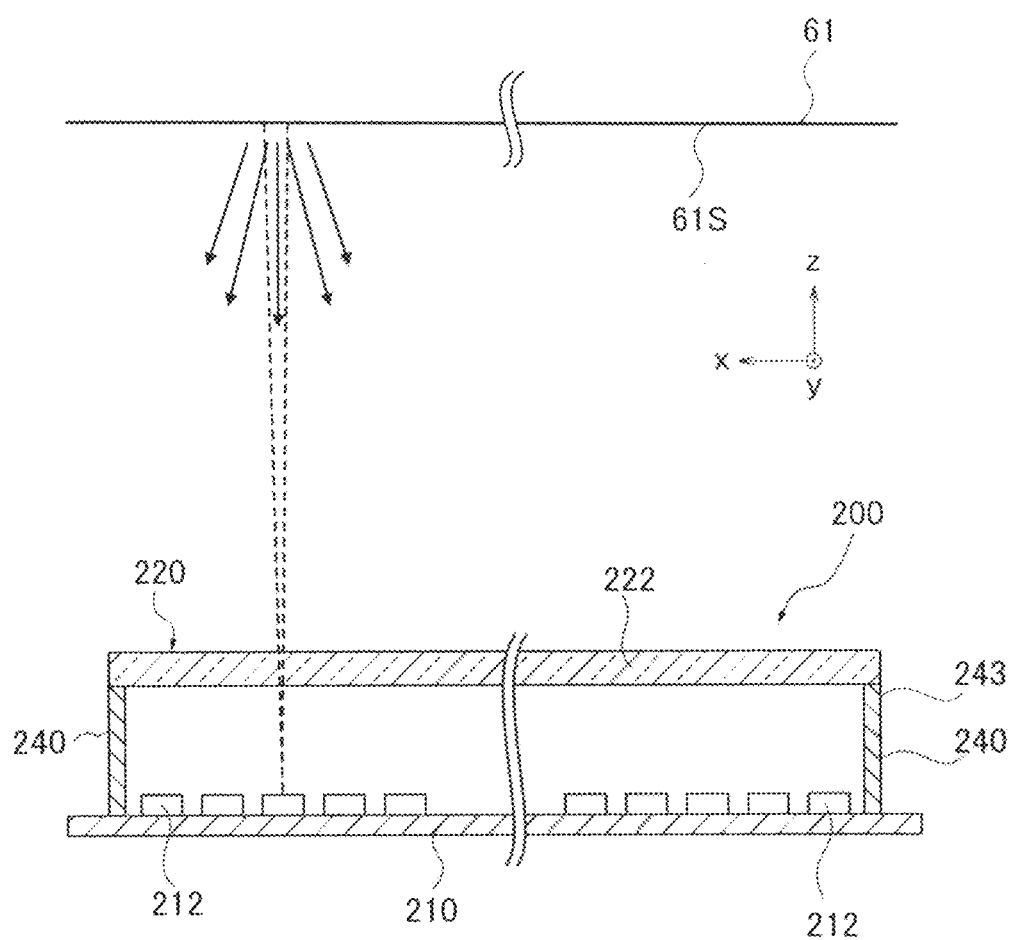
FIG. 6C is a schematic cross section of the reflective optical sensor of FIG. 6A as viewed from PDs and the moving direction (Y-direction).
Figure 6D:
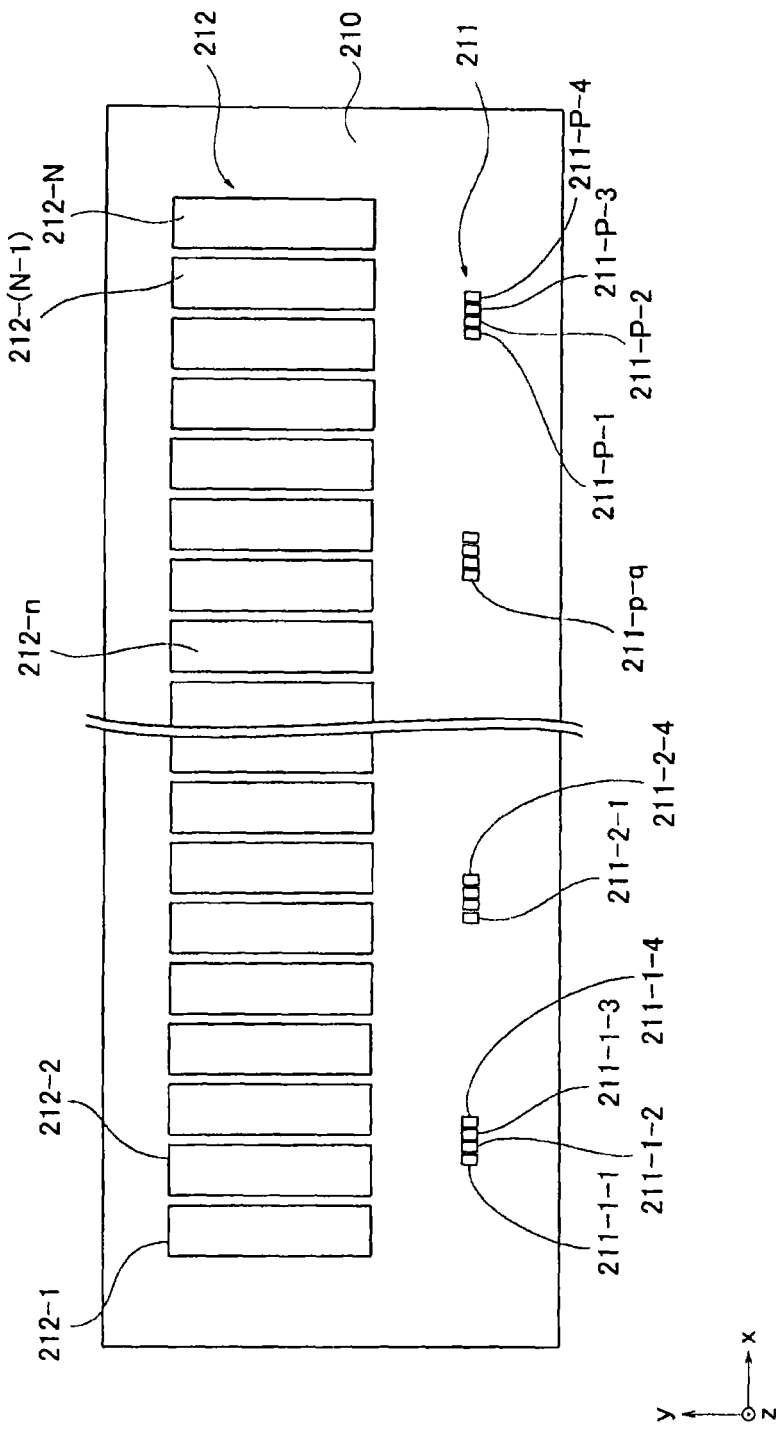
FIG. 6D is a plan view of a substrate on which the LEDs and PDs of the reflective optical sensor of FIG. 6A are supported, as viewed from a Z-direction.

The reflective optical sensor 200 includes a substrate 210, side plates 240, 241, and a lens element 220 in FIG. 6A to FIG. 6D. Referring to FIG. 6D, light emitting diodes (hereinafter, LED) 211 and photodiodes (hereinafter, PD) 212 are arranged on the substrate 210.

Thus, the reflective optical sensor 200 further includes a light emitting system having the LEDs 211 as light emitters and a light emitting lens 221 and a light receiving system having the PDs 212 as light receivers, a light receiving lens 222, and aperture elements 230, 231 which prevents flares.

Arrays of the LEDs 211 are arranged with an equal interval along the length of the substrate 210, that is, in the X-direction. FIG. 6D shows 16 LEDs 211, four arrays of four LED 211 by way of example, for the sake of simplicity. The number of LEDs 211 is decided according to a designing condition and can be generally set to several dozens to several hundreds.

The PDs 212 are arranged with an equal interval in the X-direction on the substrate 210. Herein, the number of PDs 212 is assumed to be equal to that of the LEDs 211.

From the left side or the first one in the X-direction in FIG. 6D, every four LEDs 211 are grouped to p arrays (p=1 to P where P is a total number of arrays) and given a number q (q=1 to 4) in order. A q-th LED 211 of an array p from the left side is represented by LED 211-$p$-$q$. Thus, an LED 211-1-1, an LED 211-1-2, an LED 211-1-3, an LED 211-1-4, an LED 211-2-1, . . . , an LED 211-2-4, . . . , an LED 211-$p$-$q$, . . . , an LED 211-P-1, an LED 211-P-2, an LED 211-P-3, and an LED 211-P-4 are arranged in order, as shown in FIG. 6D. The total number N of the LEDs 211 is N=4P.

Meanwhile, the PDs 212 are given a number in order from the left side of FIG. 6D. An n-th one from the left side is represented by PD 212-$n$. The total number of the PDs 212 is N. A PD 212-1, a PD 212-2, . . . , a PD 212-$n$, . . . , a PD 212-(N−1), and a PD 212-N are arranged in order.

Next, the structure of the lens element 220 is described in detail referring to FIG. 6A to FIG. 6C. The lens element 220 includes two areas, an area of an array of light emitting lenses 221 and an area of the light receiving lens 222, as shown in FIGS. 6A and 6B.

In FIG. 6B the light emitting lenses 221 are arranged in the X-direction and given reference numerals 221-$p$ (p=1 to P) in order. According to the present embodiment one light emitting lens 221-$p$ is provided for the four LEDs 211$p$-$q$. That is, the number of light emitting lenses 221-$p$ is a value by dividing the number N of LEDs 211 by four (P=N/4). The light emitting lenses 221-P are arranged above the LEDs 211 in the X-direction to correspond to the four LEDs 211-$p$-$q$ (q=1 to 4) one by one.

Referring to FIGS. 6A and 6C, the light receiving lens 222 is a single cylindrical lens and provided commonly for the PD 212-1 to PD 212-N above the PDs 212. FIG. 6C shows the reflective optical sensor 200 seen along the Y-axis from positive to negative. The light receiving lens 222 has positive power only in the Y-direction.

The light emitting lens array and the light receiving lens 222 can be formed integrally by resin molding.

The aperture elements 230 are provided on both sides of the light emitting lenses 221 in FIG. 6B. The aperture elements 230-0, 230-1, . . . , 230-$p$, . . . , and 230-P are arranged in order from the left side to prevent flares between the neighboring arrays of the four LEDs 211-$p$-$q$ and the light emitting lenses 221-$p$. Further, the aperture elements 231 in FIG. 6A are intended for preventing flares between the array of the LEDs 211-$p$-$q$ and the array of the PDs 212-P.

Figure 6E:
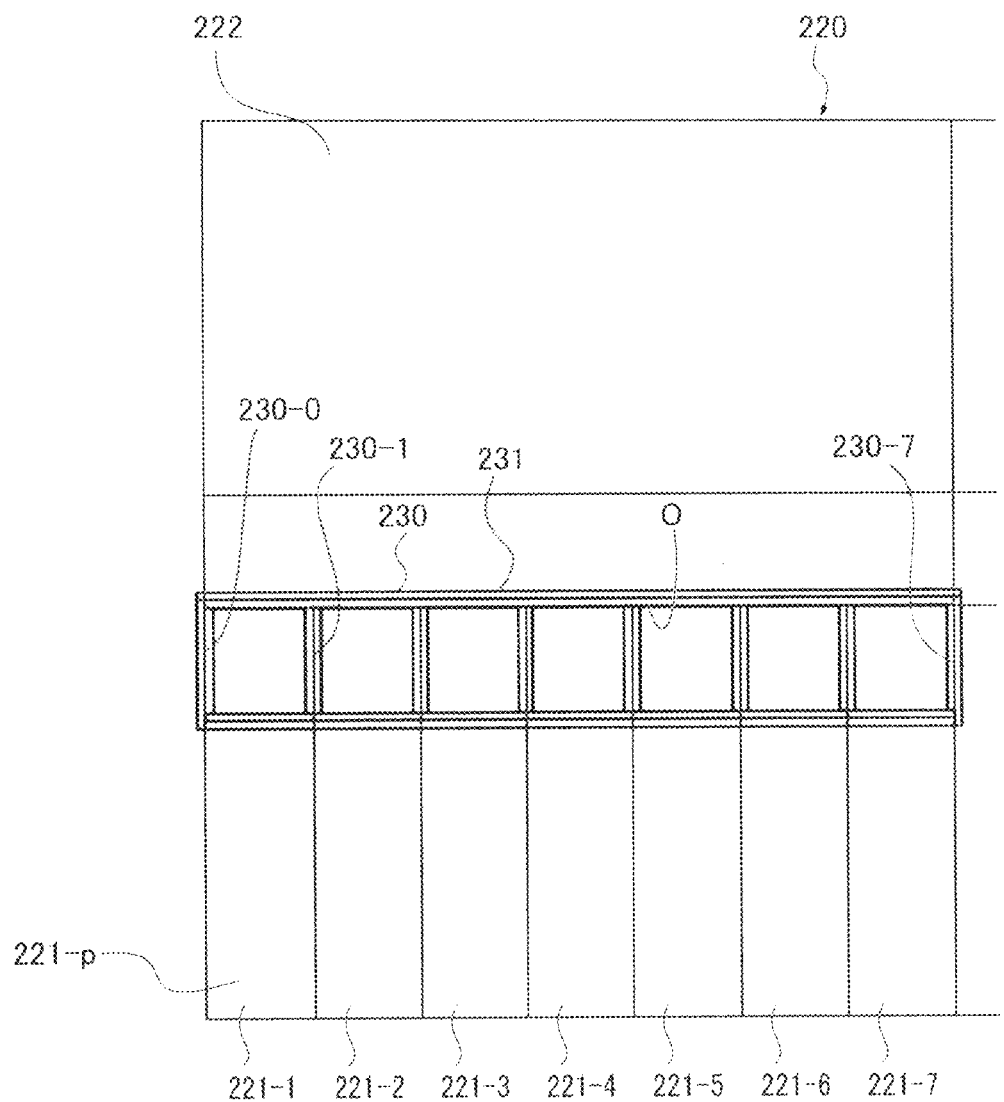
FIG. 6E shows a relationship between an aperture element and light emitting lenses of the reflective optical sensor in FIG. 6A.

FIG. 6E shows integrated aperture elements 230 and 231 when P=7. The apertures O are provided corresponding to the light emitting lenses 221-$p$ (221-1, 221-2, . . . ). A single aperture O is provided for an array of the four LEDs 211-$p$-$q$ and one light emitting lens 221-$p$.

The apertures O are intended for preventing flares, that is, light illuminating the fixing belt 61 through light emitting lenses other than the one corresponding to an arbitrary LED 211 and light directly reflected by any of the light emitting lenses 221 from directly entering the PDs 212.

The side plates 240 are placed in pair at both ends of the length of the substrate 210 in the X-direction, as shown in FIG. 6B. The side plates 241 are placed in pair at both ends of the width (Y-direction) of the substrate 210 to be long in the X-direction, as shown in FIG. 6A. The side plates 240, 241 form a case 243. The aperture elements 230, 231 and the case 243 can be integrated by resin molding.

Moreover, referring to FIG. 6B, a divergent light flux from the LED 211-$p$-$q$ is condensed by the corresponding light emitting lens 221-$p$ to irradiate the surface portion 61S of the fixing belt 61 with light spots SP (SP-1, SP-2, . . . ). Reflected light by the area of the surface portion 61S irradiated with the light spots SP is condensed by the light receiving lens 222 only in the Y-direction and incident on any of the PDs 212-$n$, as shown in FIGS. 6A, 6C. The reflection by the surface portion 61S is not mirror reflection and not condensed by the light receiving lens 222 in the X-direction. Therefore, the reflected light is received by not only the PD 212-$n$ but also other PDs 212.

Next, the operation of the reflective optical sensor 200 will be described referring to the flowchart in FIG. 7. The LED 211-$p$-4 to 211-$p$-1 of the LED 211-$p$ are turned on and off one by one in order to scan the surface portion 61S with the light spots SP-1 to SP-N from the left end to the right end in FIG. 6B. This operation is repeated until p=P. This is because the light emitting lenses 221-$p$ are of inverted type.

Now, the operation from the turning-on of the LEDs 211 to the detection with the PDs 212 is described. Referring to FIG. 7, in step S10 the initial value of the array p of the LEDs 211 is set to p=1 (1≤p≤P). In step S11 a counter sets the order of the turning-on of the LEDs 211-$p$-$q$ to q=4 (1≤q≤4).

Then, in step S12 the LED 211-$p$-$q$ is turned on. For example, in the first processing, that is, p=1, q=4, the LED 211-1-4 is turned on. In step S13 the PDs 212 receive light reflected by the surface portion 61S.

In synchronization with the turning-on of the LED 211-$p$-$q$, the reflected light from the surface portion 61S is condensed by the light receiving lens 222 only in the Y-direction and received by the PDs 212 including the PD 212-$n$. For the sake of simplicity, the number of the light receiving PDs is assumed to be an odd number (2m+1 where m is an integer). Thus, the reflected light of the LED 211-$p$-$q$ is received by the PD 212-$n$ and $m$ PDs (PD 212-$(n-m)$ to PD 212-$(n+m)$) on both sides of the PD 212-$n$.

For instance, at m=2, the number of the PDs receiving the reflected light is five, PDs 212-$(n-2)$, 212-$(n-1)$, 212-$n$, 212-$(n+1)$, and 212-$(n+2)$. The PDs 212-$(n-m)$ to 212-$(n+m)$ photoelectrically convert a received light amount into a signal. The signal is amplified to be a detection signal. The detection signal of each PD 212 is transmitted to the surface information detector 300 which determines a surface condition upon each detection in step S15.

Needless to say that m does not need to be 2. A correlation between image data and the number m can be empirically acquired in advance to select a suitable value for m, which can be set to zero.

In step S14 the LED 211-$p$-$q$ is turned off upon completion of the light receiving of the PDs 212. In step S15 the detection signals from the PDs 212-$(n-m)$ to 212-$(n+m)$ are transmitted to the surface information detector 300.

In step S16 a determination is made on whether or not q>1, i.e., all of the four LEDs 211 of the array p are subjected to steps S12 to S15. When q>1 is satisfied, there is an LED 211 having not turned on so that the value of q is counted down (q=q−1) in step S17. Then, the flow returns to step S12 and the next LED 211-$p$-$q$ is subjected to steps S12 to S15.

Meanwhile, when q>1 is not satisfied, all the LEDs 211 of the array p have undergone the operation, and the flow proceeds to step S18. The series of operation of the turning-on and off and detection signal transmission of the LEDs 211-1-4 to 211-1-1 of the array p=1 is determined to be completed.

In step S18 a determination is made on whether or not p<P, i.e, all of the arrays p (p=1 to P) have been subjected to steps S11 to S17. When p<P is satisfied, there is an array having not undergone the operation so that the value of p is counted up (p=p+1), and the flow returns to step S11. Meanwhile, when p<P is not satisfied, all of the arrays p have been subjected to the operation, and the flow proceeds to step S20. As described above, the LEDs 211-p-q are repeatedly turned on in order until p=P and q=1 are satisfied. The last LED 211-P-1 is turned on and off, completing one cycle of the operation including the turning-on of the LEDs and the acquiring of PD output values.

In step S20 a determination is made on whether or not another cycle of operation should be performed. At YES, the flow returns to step S10 and the steps S11 to S19 are repeated. Thus, the LEDs can be turned on in order in a number of cycles to find a mean value of the PD output values in each cycle. This makes it possible to improve the accuracy at which the PD output is detected. When a result in step S20 is NO, the flow ends.

In the above, if the light spots SP fall at the left end (SP-1 or SP-2) of the surface portion 61S in FIG. 6B, that is, the LED 211-1-3 or LED 211-1-4 turns on, the number of PDs 212 receiving the light is less than five since the light emitting lenses 221 are an inverted expander. This applies to the light spots SP falling on the right end.

In view of this, the number of LEDs to turn on can be set to N−4 excluding ones emitting light spots SP to both ends of the surface portion 61S instead of N. In general all of the LEDs 211 do not need to be turned on and off and an arbitrary number N' (≤N) of them can be used.

Figure 7:
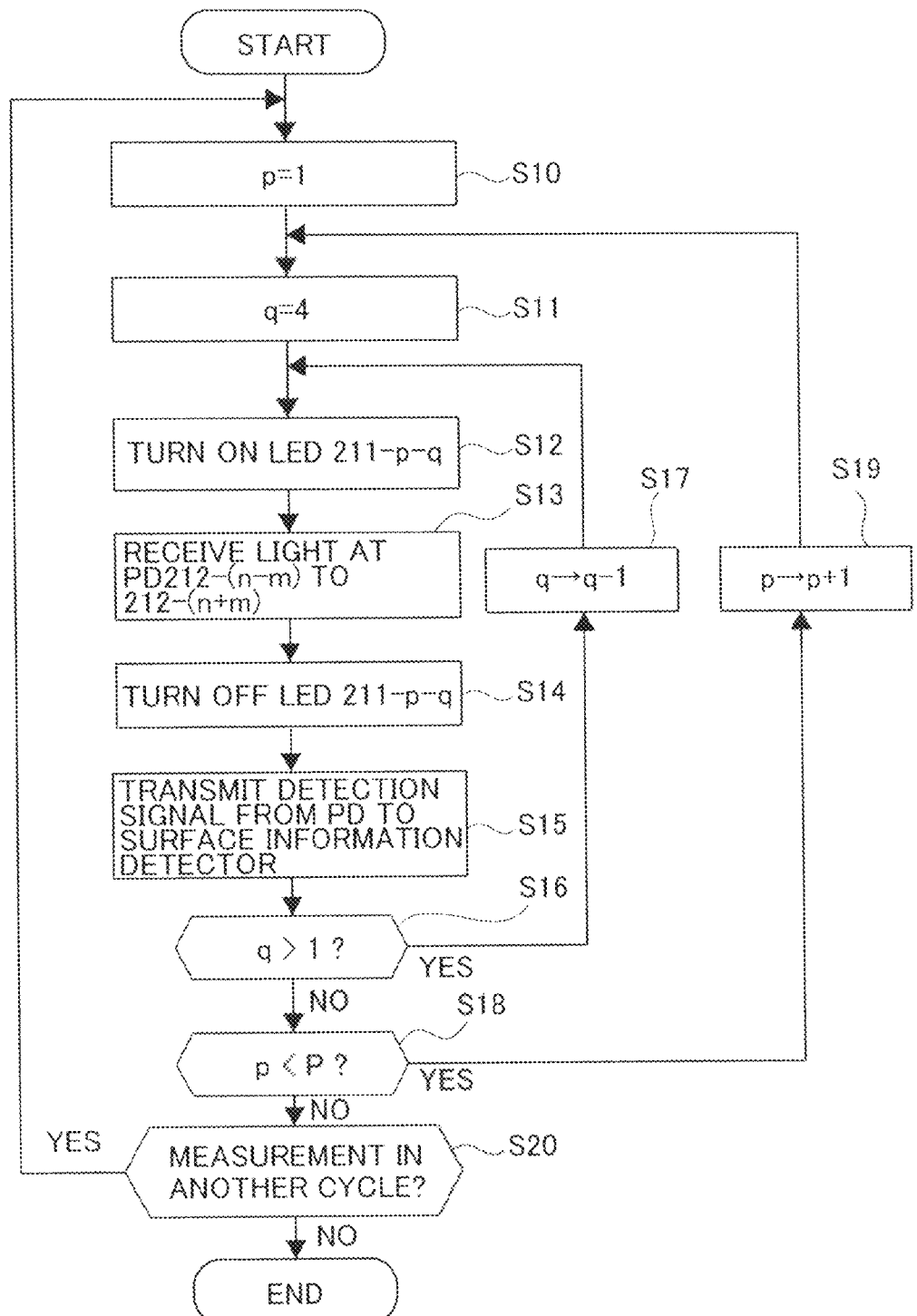
FIG. 7 is a flowchart for the operation of the reflective optical sensor in FIG. 6A.
Figure 8A:
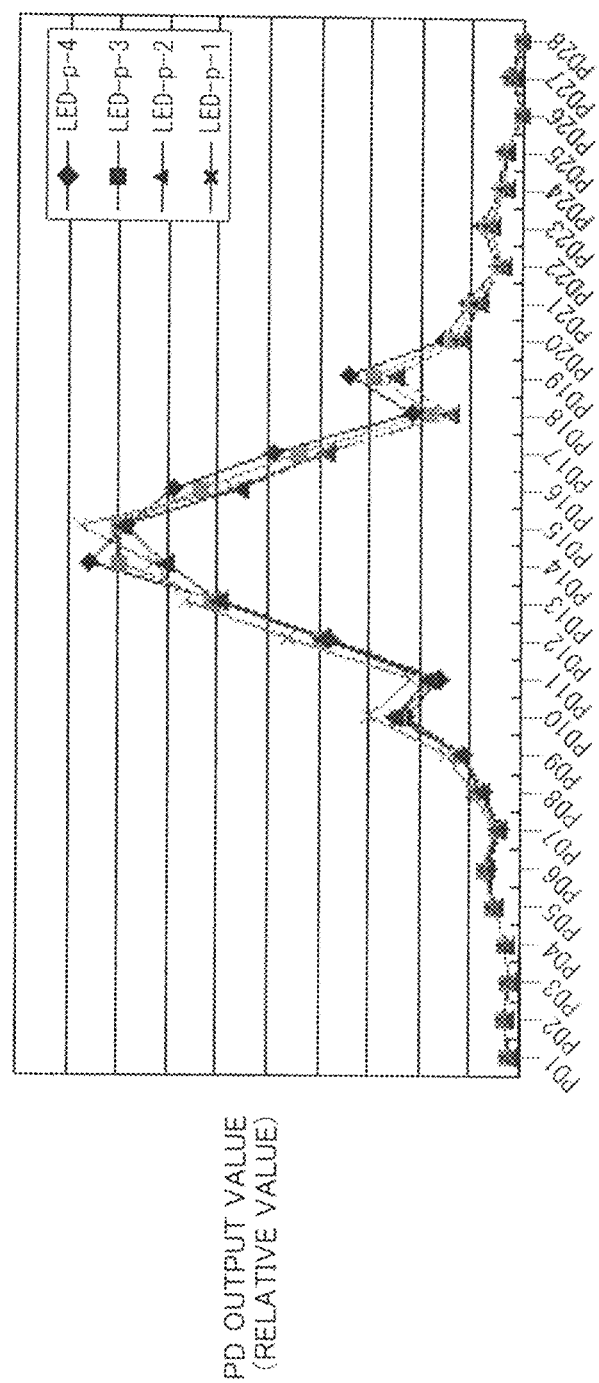
FIG. 8A is a graph showing a PD output value with no use of a fixing belt when the reflective optical sensor of FIG. 6A is operated following the flowchart in FIG. 7.

FIG. 8A is a graph showing the results of an experiment in which the reflective optical sensor 200 of FIGS. 6A to 6E is operated following the flowchart in FIG. 7. Further, FIG. 8A shows PD output values of PD 212-n (n=1 to 28) when each of the LED 211-p-q (q=1 to 4) is turned on without the fixing belt 61 as a target object which reflects a light flux from the reflective optical sensor 200.

Figure 9:
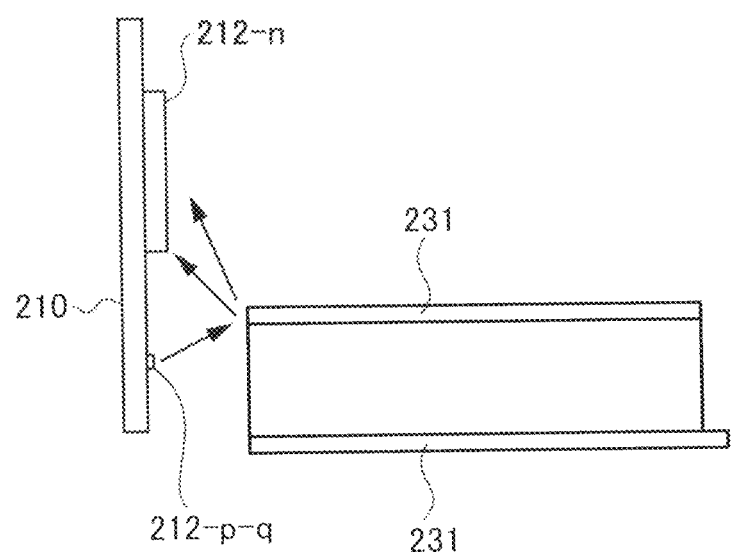
FIG. 9 shows that a part of a light beam from the LED is diffused by the aperture element and received at the PDs.

Without the fixing belt 61, the PD output value should be ideally zero. However, the PD output in FIG. 8A shows a curve with the PDs 212-14 and 212-15 at the center. The inventors of the present invention studied the causes of such PD output and found out that a part of divergent light flux from the LEDs 211-p-q is diffused by the front side of the aperture elements 230-p, 231 opposing the LEDs 211, and received by a number of PD 212-n, which is shown in FIG. 9.

To create a situation that the fixing belt 61 is absent in the color printer 100, the light shield 600 as shown in FIGS. 1, 2A, and 2B is provided in the present embodiment. Note that in the color printer 100 including the fixing belt 61, a PD output value includes the reflected light from the target fixing belt 61 and reflected light by the front sides of the aperture elements 230, 231.

Now, a PD output value is first detected with the light shield 600 closed, as shown in FIG. 2A and then detected with light shield 600 opened, as shown in FIG. 2B. Thus, it is able to obtain a PD output value indicating the reflected light only by the fixing belt 61 by finding a difference between the PD output values detected as above.

FIG. 8B is a graph showing PD output values obtained by subtracting the ones detected with absence of the fixing belt 61 or the light shield 600 closed in FIG. 8A from the ones detected with presence of the fixing belt 61 or the light shield 600 opened.

The inventors focused attention on the peak of the curve of the PD output values. When the LEDs 211-p-4, 211-p-3, 211-p-2, and 211-p-1 are turned on in order, the PD number whose PD output value is the peak is shifted from a small number to a large number. This is also apparent from the fact that the light spots SP scan the surface portion 61S of the fixing belt 61 from left to right in FIG. 6B.

FIG. 10A is a graph showing PD output values of 28 PDs when 20 LEDs of 28 LEDs 211-2-4 to 211-6-1 are turned on in order before a start of use of the color printer 100 with the light shield 600 closed. Before a start of use of the image forming apparatus refers to a point in time before a user starts operating the color printer 100, specifically, when the reflective optical sensor 200 or the color printer 100 is manufactured.

Further, FIG. 10B is a graph showing PD output values of reflected light only by a reference reflector in FIG. 10A obtained by subtracting ones detected with absence of the reference reflector or the light shield 600 closed from the ones detected with presence of the reference reflector or the light shield 600 opened.

The reflective optical sensor 200 is provided with a thermal sensor as IC thermal sensor to measure the temperature of the sensor 200. The values in FIGS. 10A and 10B were obtained at temperature of about 25° C. FIGS. 11A and 11B show PD output values when the temperature of the reflective optical sensor 200 measured by the thermal sensor is 70° C. From the graphs, it is found that along with a temperature rise from 25° C. to 70° C., the light amounts of the LEDs decrease and so do the detected values from the reference reflector.

Figure 12:
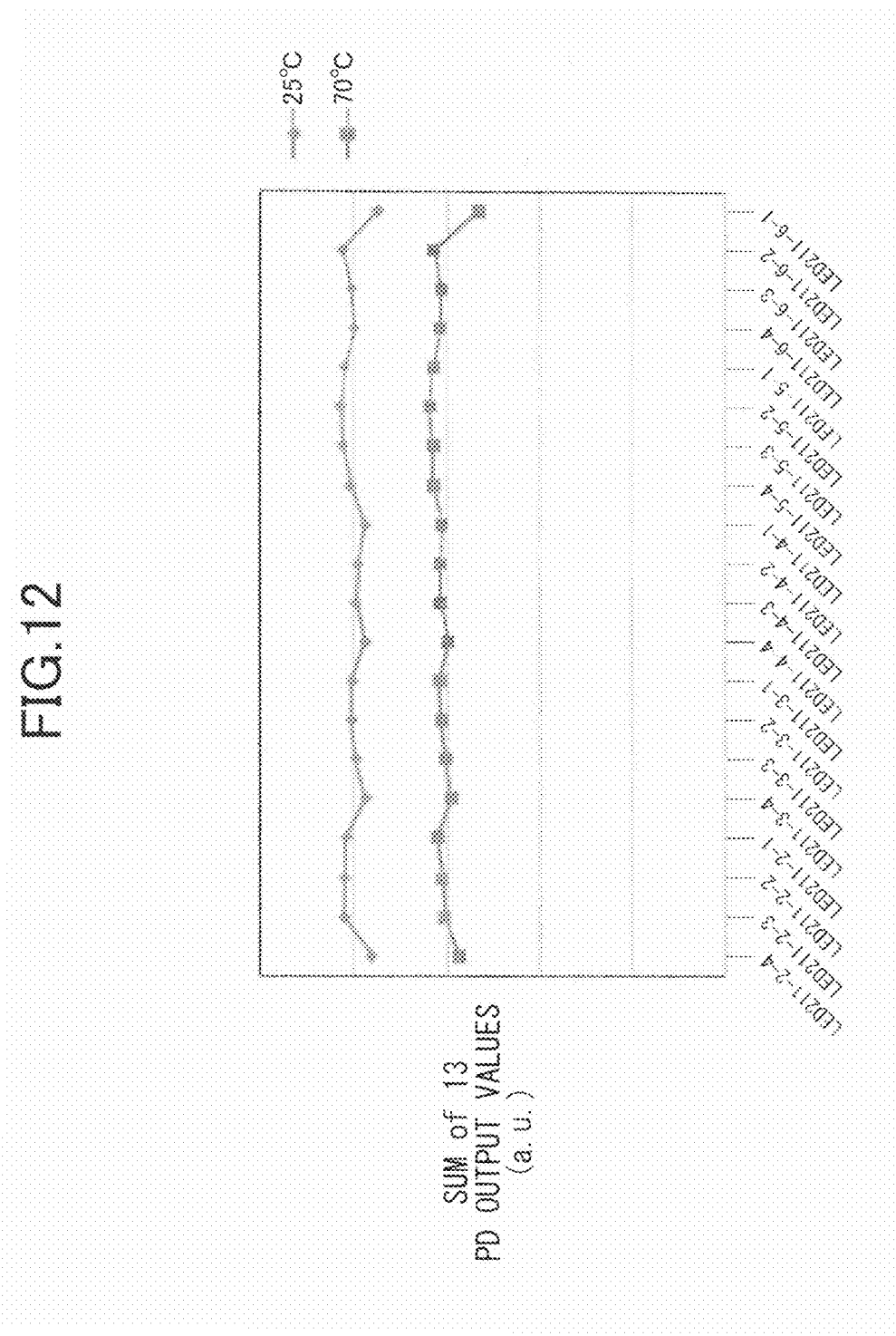
FIG. 12 is a graph showing a variation in the light amounts of respective LEDs at a temperature of 25° C. and 70° C.

FIG. 12 is a graph showing the sum of the PD output values relative to the LEDs 211 in FIGS. 10B and 11B. The sum represents a light amount reflected by the reference reflector and received by the PDs 212 of the reflective optical sensor 200. The sum can be a total sum of all the 28 PDs 212 or a sum of an arbitrary number of PDs including a maximal value. The maximal value depends on the optical system of the reflective optical sensor 200 and can be preset by experiment. Herein, the sum is set to a maximal value of the sum of 13 PD output values when the LEDs 211 continuously emit light. In other words, the graph in FIG. 12 shows a variation in the light amount relative to the LEDs 211 at temperatures of 25° C. and 70° C. when the reference reflector of the reflective optical sensor 200 is set as a reference.

Herein, the reference reflector is used as a reference in common for mass-production of reflective optical sensors 200. The individual reflective optical sensors 200 show different graphs in FIG. 12 naturally and differences in the graphs represent individual variabilities of the reflective optical sensors 200 since the reference reflector works as a reference for all of them.

Therefore, it is able to compare the output levels of mass-produced reflective optical sensors 200 by correcting a variation in the light amount including individual variabilities, using the same reference reflector as a reference. In other words the results shown in FIG. 12 can be used as a light amount correction coefficient for correcting an initial variation in the amounts of light spots.

The reference reflector made of a glass plate can be advantageous as a reference in terms of temporal and environmental stabilities and surface evenness. A glass plate reflects light on both sides. However, preferably, the reference reflector is configured to reflect only by one side by forming the other side to be a rough or scattering surface and applying black coating thereto.

FIG. 13A is a graph obtained by dividing the results detected at the temperatures of 25° C., 40° C., 50° C., 60° C., 70° C., and 80° C. by the results detected at 25° C. in FIG. 12. FIG. 13B is a rewritten graph of the one in FIG. 13A with temperature plotted on the abscissa axis. The results obtained by dividing the results detected at 25° C. by the results of the reference reflector at 25° C. are used for the light amount correction coefficients for correcting a variation in light amounts before the use of the image forming apparatus. It is found from the graph in FIG. 13A that the detected results of 20 light spots are more varied along with a temperature rise in the reflective optical sensor 200 even after the variation in the light amounts at 25° C. is corrected. This is because the light amount of each of the 20 spots is linear relative to the temperature of the sensor and their temperature coefficients differ relative to each spot, as seen from FIG. 13B.

Figure 16:
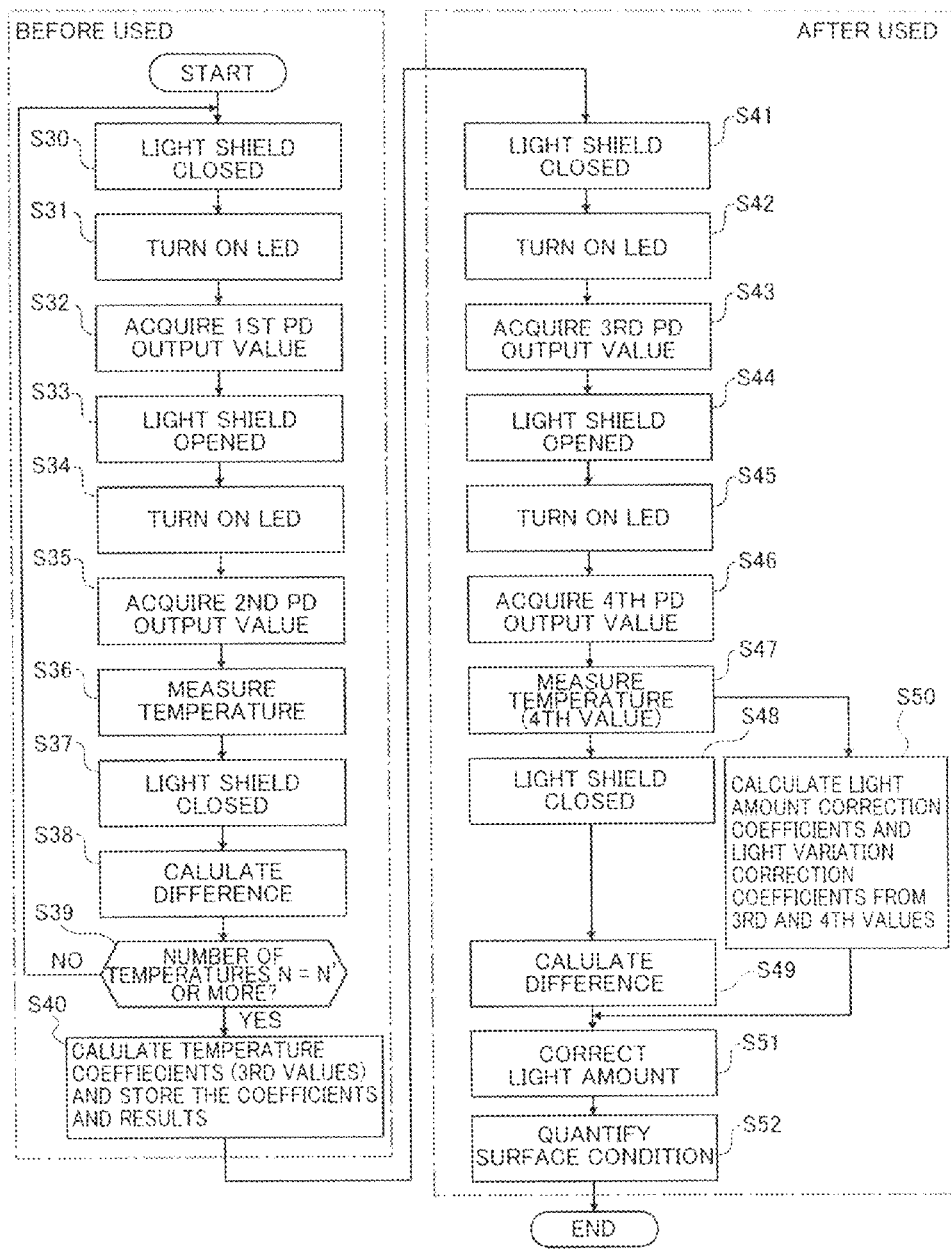
FIG. 16 is a flowchart for the operation of the reflective optical sensor in FIG. 6A before and after the use of the image forming apparatus.

Accordingly, to accurately detect the surface information on the fixing belt 61 with the reflective optical sensor 200, a series of operation in the flowchart of FIG. 16 is performed before and after the use of the image forming apparatus. Each step of the operation is described referring to FIG. 16. The steps are performed similarly to the operation described referring to FIG. 10A to FIG. 13B.

In step S30 the light shield 600 is closed before a start of the use of the image forming apparatus. In step S31 the LEDs 211 are turned on in order. In step S32 first PD output values of the reference detector are acquired. In step S33 the light shield 600 is opened and the LEDs 211 are turned on in order in step S34 to acquire second PD output values of the reference reflector in step S35. The temperature of the reflective optical sensor 200 is then measured with the thermal sensor in step S36. Then, after the light shield 600 is closed in step S37, differences between the first and second PD output values are calculated in step S38. The operation in steps S30 to S38 is repeated N' (N'=2 or more) or more times at different temperatures in step S39.

After the operation is repeated at different temperatures (YES in step S39), temperature coefficients relative to the light spots SP are calculated. The results detected at the reference temperature (25° C. in FIG. 13A), and the light amount correction coefficients and the temperature coefficients (hereinafter, collectively, third values) are stored in a memory of the reflective optical sensor 200 in step S40.

Next, after the use of the image forming apparatus, the light shield 600 is closed in step S41. In step S42 the LEDs 211 are turned on in order. In step S43 third PD output values of the reference detector are acquired. In step S44 the light shield 600 is opened and the LEDs 211 are turned on in order in step S45 to detect the condition of the surface portion 61S of the fixing belt 61 and acquire fourth PD output values of the reference reflector in step S46. The temperature (hereinafter, referred to as fourth value) of the reflective optical sensor 200 is measured with the thermal sensor in step S47.

Then, after the light shield 600 is closed in step S48, differences between the third and fourth PD output values are calculated in step S49. In parallel to the steps S48 and S49, the light amount correction coefficients and light variation correction coefficients for correcting light amounts are calculated according to the fourth values obtained in step S47, the results of the reference reflector obtained at 25° C. stored in the memory, and the temperature coefficients (third values) relative to the LEDs 211 in step S50. In step S51 the light amount of 20 light spots SP, for example, on the surface portion 61S of the fixing belt 61 in step S49 are corrected according to the light amount correction coefficients and light variation correction coefficients to correct an initial variation and a variation by a thermal change in the light amounts in step S51. Thereby, quantification of the surface condition of the fixing belt 61 is achieved in step S52.

By the above operation, even with a thermal change, the surface condition of the fixing belt 61 can be accurately detected. FIG. 14 is a graph showing the results of the reference reflector at 25° C., 40° C., 50° C., 60° C., 70° C., 80° C. corrected by this light amount correcting method. In comparison with FIG. 13A showing the results before the light amount correction, almost the same results are obtained regardless of the temperature at which the reference reflector is used. It is thus apparent that the variation in the LED light amounts due to the thermal change can be sufficiently corrected.

Further, FIG. 15 is a graph showing the detected results of the surface condition of the fixing belt 61 by use of the light variation correction coefficient after the image forming apparatus is used. As seen from the graph, the degree of a scratch on the fixing belt 61 at the light spot SP of the LED 211-3-3 is accurately detected. Note that the number of the LEDs 211, the number of the PD output values, and the magnitude of temperature should not be limited to the above examples, and can be arbitrarily decided in accordance with the structure and usage of the reflective optical sensor 200.

The basic structure and operation of the reflective optical sensor 200 according to the first embodiment have been described in the above. Further, another embodiment of the reflective optical sensor includes light emitting lenses formed to become conjugated with a light emitter in the moving direction of a moving element in a longer distance from the light emitter than in a vertical direction relative to the moving direction. This is intended for avoiding a variation in detected values caused by fluttering of the moving element as the fixing belt 61. Examples of such a reflective optical sensor and an image forming apparatus including the reflective optical sensor will be described referring to the drawings. Note that the fluttering refers to the meandering and vibrations of the moving element due to receipt of an impact or a shock in motion.

Second Embodiment

The color printer 100 in FIG. 1 can be used for the image forming apparatus according to the second embodiment. The image forming apparatus according to the second embodiment includes a reflective optical sensor 200A shown in FIG. 17 to FIG. 19B. The structure of the reflective optical sensor 200A is the same as that of the reflective optical sensor 200 in FIGS. 6A to 6E and it detects the surface information on the fixing belt 61 in the same manner as the reflective optical sensor 200.

Referring to FIG. 17 to FIG. 19B, the reflective optical sensor 200A includes an light emitting system having the LEDs 211 as light emitters and an array of light emitting lenses 221 provided between the LEDs and the surface portion 61S of the fixing belt 61 and a light receiving system having the PDs 212 as light receivers and a light receiving lens 222 provided between the PDs and the surface portion 61S of the fixing belt 61. It further includes the case 243 formed of the substrate 210 and the side plates 240, 241 and aperture elements 230, 231. A lens element 220 includes the light emitting lens array and the light receiving lens 222. The light emitting lenses 221 are arranged in the same direction as the PDs 212 are arranged.

The light emitting lenses 221 of the reflective optical sensor 200A are anamorphic lenses having different powers in the X and Y-directions. In the second to fourth embodiments the light emitting lenses are formed to become conjugated with the LEDs 211 in the moving direction (Y-direction) of the fixing belt 61 in a longer distance from the LEDs 211 than in a vertical direction (X-direction) relative to the moving direction. Also, the light emitting lenses 221 are formed to become conjugated with the LEDs 211 in the moving direction of a moving element in a longer distance from the LEDs than a distance from the LEDs 211 to the surface of the fixing belt 61 in the vertical direction relative to the moving direction.

Figure 17:
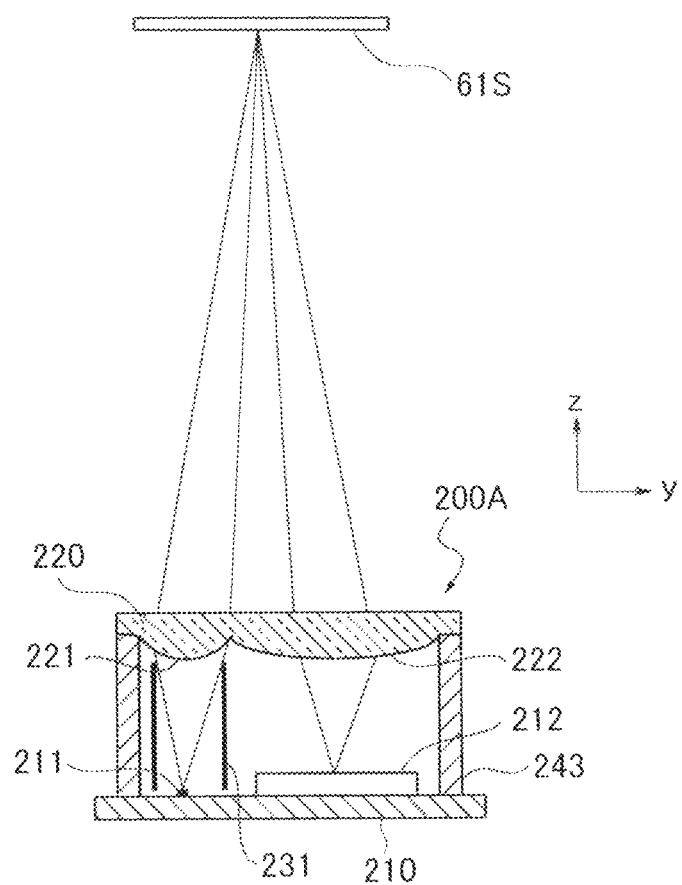
FIG. 17 shows the y-directional optical system of the reflective optical sensor according to a second embodiment.

FIG. 17 shows the optical system of the reflective optical sensor 200A in the Y-direction and the trajectory of light beams emitted from the center of the LED 211 and passing through both ends of an effective area of the light emitting lens 221. The top surface of the LED 211 is conjugated with the surface portion 61S (hereinafter, target surface 61S) in the Y-direction so that the light beams from the LED 211 form an image on the target surface 61S.

The light receiving lens 222 is a cylindrical lens having power only in the Y-direction. The top surfaces of the PDs 212 are conjugated with the target surface 61S in the Y-direction so that the light beams reflected by the target surface 61S form an image on the surfaces of the PDs 212.

Owing to the light receiving lens 222 having no power in the X-direction, it is able to suppress a change in the distribution of light receiving amounts of the PDs 212 in the X-direction caused by a change of the LEDs 211 emitting light. This makes it possible to precisely detect the surface condition of the target surface 61S.

FIGS. 18A, 18B show the trajectories of the light beams when the target surface 61S is inclined clockwise or counterclockwise in a direction. Because of the optical properties of the light emitting lenses 221 and the light receiving lens 222, even when the target surface 61S is inclined in the a direction, the reflected light by the target surface 61S is condensed and incident on the same position of the light receiving surfaces of the PDs 212. That is, a variation in detected values is unlikely to occur irrespective of a change in the angle of the target surface 61S in the a direction. Further, the PD array can be downsized in the Y-direction, leading to reducing the costs of the reflective optical sensor 200A.

Next, FIGS. 19A and 19B show the target surface 61S on a rotational element as the fixing belt 61 wound around the heating roller 62 (FIGS. 1 and 5). When a detected position on the target surface 61S is shifted leftward in FIG. 19A or rightward in FIG. 19B, the angle of reflection by the target surface 61S is changed accordingly. However, the position of the light receiving surface of the PD 212 which the reflected light from the target surface 61S irradiates is almost unchanged. Thus, even if the target surface 61S is set on the rotational element, the detected values are unlikely to vary by an error in the location of the reflective optical sensor 200 in the Y-direction.

Figure 20:
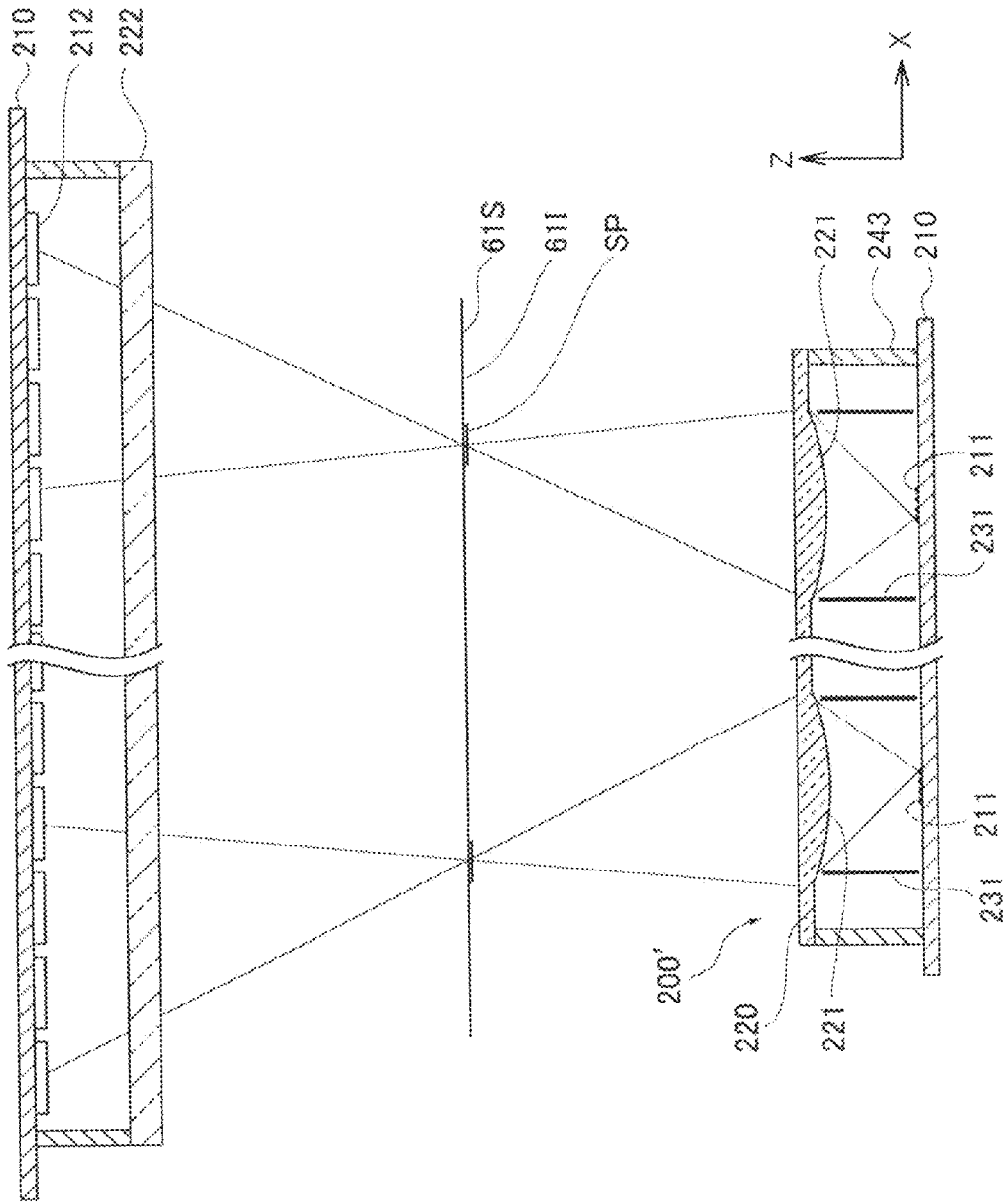
FIG. 20 shows an X-directional optical system of an exemplary reflective optical sensor.
Figure 21:
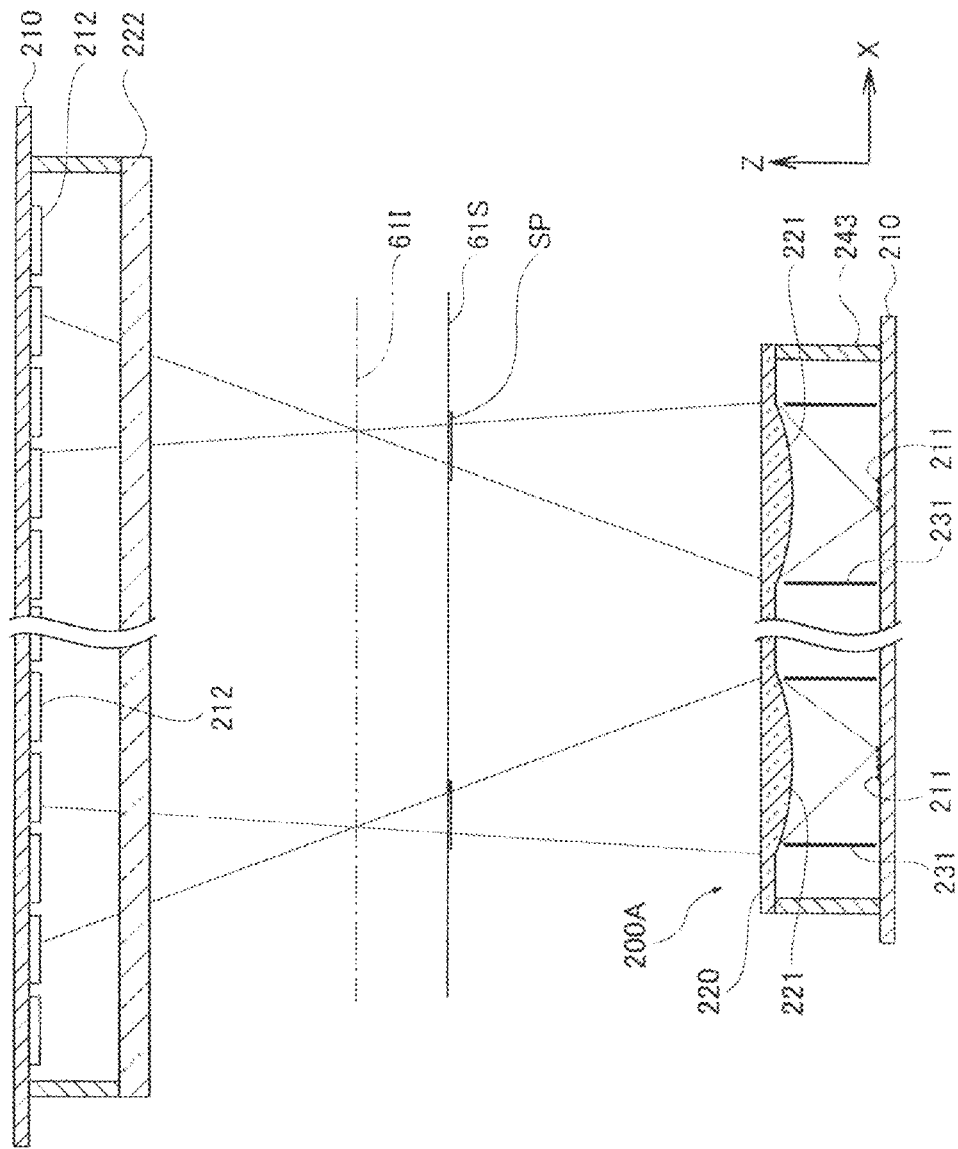
FIG. 21 shows an X-directional optical system of the reflective optical sensor according to the second embodiment.

Next, the optical property of the reflective optical sensor 200A in the X-direction will be described referring to FIGS. 20 and 21. FIG. 20 shows the trajectories of a light beam of a reflective optical sensor 200' for reference. FIG. 21 shows the trajectories of the light beams of the reflective optical sensor 200A according to the second embodiment.

In FIGS. 20 and 21 the light beams are emitted from the centers of the LEDs 211 of the reflective optical sensors 200' and 200A, form both ends of the light spots SP and pass through both ends of effective areas of the light emitting lenses 221. The reference numeral 611 in FIGS. 20 and 21 denotes an imaging plane.

In the reflective optical sensor 200' in FIG. 20 the top surfaces of the LEDs 211 are conjugated with the illuminated portion of the target surface 61S or the imaging plane 611 in the X-direction. Meanwhile, in the reflective optical sensor 200A in FIG. 21 the conjugate point relative to the top surfaces of the LEDs 211 is formed at a position further from the target surface 61S.

As apparent from the drawings, with the same illumination center of the target surface 61S, the light beam from the reflective optical sensor 200A according to the second embodiment is incident on more inside of the light receiving lenses 222 than the light beam from the reflective optical sensor 200'. This means that the PDs 212 located outside the light beam are omissible. Accordingly, with the same robustness maintained, the reflective optical sensor 200A in FIG. 21 can be more downsized in the X-direction than the reflective optical sensor 200' in FIG. 20. Also, the PD array can be downsized in the X-direction. This results in reducing the costs of the reflective optical sensor 200A.

Next, the detection of the reflective optical sensors 200A and 200' when the target surface 61S is inclined will be described with reference to FIG. 22 to FIG. 25. In the drawings an incident light beam and a reflected light beam on/by the target surface 61S are represented by a solid line and a broken line, respectively.

Figure 22:
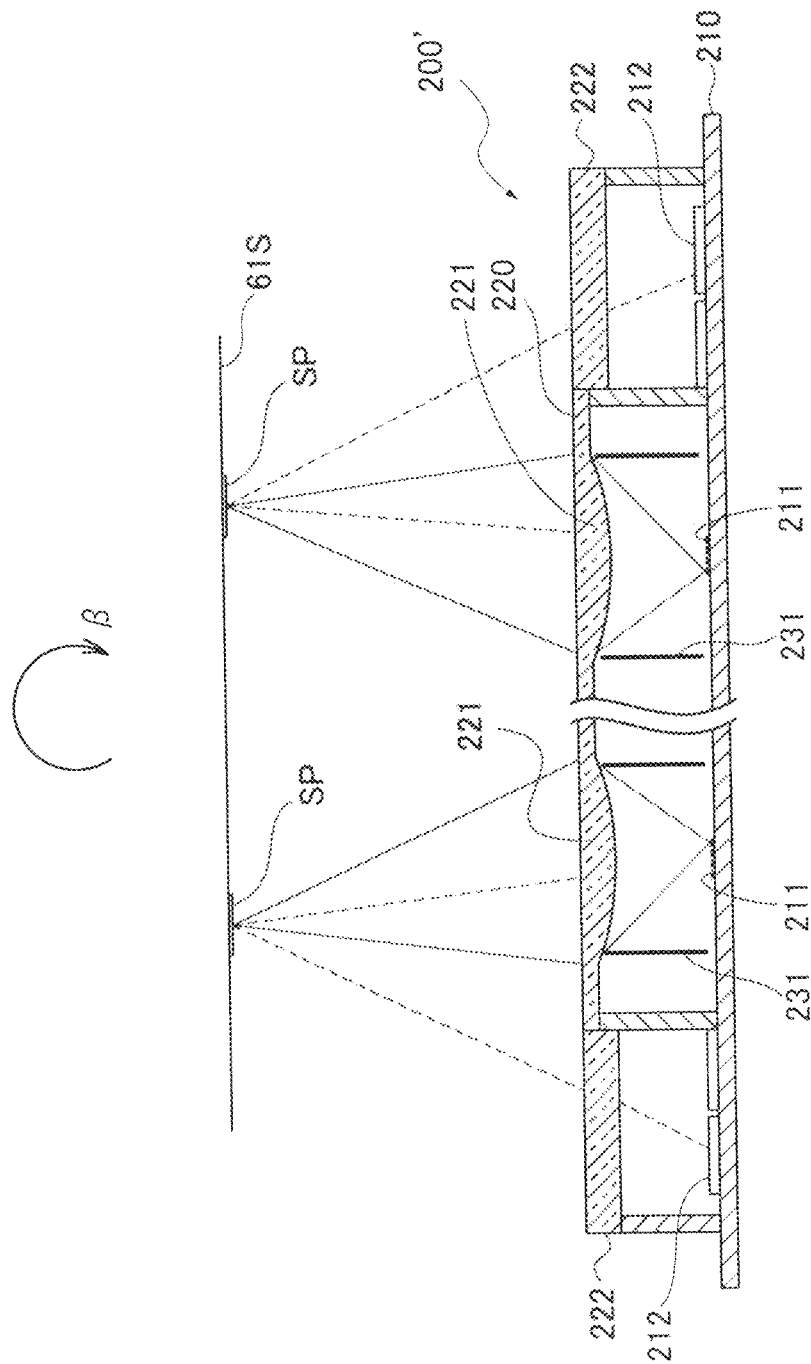
FIG. 22 shows a trajectory of a light beam from the exemplary reflective optical sensor when a target surface is not inclined.
Figure 23:
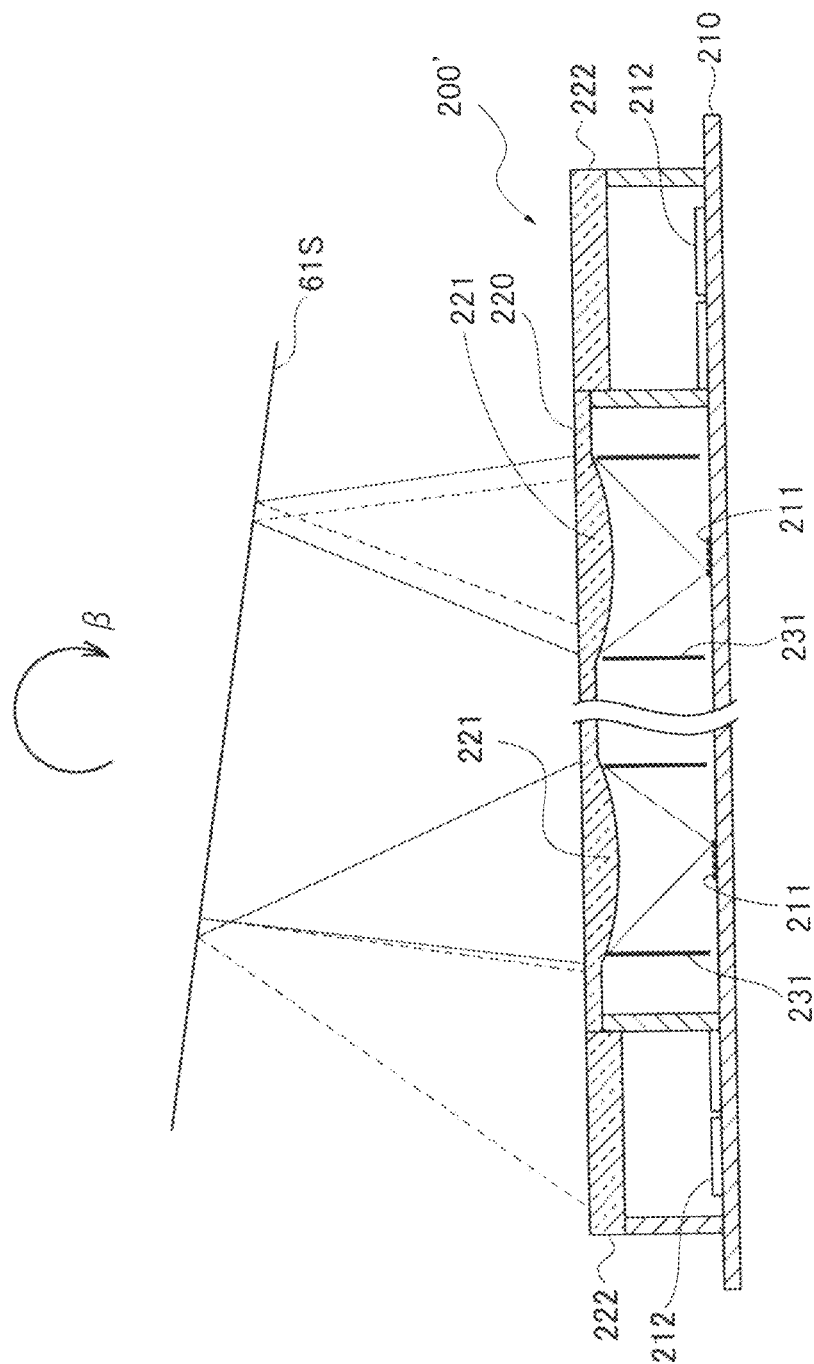
FIG. 23 shows a trajectory of a light beam from the exemplary reflective optical sensor when a target surface is inclined in β-direction.

FIG. 22 shows the trajectories of the light beams from the reflective optical sensor 200' when the target surface 61S is not inclined. FIG. 23 shows the same when the target surface 61S is rotated in β direction around the center of the light spots SP illuminating the target surface 61S.

Likewise, FIGS. 24 and 25 show the trajectories of the light beams from the reflective optical sensor 200A when the target surface 61S is not inclined and when it is inclined in β direction, respectively.

As seen from FIG. 22 to FIG. 25, with the target surface 61S inclined in the β direction, the reflected light by the inclined target surface is incident on more inside of the light receiving lens 222 of the reflective optical sensor 200A than that 222 of the reflective optical sensor 200'. Thus, even with a change in the angle of the target surface 61S in the β direction, the detected value of the reflective optical sensor 200A is unlikely to vary.

Parameters of the optical system of the reflective optical sensor 200A according to the second embodiment are specifically described as follows.

Parameters of the Light Emitting Lenses 221
Curvature radius in X-direction: 4.72
Conic constant in X-direction: −1.6
Curvature radius in Y-direction: 4.49
Conic constant Y-direction: −1.75
Lens diameter in X-direction: 2.4 mm
Lens diameter in Y-direction: 8.0 mm
Lens thickness: 6.57 mm
Number of lenses: five
Parameters of the Light Receiving Lenses 222
Curvature radius in X-direction: ∞
Conic constant in X-direction: 0
Curvature radius in Y-direction: 4.83
Conic constant in Y-direction: −1.65
Lens diameter in X-direction: 16.8 mm
Lens diameter in Y-direction: 10.5 mm
Lens thickness: 7.07 mm Distances Distance between the light emitting lenses 221 and the light receiving lenses 222 in Y-direction: 2.2 mm Distance between the top surfaces of the LEDs 211 and the light emitting lenses 221: 10.31 mm Distance between the LEDs 211 and the light receiving lens 222: 9.81 mm Distance from the flat surface of the lens element 220 to the target surface 61S: 50 mm Conjugate point of the light emitting lenses 221 relative to the top surfaces of the LEDs 211 in X-direction: at position 3.7 mm further from the target surface 61S As described above, according to the reflective optical sensor 200A the light emitting lenses 211 are formed to become conjugated with the LEDs 211 in the moving direction of the fixing belt 61 in a longer distance from the LEDs 211 than in the vertical direction relative to the moving direction. Also, the light emitting lenses 221 are formed to become conjugated with the LEDs 211 in a longer distance from the LEDs than the distance from the LEDs 211 to the surface of the fixing belt 61 in the vertical direction relative to the moving direction. By this configuration, it is able to improve the robustness of the reflective optical sensor 200A and precisely detect the surface condition of a moving element by reducing a variation in the detected value caused by the fluttering of the fixing belt 61.

Figure 26A:
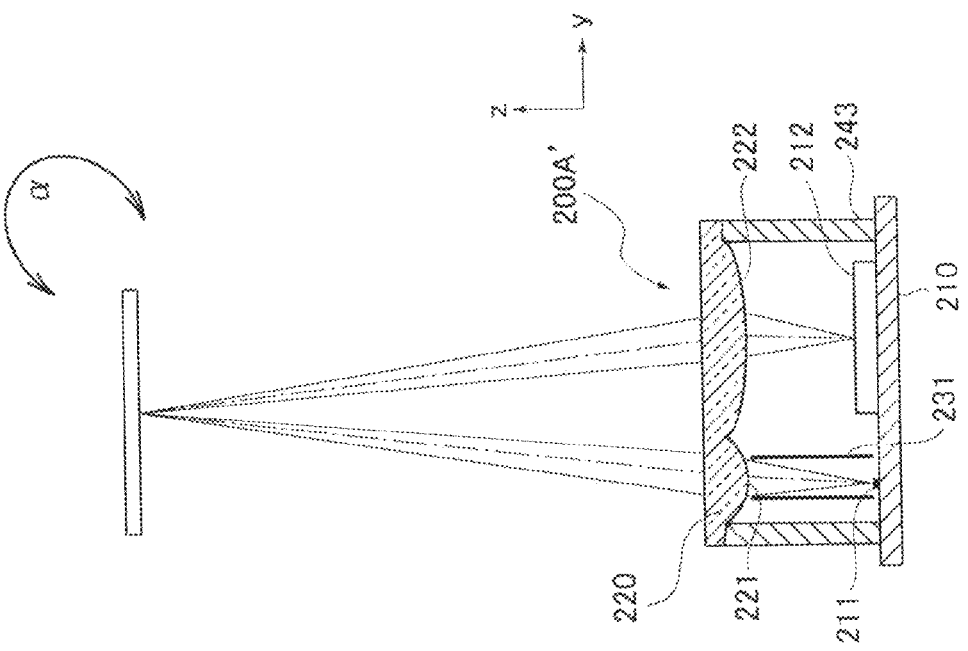
FIGS. 26A and 26B show the trajectories of principal rays from the reflective optical sensors according to the second and third embodiments, respectively, when the principal rays emitted from the centers of LEDs are reflected by the target surfaces and pass through a light receiving lens.
Figure 26B:
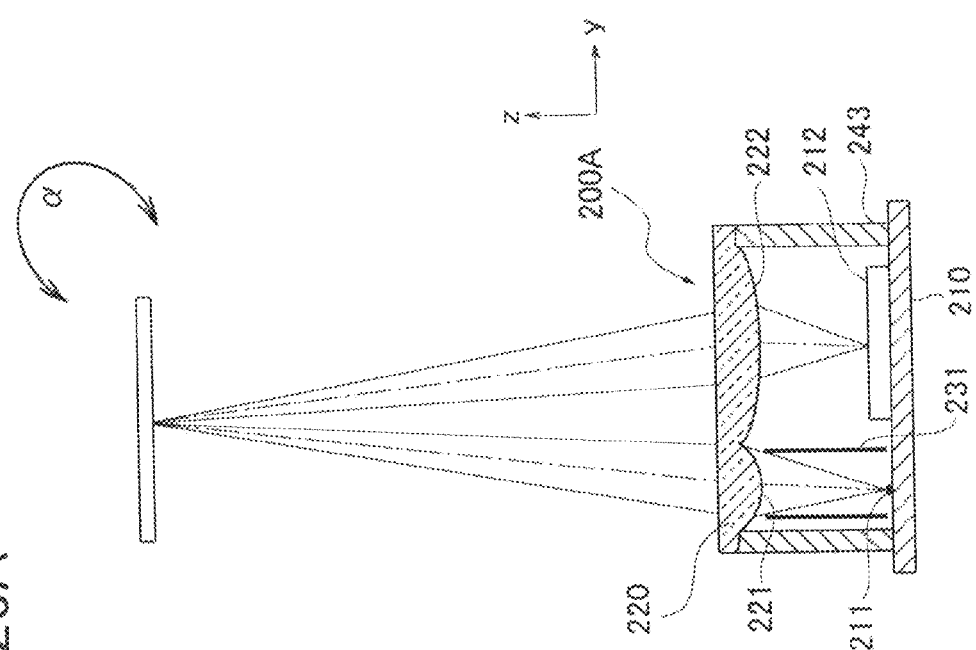

FIG. 26A shows the reflective optical sensor in which a principal ray reflected by the fixing belt 61 passes through the center of the effective diameter area in the vertical direction (Y-direction) relative to the direction in which the PD 212 and the light receiving lens 222 are arranged. FIG. 26B shows a modification of the reflective optical sensor 200A, that is, a reflective optical sensor 200A' including a light emitting lens with a different effective diameter. For a principal ray passing the center of the light receiving lens 222 as shown in FIGS. 26A and 26B, it is able to effectively reduce a variation in the detected values caused by a postural change in the target surface in the α-direction. Accordingly, the robustness of the reflective optical sensor 200A' can be enhanced, leading to precisely detecting the PD output. Note that in FIG. 26B the angular range of the reflected light from the target surface 61S is narrowed so that a variation in the detected values caused by a postural change of the target surface in the α-direction can be further effectively reduced.

Furthermore, in the reflective optical sensor 200A according to the second embodiment the effective diameter of the light receiving lens 222 in the Y-direction vertical to the PD array is set to be larger than that of the light emitting lens 221 in the Y-direction. This can improve the robustness of the reflective optical sensor 200A and accurately detect the PD output.

Further, the reflective optical sensor 200A includes the LEDs 211 configured to emit the light spots SP on the surface of the moving element at different positions in the direction crossing the moving direction of the moving element (X-direction vertical to the moving direction in the second embodiment). This can elongate the detection area A, eliminate the necessity to accurately position the reflective optical sensor relative to the width ends of the paper S, and accurately detect the surface condition of the moving element.

Further, the reflective optical sensor 200A is placed such that the vertical direction to the arrangement of the light emitting lenses 221 matches the moving direction (Y-direction) of the fixing belt 61. This makes it possible to precisely detect the surface condition of the fixing belt 61.

Further, by including the reflective optical sensor 200A, it is able to provide an image forming apparatus which can precisely detect the surface condition of the fixing belt 61 and offer excellent image quality.

Further, as shown in FIG. 5, the reflective optical sensor 200 is placed at or in the vicinity of the ends of the paper S carried on the fixing belt 61, to be able to accurately detect the level of a scratch on the portion of the fixing belt 61 that the ends of the paper S pass. This can contribute to improving the image quality of the image forming apparatus. This also makes it possible to quickly and precisely know the occurrence of a scratch on the fixing belt 61 by detecting the surface condition of the moving, endless fixing belt 61 which is easily damaged.

Third Embodiment

An image forming apparatus including a reflective optical sensor according to a third embodiment will be described with reference to FIGS. 27 and 28. The image forming apparatus in the present embodiment is basically structured same as that in the second embodiment. The reflective optical sensor is the same as the reflective optical sensor 200A in the second embodiment except for the configuration that two neighboring LEDs 211 concurrently emit light for the detection of the surface information.

Figure 27:
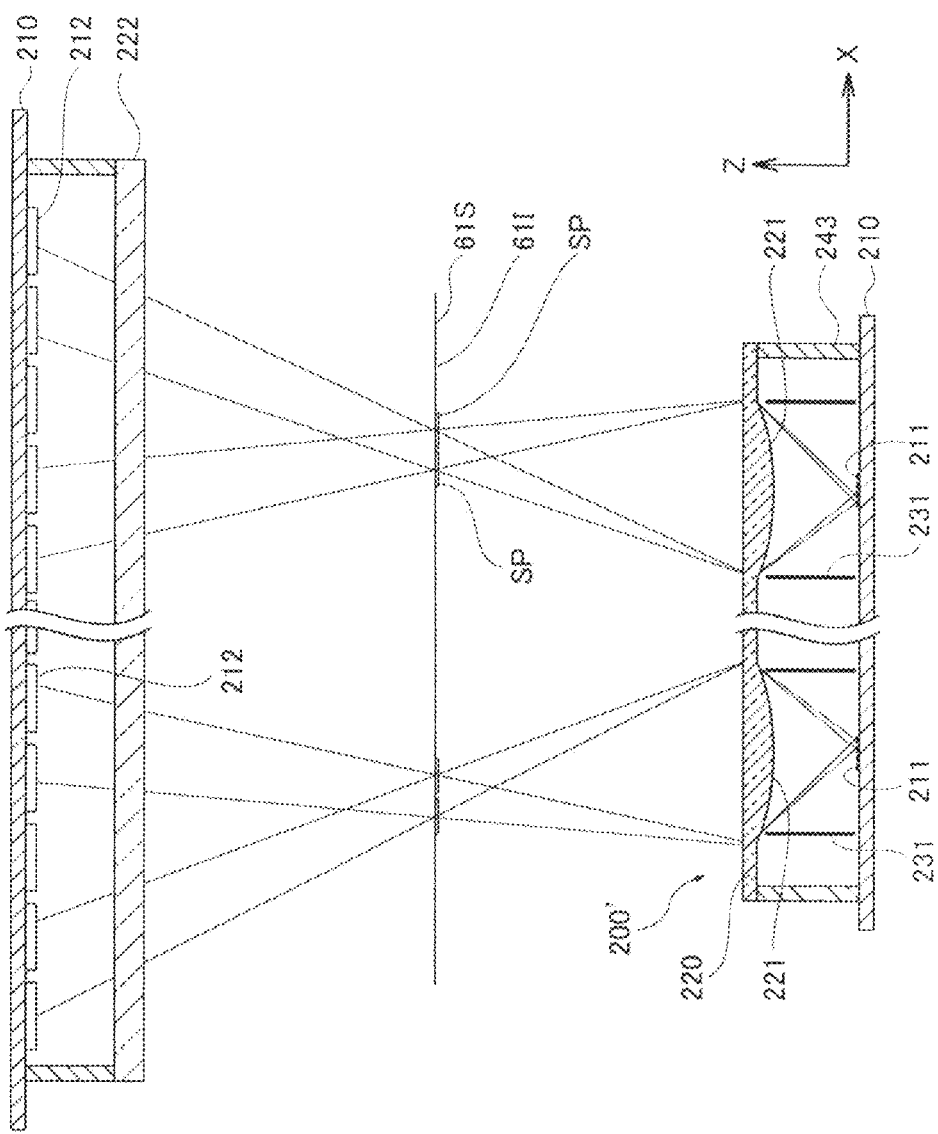

FIG. 27 shows the trajectories of the light beams from the reflective optical sensor 200' as a reference. FIG. 28 shows the trajectories of the light beams from the reflective optical sensor 200A in the third embodiment. The reflective optical sensors 200' and 200A time-divisionally emit light beams in array form and form light spots SP. In FIGS. 27 and 28 two neighboring LEDs 211 are controlled to concurrently emit light and form respective light spots SP.

In FIG. 27 the top surfaces of the LEDs 211 are conjugated with the illuminated portion (imaging plane 611) of the target surface 61S in the X-direction. As seen from the drawing, the light beams concurrently emitted from the two neighboring LEDs 211 form two separate light spots SP on the target surface 61S. Because of this, it is difficult to detect the surface condition of the gap between the light spots SP on the target surface 61S.

Figure 28:
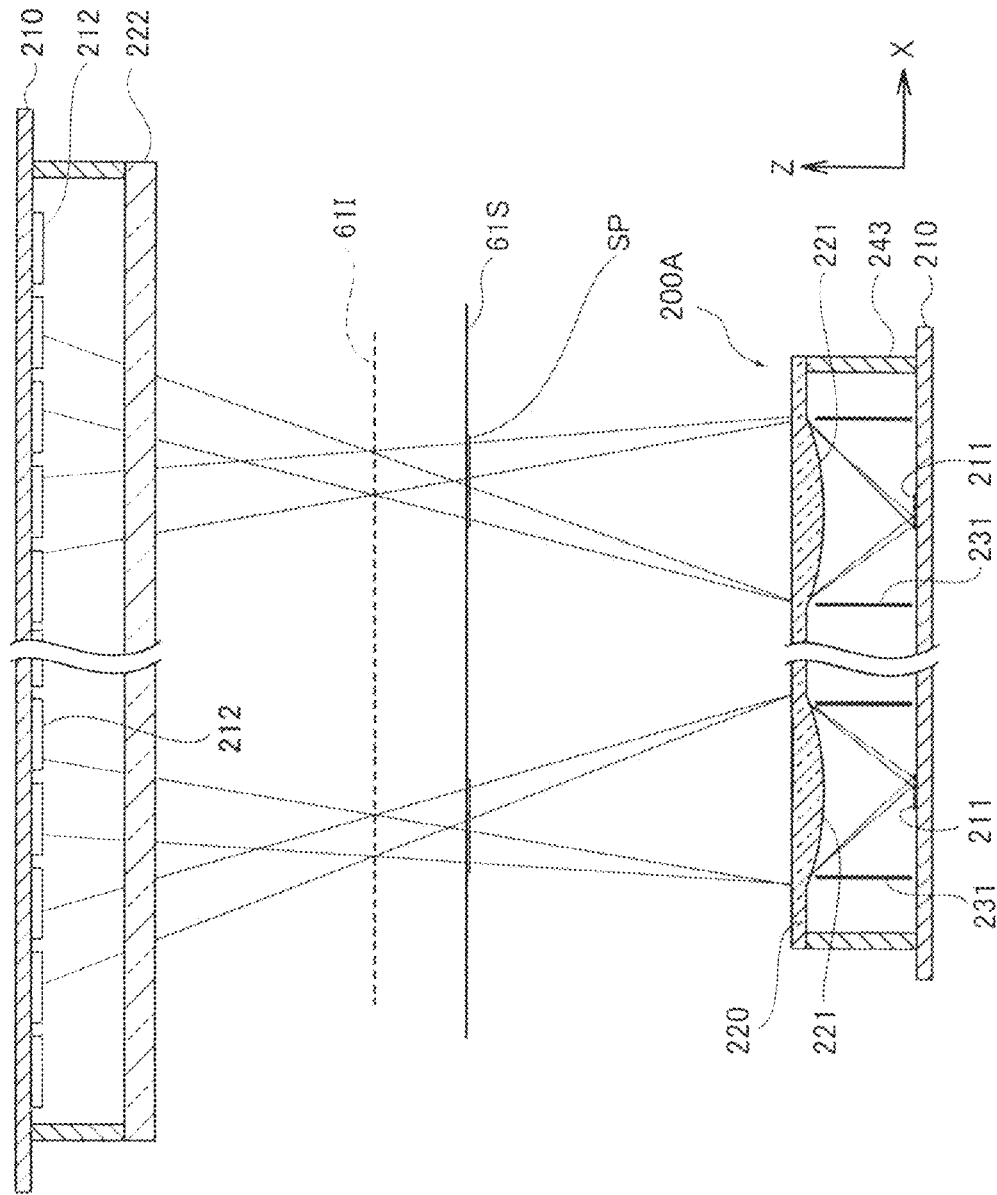

Meanwhile, in the reflective optical sensor 200A according to the third embodiment of FIG. 28 the conjugate point relative to the top surfaces of the LEDs 211 is further from the target surface 61S in the X-direction. Because of this, the light beams concurrently emitted from the neighboring LEDs 211 overlap with each other and forms a single light spot SP on the target surface 61S. Accordingly, it is able to detect the surface condition of the area of this light spot SP on the target surface 61S. The reflective optical sensor 200A according to the third embodiment can also precisely detect the surface condition of the fixing belt 61.

Fourth Embodiment

An image forming apparatus including a reflective optical sensor according to a fourth embodiment will be described with reference to FIGS. 29A and 29B. The image forming apparatus in the present embodiment is basically structured same as that in the second embodiment. A reflective optical sensor 200B is the same as the reflective optical sensor 200A in the second embodiment except for the LED array arranged in two rows in the Y-direction in place of the one arranged in the X-direction. Two neighboring LEDs 211 in the Y-direction concurrently emit light for the detection of the surface information.

Figure 29A:
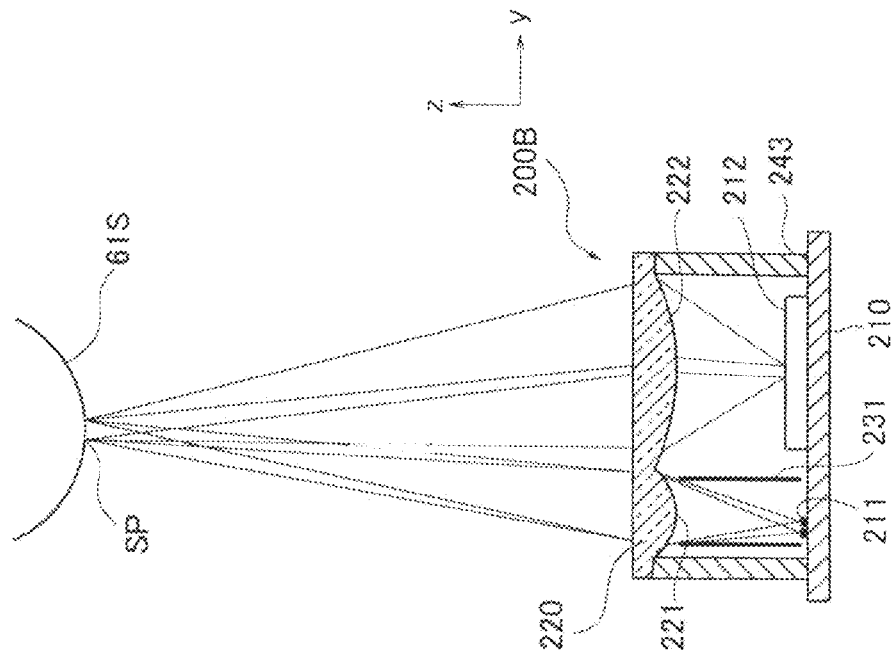
Figure 29B:
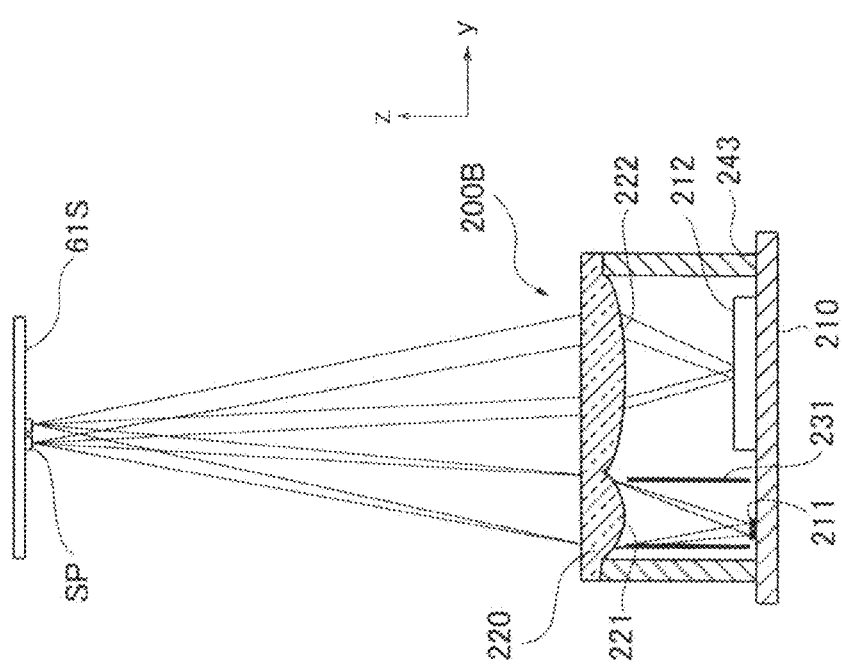

FIGS. 29A, 29B show the trajectories of the light beams from the centers of the LEDs 211 passing both ends of the effective area of the light emitting lenses 221 in the Y-direction when the two LEDs of the reflective optical sensor 200B emit light simultaneously. In FIG. 29A the target surface 61S is a flat surface. In FIG. 29B the target surface 61S is a curved surface such as the fixing belt 61 wound around the heating roller 62.

Since the top surfaces of the LEDs 211 and the target surface 61S are conjugated with each other as shown in FIGS. 29A, 29B, the light spots SP are separated from each other on the target surface 61S. However, the separated light spots SP in the Y-direction do not matter in detecting a linear scratch on the target surface 61S moving in the Y-direction. Accordingly, the reflective optical sensor 200B according to the fourth embodiment is able to accurately detect the surface condition.

Next, a relationship between the shapes of the LEDs 211 simultaneously emitting light and the shape of the light spots SP formed on the target surface 61S in the reflective optical sensors 200A and 200B of the third and fourth embodiments is described referring to FIGS. 30A to 30F.

Figure 30A:
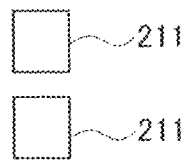
FIG. 30A shows the shape of two LEDs arranged in the Y-direction.
Figure 30B:
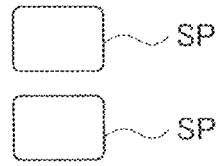
FIG. 30B shows the shape of light spots from the two LEDs in FIG. 30A.
Figure 30C:
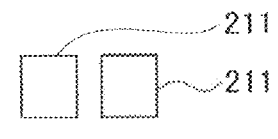
FIG. 30C shows the shape of two LEDs arranged in the X-direction.
Figure 30D:
FIG. 30D shows the shape of light spots from the two LEDs in FIG. 30C.
Figure 30E:
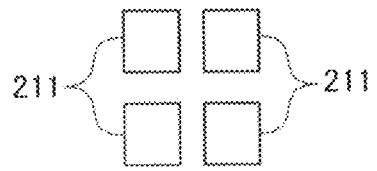
FIG. 30E shows the shape of two adjacent LEDs in the X and Y directions.
Figure 30F:
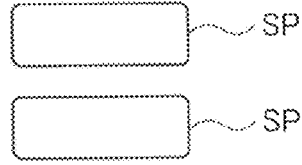
FIG. 30F shows the shape of light spots from the two LEDs in FIG. 30E.

FIGS. 30A, 30C, 30E show that the shapes of the LEDs 211 or the light emitting areas are separated. FIGS. 30B, 30D, 30F show the shapes of the light spots SP formed on the target surface 61S by the LEDs 211 in the FIGS. 30A, 30C, and 30E.

In FIG. 30A the two LEDs 211 are arranged in the Y-direction, simultaneously emit light beams, and form two light spots SP side by side on the target surface 61S in FIG. 30B, as in the fourth embodiment. For detecting a moving element moving in the Y-direction, separation of the light spots in the Y-direction does not matter, and doubled areas are detectable at the same time. This doubles the light amount detected, resulting in improving SN ratio and the accuracy of the detection.

In FIG. 30C the two LEDs 211 are arranged in the X-direction, emit light beams simultaneously, and form a single light spot SP on the target surface 61S in FIG. 30D since the light beams overlap each other, as in the third embodiment. To form light spots SP in a desired shape, the shape and interval of the LEDs 211 simultaneously emitting and the conjugate point relative to the top surfaces of the LEDs 211 in the X-direction have to be adjusted. Also, in this case the light amount detected is increased, improving SN ratio and the accuracy of the detection.

FIGS. 30E, 30F show an example of arranging two LEDs 211 in both the X and Y-directions to emit light spots SP at the same time by use of the reflective optical sensor 200B. As shown in FIG. 30F, the light spots SP emitted from the neighboring LEDs 211 in the X-direction overlap each other on the target surface 61S, however, the light spots SP emitted from the neighboring LEDs 211 in the Y-direction are separated.

Figure 31:
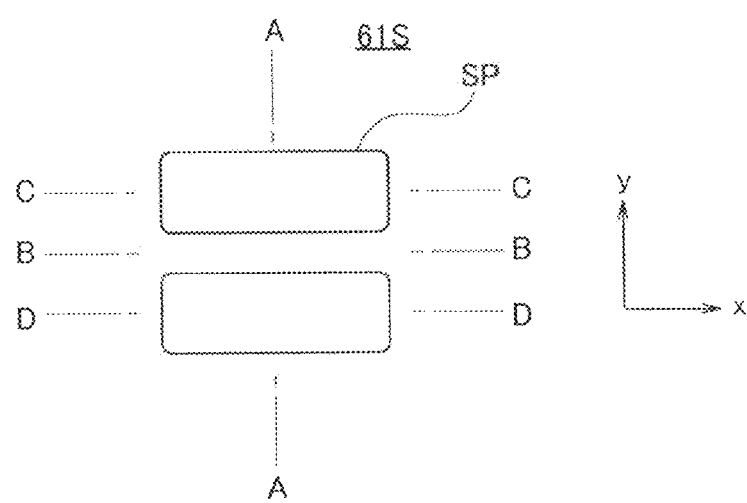
FIG. 31 shows the positions at which the intensity of light spots is measured.
Figure 32A:
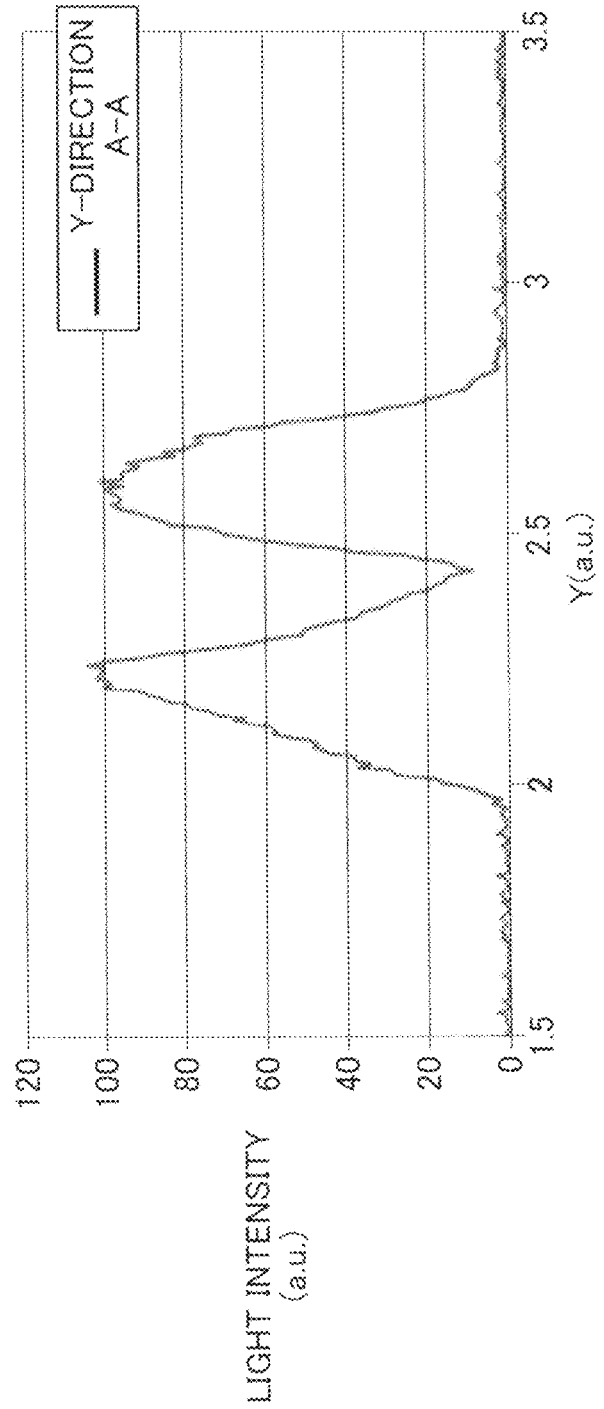
FIG. 32A is a graph showing the intensity of light spots measured along the A to A cross section in FIG. 31.
Figure 32B:
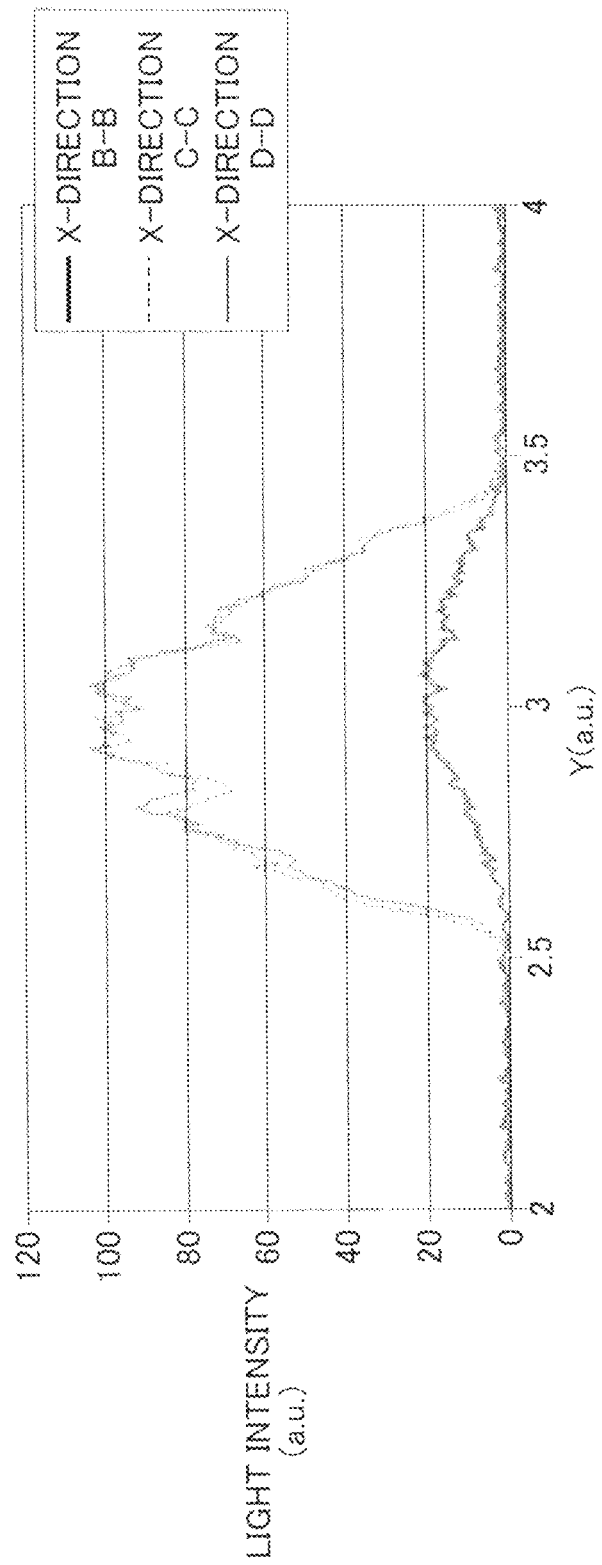
FIG. 32B is a graph showing the intensity of light spots measured along the B to B and C to C, and D to D cross sections in FIG. 31.

The light beams were actually emitted from the four separated LEDs 211 in FIG. 30E simultaneously to measure the intensities of the light spots SP on the cross sections of the target surface 61S shown in FIG. 31. FIGS. 32A and 32B are graphs showing the measured intensities of the light spots SP on the cross sections along A to A line, B to B line, C to C line, and D to D line of FIG. 31.

In FIG. 32A the light spots SP on the A to A cross section measured in the Y-direction are divided into two approximately. Meanwhile, on the C to C, B to B, and D to D cross sections in the X-direction, the lights spots from the LEDs 211 at the right and left ends overlap each other on the target surface 61S and become a single light spot SP, as seen from FIG. 32B. This accordingly increases the amount of light detected and improves S/N ratio and the accuracy of the detection.

The reflective optical sensors 200A and 200B according to the third and fourth embodiments can irradiate the target surface 61S with the light spots suitable for detecting the surface condition of a moving element moving in the Y-direction. The area of the light spots SP is increased by controlling the LEDs 211 to emit light simultaneously. This is because simultaneous light emission from the small-size LEDs 211 is larger in amount than light emission of one large-size LED 211.

As described above, the reflective optical sensors 200A and 200B according to the third and fourth embodiments can also improve robustness, suppress a variation in the detected values due to the fluttering of the fixing belt 61, and precisely detect the surface condition of the moving element. Moreover, by controlling adjacent LEDs 211 to concurrently emit light, it is made possible to increase the light amount of light spots, improve S/N ratio, and accurately detect the surface condition. Further, the high image-quality image forming apparatus including the reflective optical sensor 200A or 200B can be provided.

Fifth Embodiment

Figure 33:
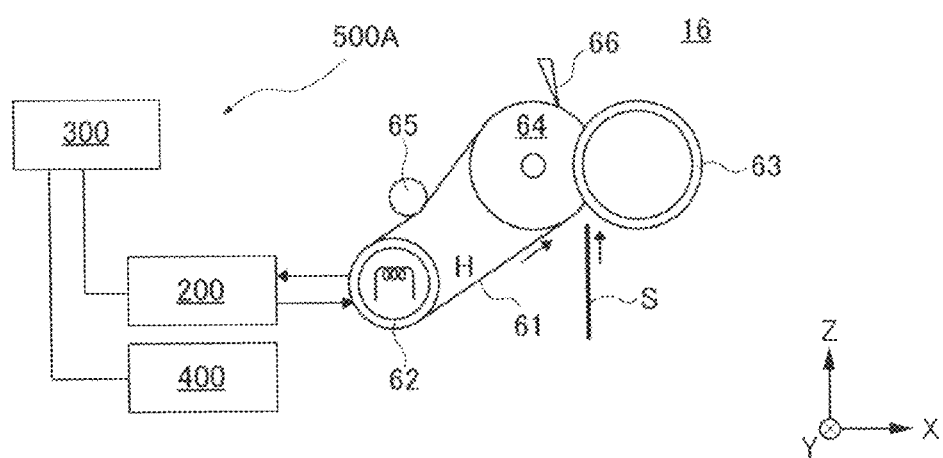
FIG. 33 schematically shows a fixing unit of an image forming apparatus according to a sixth embodiment of the present invention.

Now, a fifth embodiment of the present invention will be described. FIG. 33 shows the fixing unit 16 of the present embodiment which includes a surface condition controller 500A. Hereinafter, detection of the surface information on a linear scratch on the fixing belt 61 will be described.

Figure 34:
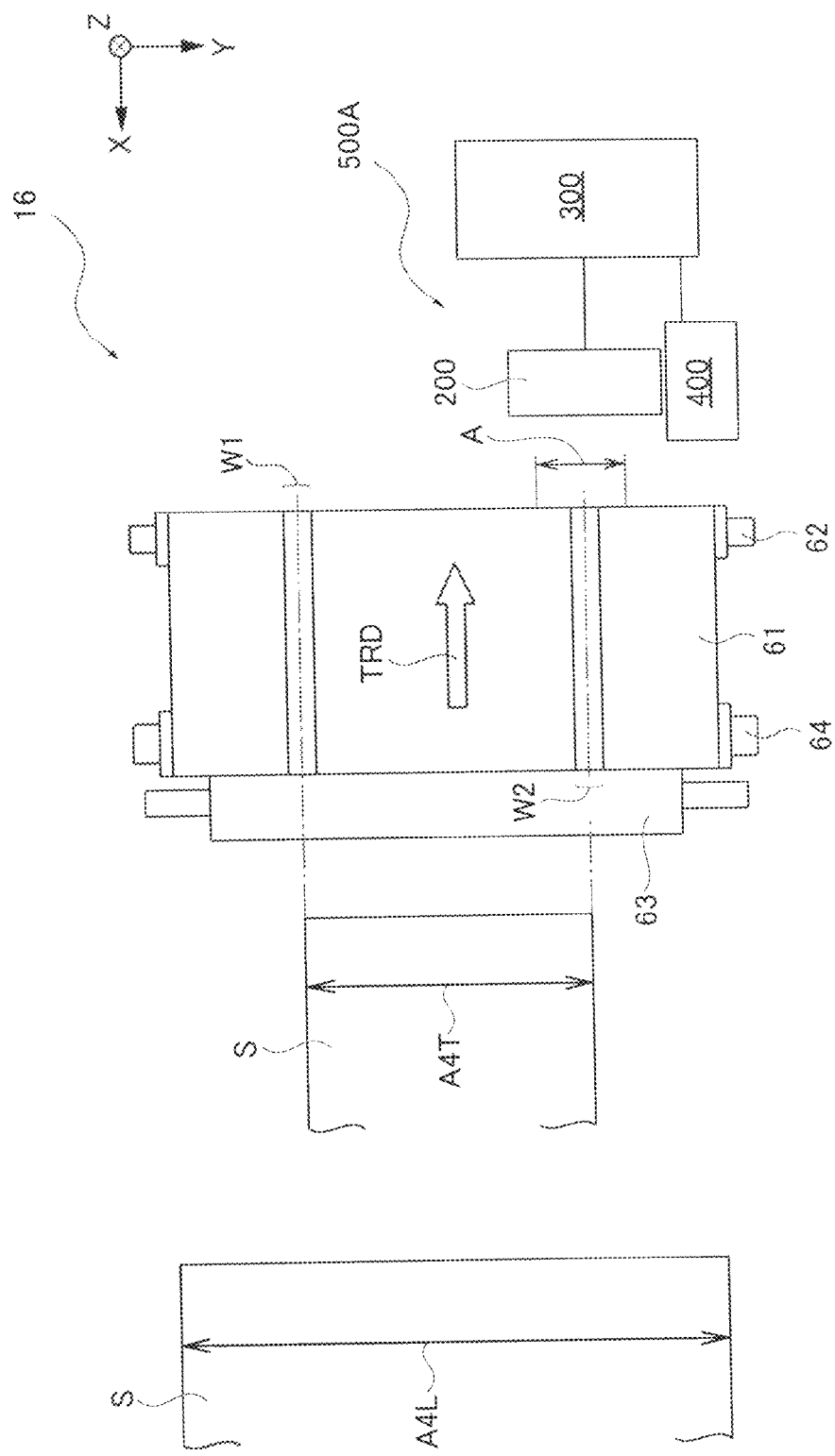
FIG. 34 shows the fixing of the fixing unit in FIG. 33.

FIG. 34 shows the fixing of the fixing unit 16. In the drawing a color toner image is transferred onto the paper S.

The papers S of A4 size are used and can be carried in longitudinal and width directions. The code A4T denotes the width of the paper S carried in the longitudinal direction and the code A4L is the width of the same carried in the width direction.

The width A4L is approximately equal to the width of the fixing belt 61, therefore, linear scratches at the width ends do not practically matter when the paper S is carried in the width direction.

Meanwhile, the width A4T is shorter than the width of the fixing belt 61, and linear scratches occur inside the width A4L, which may cause unevenness in the fixed toner image on the paper S.

In FIG. 34 the codes W1 and W2 indicate offset widths of width ends of the A4 size paper S relative to the fixing belt 61 in the Y-direction corresponding to the main scanning direction when the papers S are carried in the longitudinal direction.

That is, the papers S cannot be carried at the same location relative to the fixing belt 61 in the main scanning direction. The locations in which the width ends of the papers S pass slightly differ or vary in the main scanning direction.

Further, when the fixing belt 61 is deflected, the surface of the fixing belt 61 shifts or varies relative to the paper S in the main scanning direction.

The offset widths W1 and W2 are set with such a shift taken into account.

With a narrow offset width set on a contact location of the fixing belt 61 with the paper S, linear scratches occur in a narrow area. In view of this, the carrying position in the main scanning direction can be intentionally shifted for each paper.

In this case the offset widths W1, W2 have to be also considered. The largest offset widths are about 10 mm.

Thus, for detecting a linear scratch on the A4 size paper S carried in the longitudinal direction as surface information, the detection area of the reflective optical sensor 200 in the main scanning direction needs to be larger than the offset widths W1 and W2.

The detection area A of the reflective optical sensor 200 in the main scanning direction is set to include the offset width W2 but not the offset width W1 in FIG. 34. This is because linear scratches are considered to similarly occur in the offset width areas W1, W2 so that detection only in one of the offset widths should be sufficient.

Alternatively, the detection area can be set for each of the offset widths W1 and W2 or can be set to be the entire width of the fixing belt 61.

In view of the above, the reflective optical sensor 200 is configured to emit a number of light beams in time series in the main scanning direction to a surface portion 61S of the detection area A of the fixing belt 61, for example.

Figure 35A:
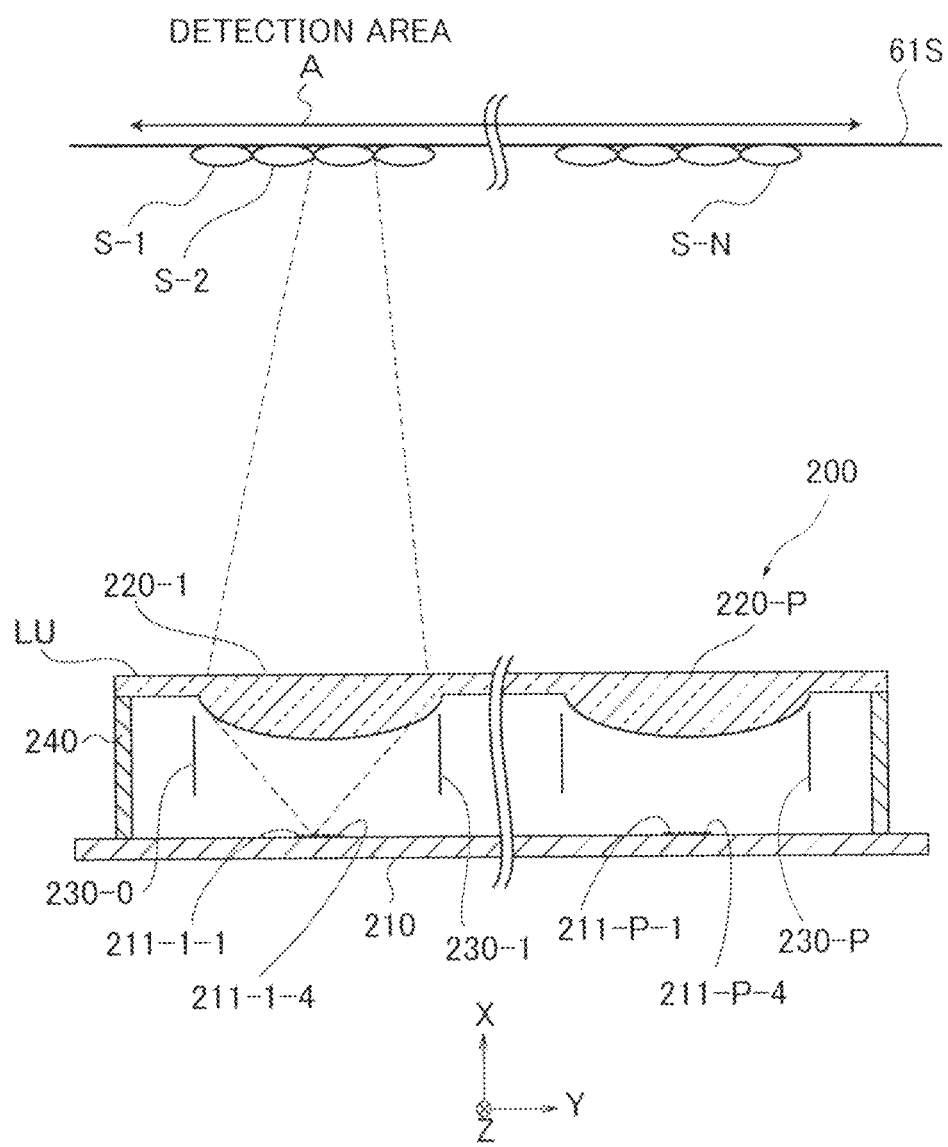
FIGS. 35A and 35B show another example of a reflective optical sensor.
Figure 35B:
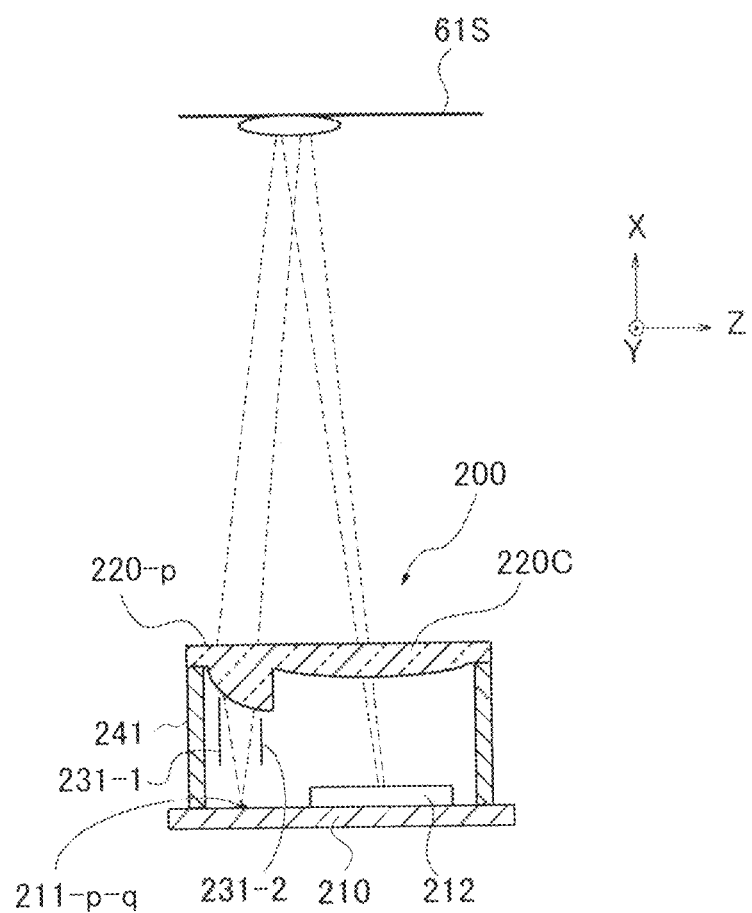
Figure 36:
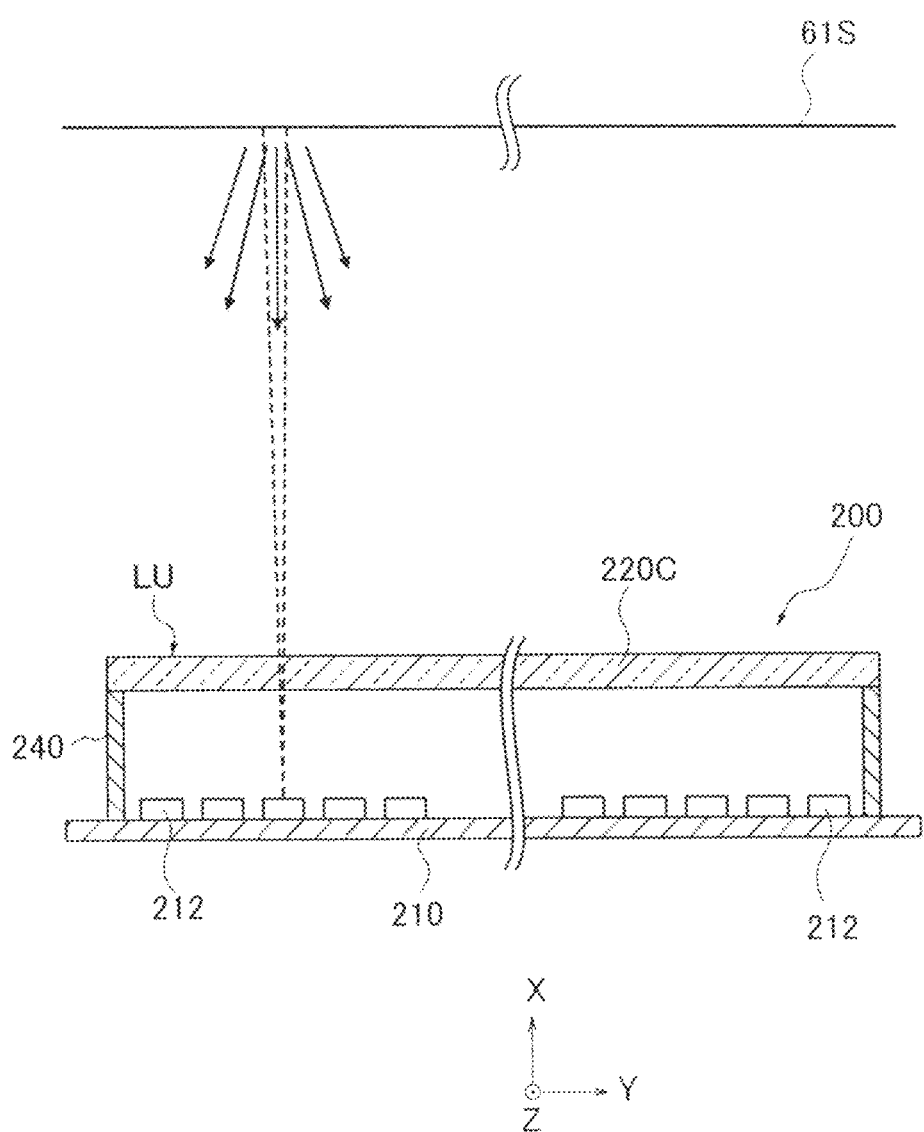
FIG. 36 shows the operation of the reflective optical sensor.

The reflective optical sensor 200 is described next. FIG. 35A is an XY cross section of the reflective optical sensor 200. FIG. 35B is an XY cross section of a light emitting system of the reflective optical sensor 200. FIG. 36 is another XY cross section of the reflective optical sensor 200.

The reflective optical sensor 200 includes a number (for example, P) of LED arrays including a number (for example, 4) of LEDs 211 arranged along Y-axis or in the main scanning direction, a lens unit LU, PDs 212, and aperture element on the substrate 210, for example, referring to FIG. 35A to FIG. 36.

From the left side or the first one in the X-direction in FIG. 35A, every four LED 211 are grouped to p arrays (p=1 to P where P is a total number of arrays) and given a number q (q=1 to 4) in order. The LED 211 of a q-th of an array p from the left side is represented by LED 211-$p$-$q$. Thus, an LED 211-1-1, an LED 211-1-2, an LED 211-1-3, an LED 211-1-4, an LED 211-2-1, ..., an LED 211-2-4, ..., an LED 211-$p$-$q$, ..., an LED 211-P-1, an LED 211-P-2, an LED 211-P-3, and an LED 211-P-4 are arranged in order. The total number N of the LEDs 211 is N=4P.

The lens unit LU includes a lens array including a number (P, for example) of light emitting lenses 220 and a light receiving lens 220C.

The lens array LA and the light receiving lens 220C are integrally formed by resin molding, for instance.

The light emitting lenses 220 are placed on the optical paths of the LED arrays, respectively. Specifically, the light emitting lenses are arranged on the substrate 210 to face the LEDs 211 with equal intervals in the Y-direction. The optical axis of each of the light emitting lenses 220 is located between the LEDs 211-$p$-2 and 211-$p$-3 of the corresponding LED array. That is, the LEDs 211-$p$-2 and 211-$p$-3 are located on the −Y side of the optical axis of the corresponding light emitting lens 220. P light emitting lenses are indicated by 220-1, 220-2, ..., 220-$p$, ..., 220-(P−1), 220-P from −Y side.

The light emitted from each LED 211 of each LED array is condensed by the corresponding light emitting lens 220 and illuminates the surface portion 61S of the fixing belt 61. Thus, N light spots Si to SN (N=4P) are formed on the surface portion 61S in the Y-direction, referring to FIG. 35A.

Thus, the LED arrays and the corresponding light emitting lenses 220 form light emitting systems to illuminate the fixing belt 61. That is, the reflective optical sensor 200 emits light from a number (P, for example) of light emitting systems to the fixing belt 61.

The light receiving lens 220C is placed on the optical path of reflected light by the surface portion 61S of the fixing belt 61 from each light emitting system, referring to FIG. 36. In the present embodiment the light receiving lens 220C is a single cylindrical lens and placed on the Z side of the lens array and the X side of the substrate 210 (FIG. 35B). The light receiving lens 220C has positive power only along the Z axis.

Figure 37:
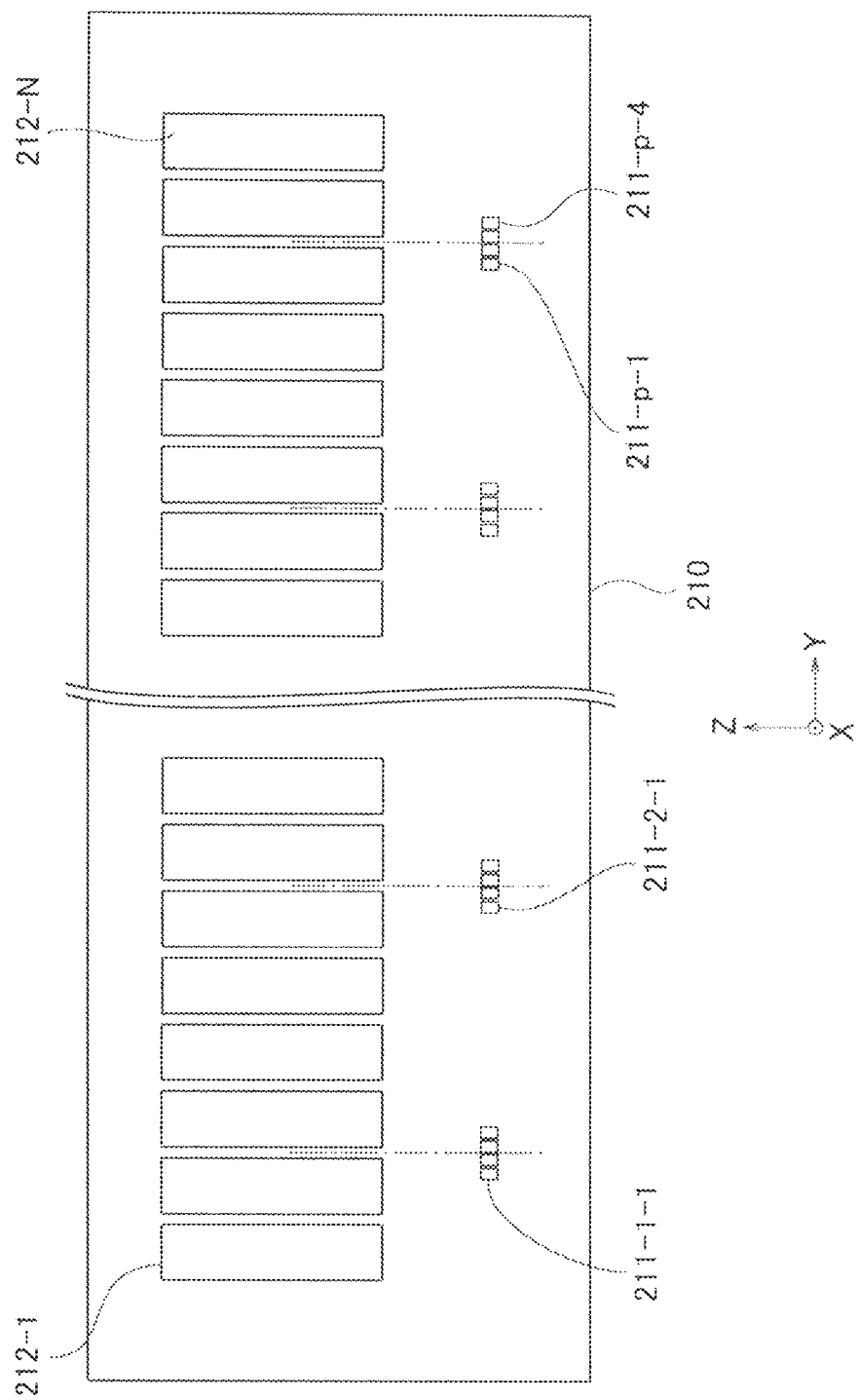
FIG. 37 shows the operation of the reflective optical sensor.

The N PDs 212 are arranged with equal intervals in the Y-direction on the +Z side of the LEDs 211, referring to FIG. 37. Specifically, the N PDs 212 correspond to the N LEDs 211 and are arranged on the optical paths of reflected light by the surface portion 61S of the fixing belt 61 via the light receiving lens 220C. In FIGS. 36 and 37 the N PDs 212 are indicated by the reference numerals 212-1, 212-2, ..., 212-(N−1), 212-N. The n-th PD 212 from the −Y side is represented by PD 212-$n$. In the present embodiment n=4 (p−1)+q holds true.

The N PDs 212 and the light receiving lens 220C form light receiving systems to receive light emitted from each light emitting system and reflected by the fixing belt 61. That is, the reflective optical sensor 200 receives the reflected light by the fixing belt 61 with the light receiving system.

Referring to FIG. 35A, the aperture elements 230-0, 230-1, ..., 230-$p$, ..., 230-N parallel to an XZ plane is provided to prevent flares between two neighboring light emitting systems in the Y-direction.

Also, referring to FIG. 35B, the aperture elements 231-0 and 231-1 parallel to an XY plane is provided to prevent flares between LED 211-$n$ and the PD 212-$n$.

Figure 38:
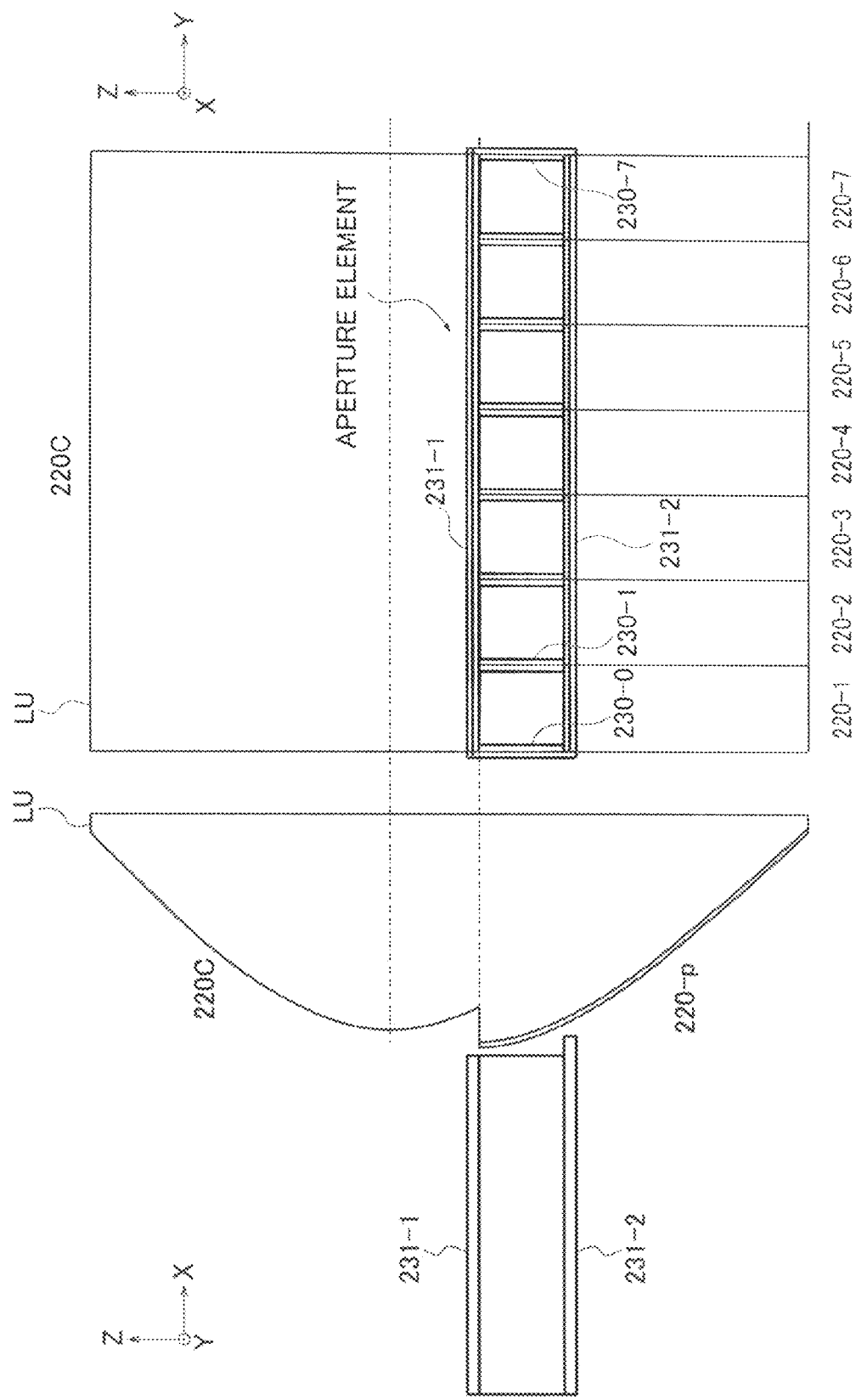
FIG. 38 shows an aperture element of the reflective optical sensor.

FIGS. 38A and 38B show an aperture element integrally formed by eight aperture elements 230-0 to 230-7 and two aperture elements 231-1 and 231-2 when p=7 by way of example.

As shown in FIG. 38B, the 8 aperture elements 230-0 to 230-7 are arranged in the Y-direction and supported between the two aperture elements 231-1 and 231-2 opposing in the Z-direction. Thus, the aperture element includes seven aperture elements arranged in the Y-direction corresponding to the seven light emitting systems. In other words each aperture element is positioned between the four LED 211s of the corresponding light emitting system and the four light emitting lenses 220.

The aperture element as configured above is intended to prevent light from any of the LEDs 211 from transmitting through the non-corresponding light emitting lenses and the light receiving lens 220C and illuminating the fixing belt 61, and prevent flares directly reflected by any of the light emitting lenses 220 from directly entering the PDs 212.

FIGS. 35A and 35B show side plates 240 having opening ends in the X-direction. The lens unit LU is joined with the +X side opening end of the side plates 240 while the substrate 210 is joined with the −X side opening end of the side plates 240. Thus, the lens unit LU, side plates 240, and substrate 210 form a case as a whole.

Herein, the case and the aperture element are integrated by resin molding.

In the reflective optical sensor 200 as above, the LED 211-$p$-$q$ is turned on to emit a divergent light flux and the corresponding light emitting lens 220-$p$ condenses the light flux, to form light spots on the surface portion 61S of the fixing belt 61.

The reflected light by the light spot on the surface portion 61S is condensed by the light receiving lens 220C only in the Z-direction and incident on the PDs 212, as shown in FIG. 36.

The reflection by the surface of the fixing belt 61 is not mirror reflection so that the reflected by the fixing belt 61 is not condensed by the light receiving lens 220C in the Y-direction and received by the PDs 212 including the PD 212-$n$.

Figure 39:
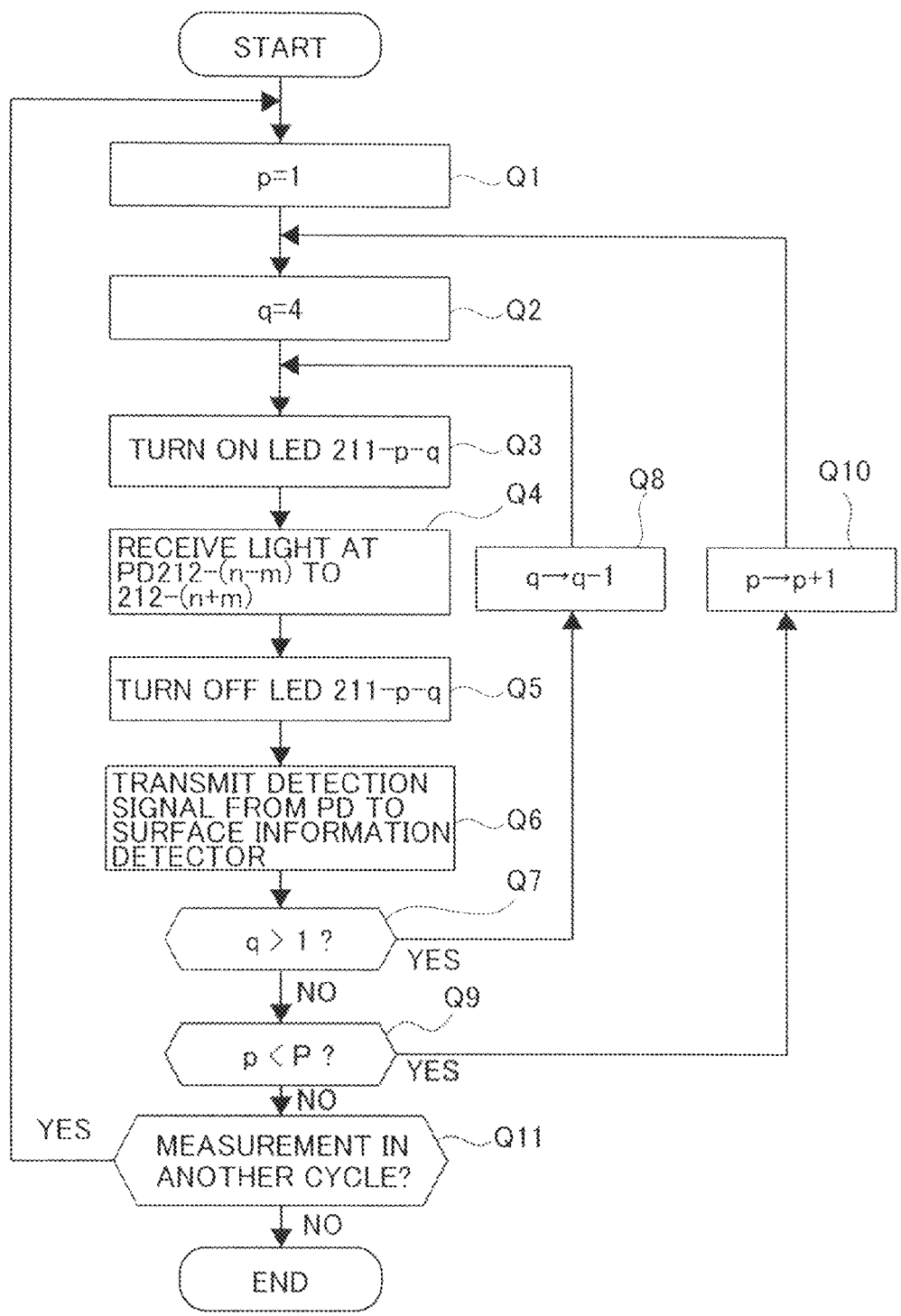
FIG. 39 is a flowchart for the processing of the surface information detector by way of example.

Next, the operation of the surface condition controller 500A is described referring to FIG. 39. In the surface condition controller 500A the reflective optical sensor 200 is controlled by the surface information detector 300.

In step Q1 the value of p is set to 1.

In step Q2 the value of q is set to 4.

In step Q3 the LED 211-$p$-$q$ is turned on, and the surface portion 61S is illuminated with the light from the light emitting system including the LED 211-$p$-$q$ and the light emitting lens 220-$p$.

In step Q4 in synchronization with the turning-on of the LED 211-$p$-$q$, the reflected light by the surface portion 61S is condensed by the light receiving lens 220C only in the Z-direction and received by the PDs 212-($n$−$m$) to 212-($n$+$m$) including the PD 212-$n$.

For the sake of simplicity, the number of the PDs 212 receiving light is set to an odd number, 2m+1 where m is an integer.

Thus, upon the turning-on of the LED 211-$p$-$q$, the reflected light is received by the PD 212-$n$ and $m$ PDs 212 on both sides of the PD 212-$n$.

For example, at m=2, five PDs 212-$n$-2, 212-$n$-1, 212-$n$, 212-$n$+1, and 212-$n$+2 receive the reflected light.

The value of m can be set to an arbitrary value. A proper value can be decided on the basis of a correlation between an image and the value which has been experimentally found. However, when m is a small value (m=0, for example), only one PD output value is available, which increases a variation in the detection. Also, when m is a large value corresponding to the sum of the PDs, a contrast of a target linear scratch is lowered. Thus, appropriate values of m are in the range of 2 to 6.

In step Q5 the LED 211-$p$-$q$ is turned off.

In step Q6 the detection signal of each PD 212 is transmitted to the surface information detector 300. Specifically, the PDs 212 photoelectrically convert light receiving amount into a signal. The converted signal is amplified to a detection signal. Each detection signal is sent to the surface information detector 300 upon detection.

In step Q7 a determination is made on whether or not q>1 is satisfied. At YES in step Q7, the flow proceeds to step Q8. At NO in step Q7, the flow proceeds to step Q9.

In step Q8 the value of q is decremented, and then the flow returns to step Q3.

In step Q9 a determination is made on whether or not p<P is satisfied. At YES in step Q9, the flow proceeds to step Q10. At NO in step Q9, the flow proceeds to step Q11.

In step Q10 the value of p is incremented, and then the flow returns to step Q2.

The N LEDs 211-$p$-4 to 211-$p$-1 (p=1 to P) 211 of the LED arrays are turned on and off in order one by one to scan the surface portion 61S of the fixing belt 61 from the left end S-1 to the right end S-N as shown in FIG. 35A.

The turning-on and off is repeated until p=P and q=1 and the last LED 211-P-1 is turned on and off, completing one cycle of the measurement.

In step Q11 a determination is made on whether or not another cycle of the measurement needs to be performed. For example, for the purpose of improving the accuracy of detection, the determination in step Q11 is affirmed. That is, the turning-on of the LEDs are repeated in cycles to calculate the mean value in each cycle, thereby improving the accuracy of detection. With YES in step Q11, the flow returns to step Q1 while with NO in step Q11, the flow is completed.

To enhance image quality, the optical scanner 13 is controlled on the basis of a detected result of the surface information detector 300 in the color printer 100.

Specifically, after the negative result is obtained in step Q11, the optical scanner 13 is controlled according to a detected result of the surface information detector 300, that is, the position of a scratch. More specifically, the light emission amount of the light source of the optical scanner 13 is adjusted in accordance with scan timing or a position on each photoconductor drum in the main scanning direction.

For example, the light emission amount of the light source is set to a normal amount when a portion of the fixing belt 61 with no scratch is scanned, and it is set to a larger value than the normal amount when a scratched portion of the fixing belt 61 is scanned. As a result, the exposure amount or attached toner amount of the location on the photoconductor drum corresponding to the scratch portion is larger than that on other locations. Accordingly, a toner image is evenly fixed on the paper S via the fixing unit 16, enhancing image quality.

Further, the optical scanner 13 can be controlled according to the position and depth of a scratch. Specifically, it is preferable that the larger the depth of the scratch is, the larger the light emission amount of the light source or the attached toner amount is.

Alternatively, the optical scanner 13 can be controlled according to the position, depth, and width of a scratch. It is preferable that the larger the depth of the scratch is, the longer the time for which the light emission amount of the light source or the attached toner amount is set to a larger amount is.

In the above, if the light spots SP fall at the left end (S-1 or S-2) of the surface portion 61S, that is, the LED 211-1-1 or LED 211-1-2 is on, the number of PDs 212 receiving the light is less than five since the light emitting lenses 220 is an inverted expander. This applies to the light spots S falling on the right end (S−(N−1) and S-N).

In view of this, the number of LEDs to turn on can be set to N−4 excluding ones emitting light spots SP at both ends of the surface portion 61S instead of N, for example.

In general all of the LEDs 211 do not need to be turned on and off and an arbitrary number N' (≤N) of them can be used.

Figure 40B:
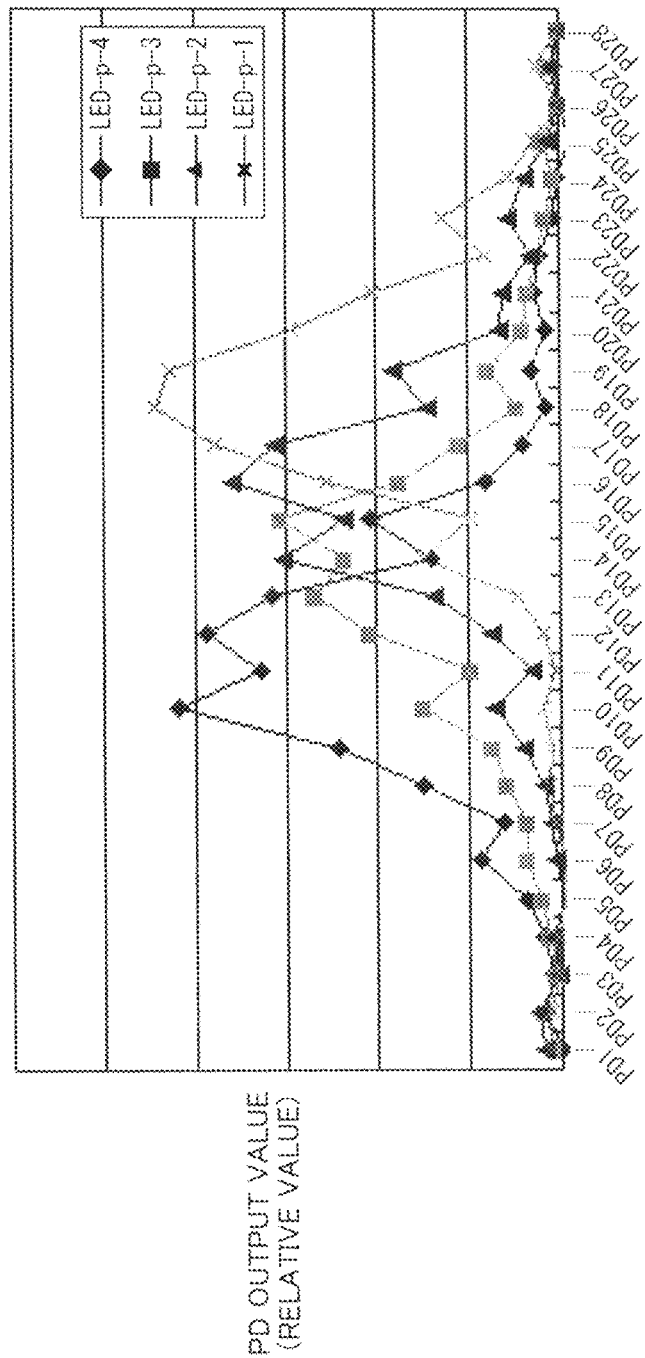

FIGS. 40A and 40B are graphs showing the results of an experiment in which the reflective optical sensor 200 is operated following the flowchart in FIG. 39.

Further, FIG. 40A shows PD output values of PD 212-$n$ (n=1 to 28) when each of the LED 211-$p$-$q$ (q=1 to 4) is turned on without presence of the fixing belt 61, that is, a target object which reflects a light flux from the reflective optical sensor 200.

Without the fixing belt 61, the PD output value should be ideally zero. However, the PD output in FIG. 40A shows a curve with the PDs 212-14 and 212-15 at the center.

FIG. 40B is a graph showing PD output values obtained by subtracting the ones detected with the light shield 600 closed from the ones detected with the light shield 600 opened. That is, the graph shows the PD output values of the reflected light only from the fixing belt 61.

The peak of the curve of the PD output values are focused. When the LEDs 211-$p$-4, 211-$p$-3, 211-$p$-2, and 211-$p$-1 are turned on in order, the PD number whose PD output value is the peak is shifted from a small number to a large number.

This is also apparent from the fact that the light spots SP scan the surface portion 61S of the fixing belt 61 from −Y side to +Y side.

Figure 41:
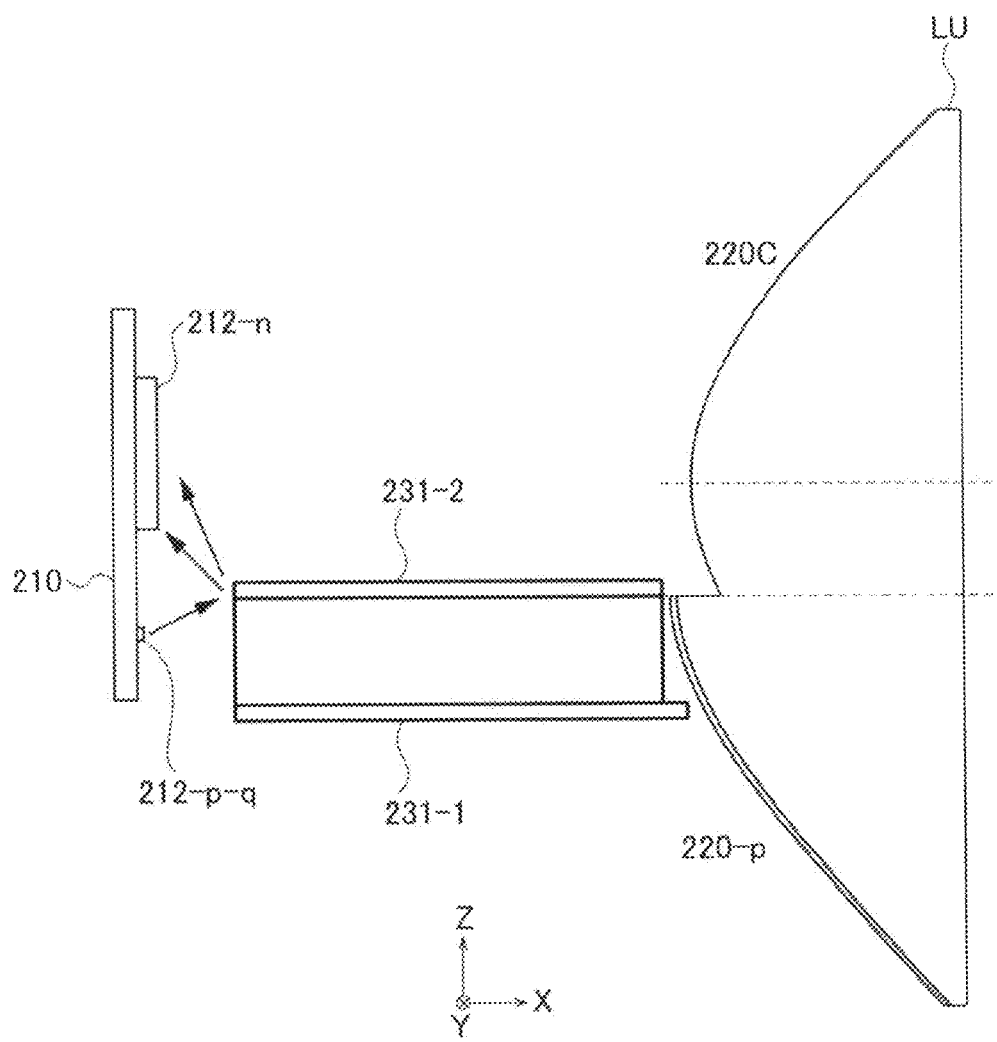
FIG. 41 shows the light from the LEDs reflected by the aperture element and incident on the PDs.

The inventors of the present application studied the causes of the curved PD output and found out that a part of divergent light flux from the LEDs 211-$p$-$q$ is diffused by the front sides of the aperture elements 230-($p$−1), 230-$p$, 231-1, and 231-2 opposing the LEDs 211 and received by a number of PD 212-$n$, as shown in FIG. 41. The aperture element functions to allow a principal ray of each LED 211 to pass through the apertures and block or reflect a periphery portion of the principal ray.

Figure 54A:
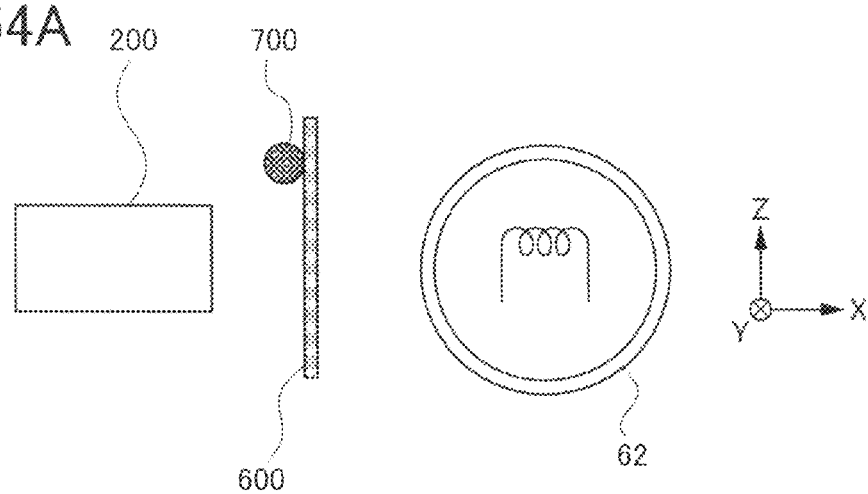
FIGS. 54A and 54B show another example of the light shield.
Figure 54B:
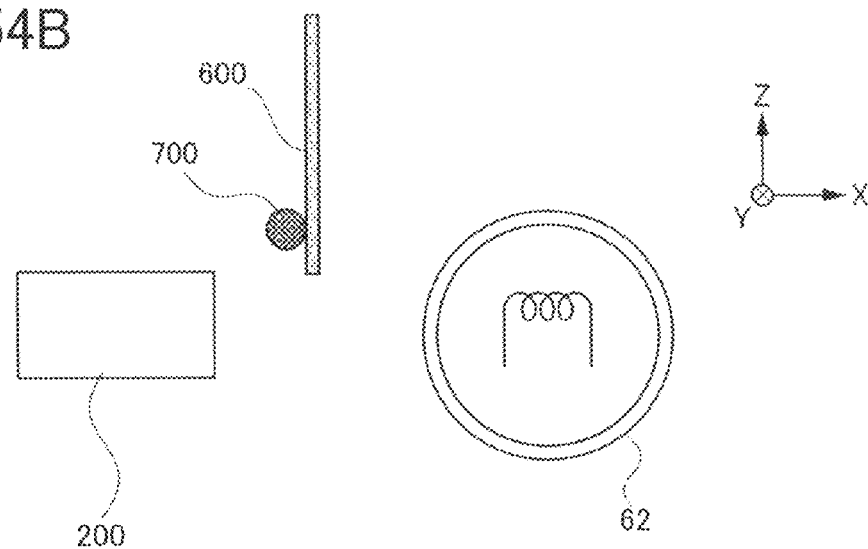

In view of the above, according to the present embodiment the light shield 600 is provided to block the light from the reflective optical sensor 200 when needed, referring to FIGS. 54A and 54B.

Specifically, the light shield 600 is movable between a closed position and an open position by a not-shown actuator or manually. The light shield 600 is controlled to move by the surface information detector 300, for example.

When the light shield 600 is opened, the light from the reflective optical sensor 200 is incident on the fixing belt 61, and reflected light by the fixing belt 61 is incident on the reflective optical sensor 200, the PD output including the reflected light by both the fixing belt 61 and the aperture element is detected.

Therefore, with the light shield 600 placed in both the closed position and the opened position, each light emitting system emits light to the aperture element to obtain the respective PD outputs. By calculating a difference in these PD outputs, the PD output of the reflected light only by the fixing belt 61 can be found.

In the following an example of surface information detecting method for the fixing belt 61 with use of the surface condition controller 500A will be described.

The reflective optical sensor 200 and the reference reflector as a glass plate are provided to oppose to each other, referring to FIG. 42A to FIG. 43B. A not-shown light shield is provided to be able to block the optical path between the reflective optical sensor 200 and the glass plate. Preferably, the glass plate is configured to reflect only by one side by forming the other side to be a rough or scattering surface and applying black coating thereto.

FIG. 42A is a graph showing 28 PD output values when 20 of 28 LEDs 211-2-4 to 211-6-1 are turned on in order with the light shield placed between the reflective optical sensor 200 and the reference reflector.

Figure 42B:
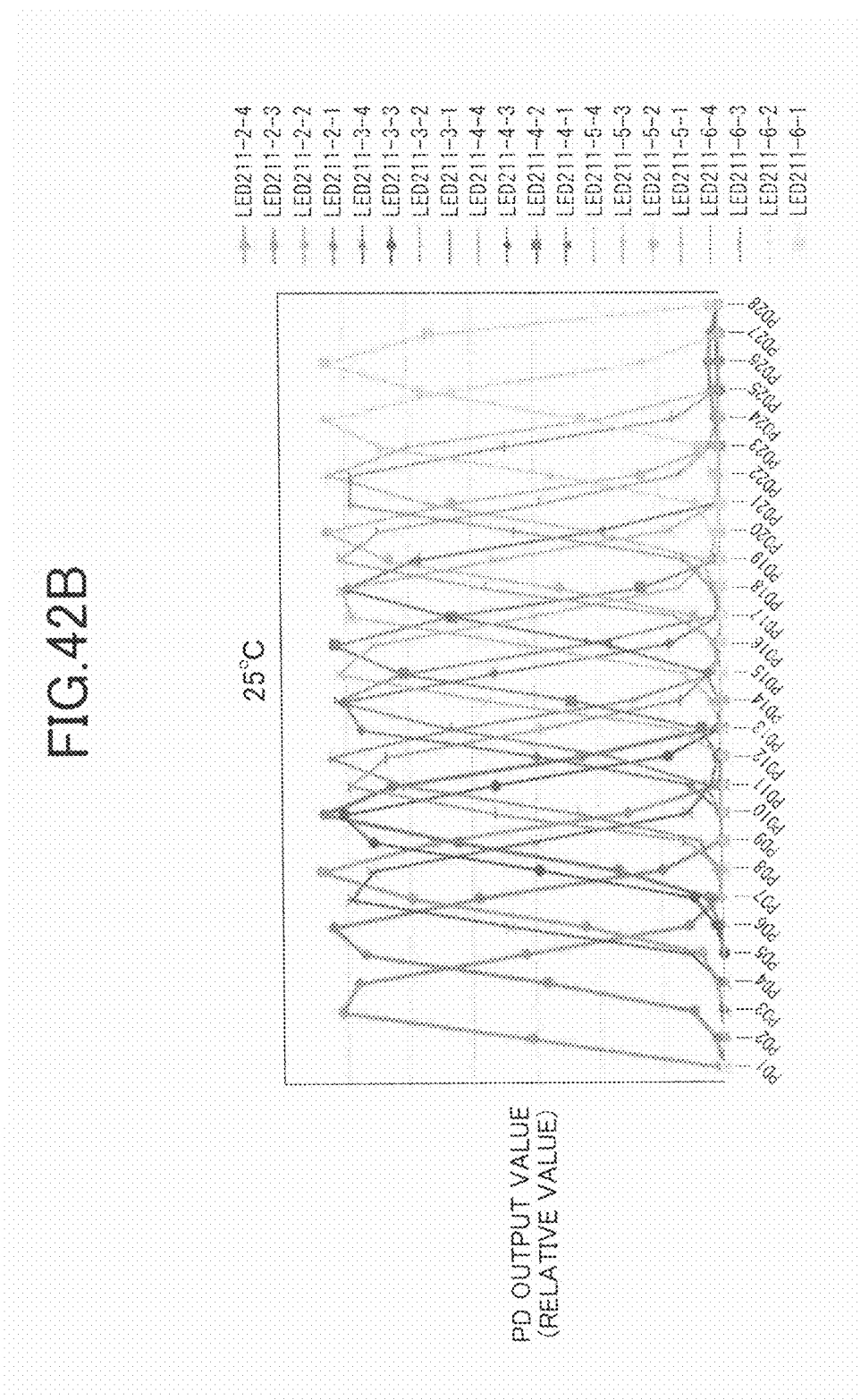
FIG. 42B is the same showing a PD output value obtained by subtracting the PD output value in FIG. 42A from a PD output value when the light shield is in the opened position at 25° C.

FIG. 42B is a graph showing PD output values of reflected light only by the reference reflector obtained by subtracting the ones in FIG. 42A from the ones detected when the 20 of 28 LEDs 211-2-4 to 211-6-1 are turned on with the light shield not located on the optical path between the reflective optical sensor 200 and the glass plate.

Note that the temperature of the reflective optical sensor 200 measured by the thermal sensor 400 in FIGS. 42A and 42B is 25° C.

Further, FIGS. 43A and 43B show the PD output values when the temperature of the reflective optical sensor 200 measured by the thermal sensor is 70° C. From the graphs, it is found that along with a temperature rise from 25° C. to 70° C., the light amounts of the LEDs decrease and so do the PD output values.

Figure 44:
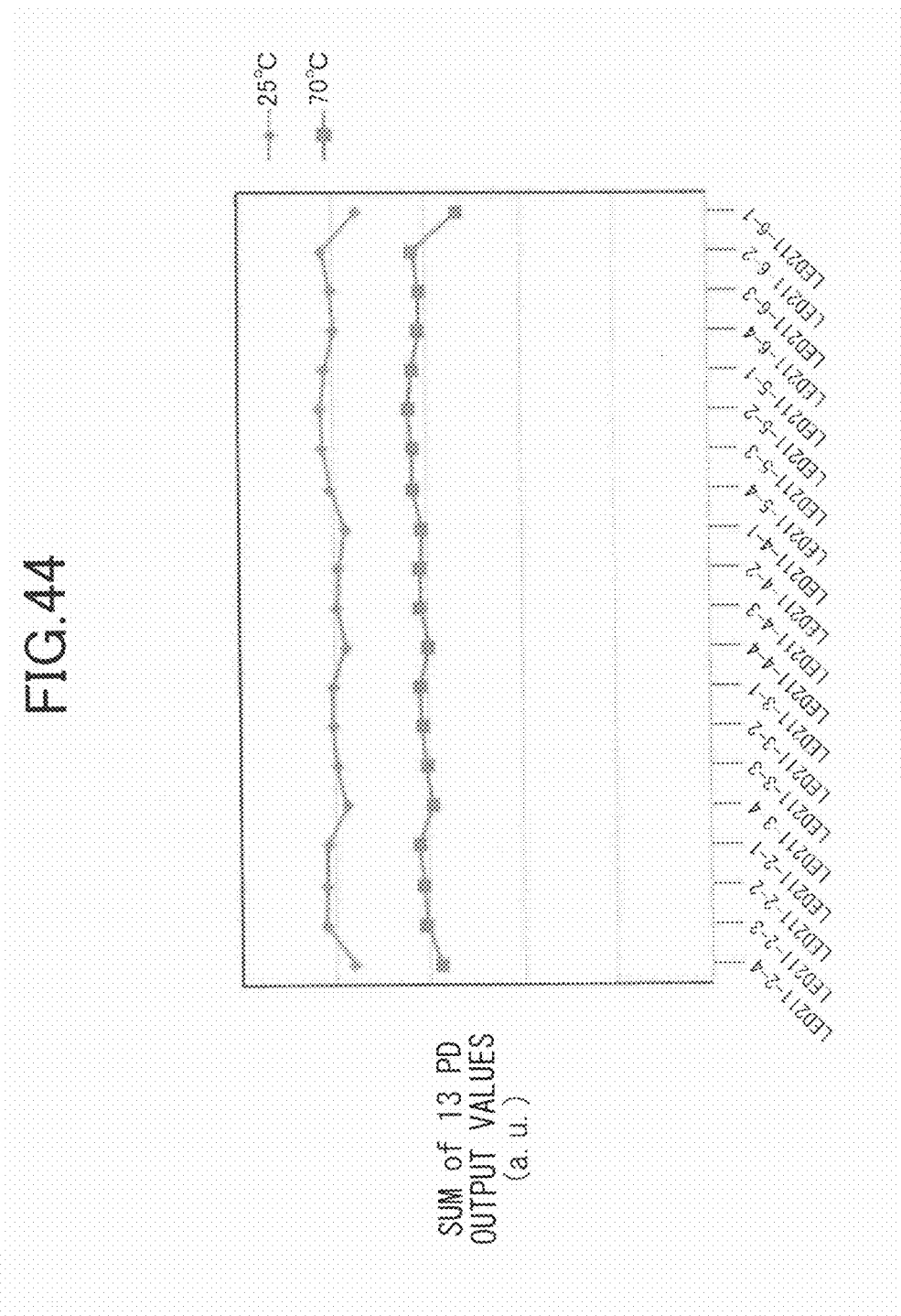
FIG. 44 is a graph showing the sum of PD outputs of each LED in FIG. 42B and the sum of PD outputs of FIG. 43B.

FIG. 44 is a graph showing the sum of the PD output values relative to the LEDs 211 in FIGS. 42B and 43B. The sum represents a light amount emitted from each LED and reflected by the reference reflector.

The sum can be a total sum of all the 28 PDs 212 or a sum of an arbitrary number of PDs including a maximal value. The maximal value depends on the optical system of the reflective optical sensor 200 and can be preset by experiment. Herein, the sum is set to a sum of 13 PD output values including the maximal value.

In other words, the graph in FIG. 45 shows a variation in the light amount of the LEDs 211 at temperatures of 25° C. and 70° C. when the glass plate of the reflective optical sensor 200 is set as a reference.

Herein, the reference reflector is used as a reference in common for mass-production of reflective optical sensors 200. The individual reflective optical sensors 200 show different graphs in FIG. 44 and differences in the graphs represent individual variabilities of the reflective optical sensors 200 since the reference reflector is a reference for all of them.

Therefore, it is able to compare the output levels of mass-produced reflective optical sensors 200 by correcting a variation in the light amount including individual variabilities, using the same reference reflector as a reference. The results shown in FIG. 44 can be used as a light amount correction coefficient for correcting a variation in the light amounts of spots in an initial state.

The reference reflector can be moved manually or automatically with an actuator. Alternatively, the reflective optical sensor 200 can be moved relative to the reference reflector.

In place of the reference reflector made of a glass plate, the reference reflector can be made of a member with similar property and function.

Further, an unused fixing belt 61 can be used in place of the reference reflector. Since the fixing belt 61 is an element of the color printer 100, another element does not need to be prepared for the reference reflector. However, there are concerns about a degradation over time and a deformation depending on environmental changes. Meanwhile, the glass plate is advantageously used for the reference reflector in terms of temporal and environmental stability and surface evenness.

Herein, the unused fixing belt 61 refers to the fixing belt 61 before or when the color printer 100 is manufactured or before printing starts after the manufacturing.

When the unused fixing belt 61 is used for the reference reflector before a start of the use of the color printer 100, each light emitting system emits light to the aperture element and the fixing belt 61 with the light shield 600 opened and with the light shield 600 closed, to detect the PD outputs and find a difference between the PD outputs. Thus, the PD output only by the reflected light by the unused fixing belt 61 can be obtained.

FIG. 45A is a graph showing temperature coefficients obtained by dividing a variation in the light amount of each LED at the temperatures of 25° C., 40° C., 50° C., 60° C., 70° C., and 80° C. of the reflective optical sensor 200 by that at the temperature of 25° C. of the reference reflector in FIG. 44. FIG. 45B is a rewritten graph of the one in FIG. 45A with temperature plotted on the abscissa axis. The temperature coefficients are a rate of the variation relative to a thermal change from the reference temperature of 25° C.

It is found from the graphs in FIGS. 45A and 45B that the detected results of each LED is more varied along with a temperature rise in the reflective optical sensor 200 even after the variation in the light amounts is corrected at 25° C. This is because the light amount of each of the 20 spots varies linearly relative to the temperature of the sensor and their temperature coefficients differ relative to each LED and a thermal change, as seen from FIGS. 45A and 45B.

Therefore, the surface information detector 300 preferably includes a memory 300A to store a variation in the light amount of each LED at the reference temperature (for example, 25° C.) of the reflective optical sensor 200 and the temperature coefficients for each LED at different temperatures. The memory 300A can be any of flash memory, DRAM, SRAM, ROM, and universal memory. In place of the memory 300A, another storage medium such as hard disc can be used.

Then, the sum of PD outputs relative to the LEDs only by reflected light by the fixing belt 61 is acquired and the temperature of the reflective optical sensor 200 at that time is measured with the thermal sensor 400. A light variation correction coefficient at each temperature is calculated on the basis of the measured value, the reference temperature stored in the memory, a variation in the light amount of each LED, and the temperature coefficient for each LED at different temperatures. Then, the acquired sum of the PD outputs for each LED is corrected according to the light variation correction coefficient. Thereby, it is made possible to accurately detect the surface condition of the fixing belt 61 irrespective of the temperature at the time of the surface condition detection.

Figure 46:
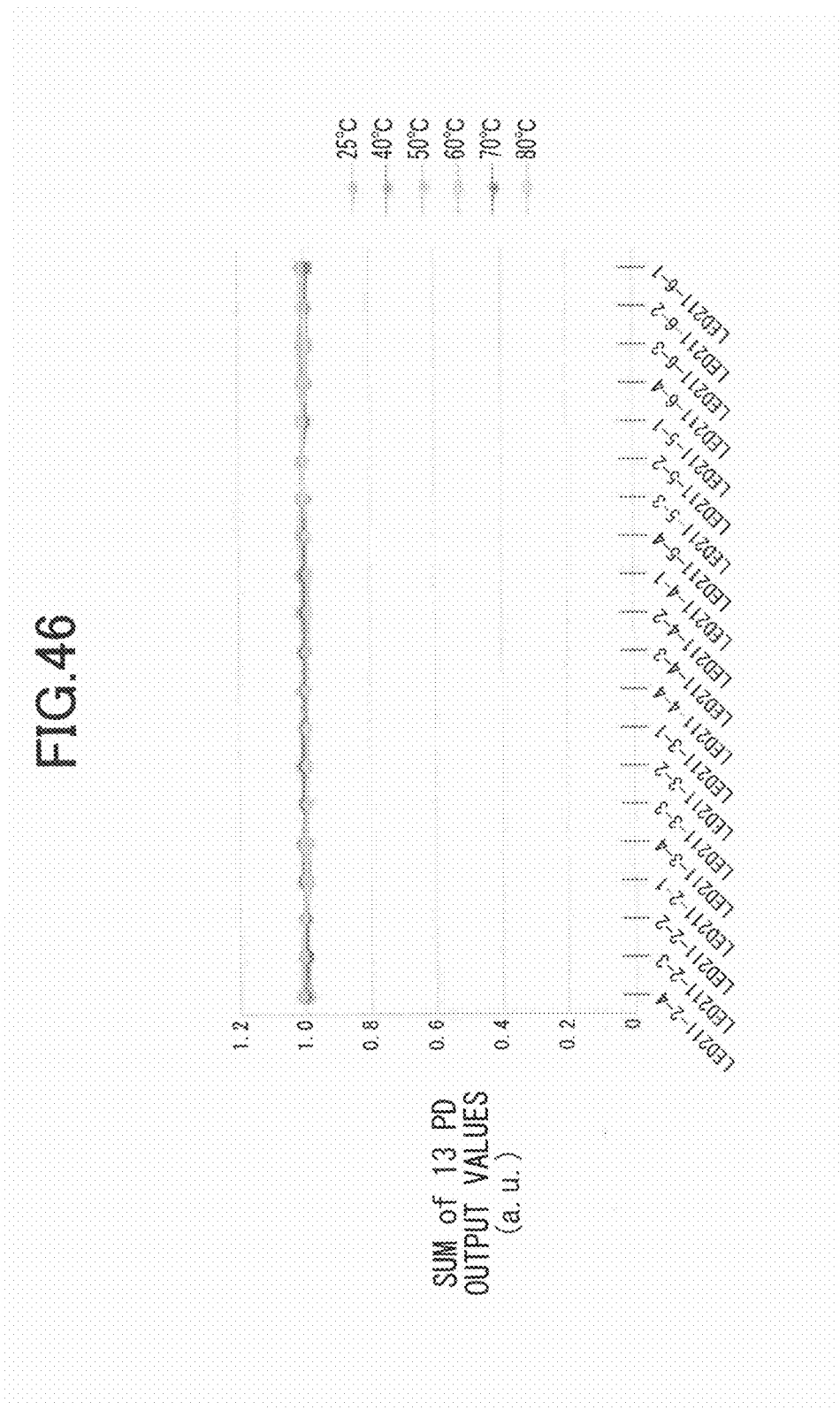
FIG. 46 is a graph showing a variation in the light amount of each LED at different temperatures corrected by a corresponding light variation correction coefficient.

FIG. 46 is a graph showing the corrected sums of the PD outputs by the above correction method when the LEDs illuminate the reference reflector at six different temperatures. It is seen from FIG. 46 that almost the same results are obtained at any temperature and a variation in the light amount of each LED along with a thermal change is sufficiently corrected.

Figure 47:
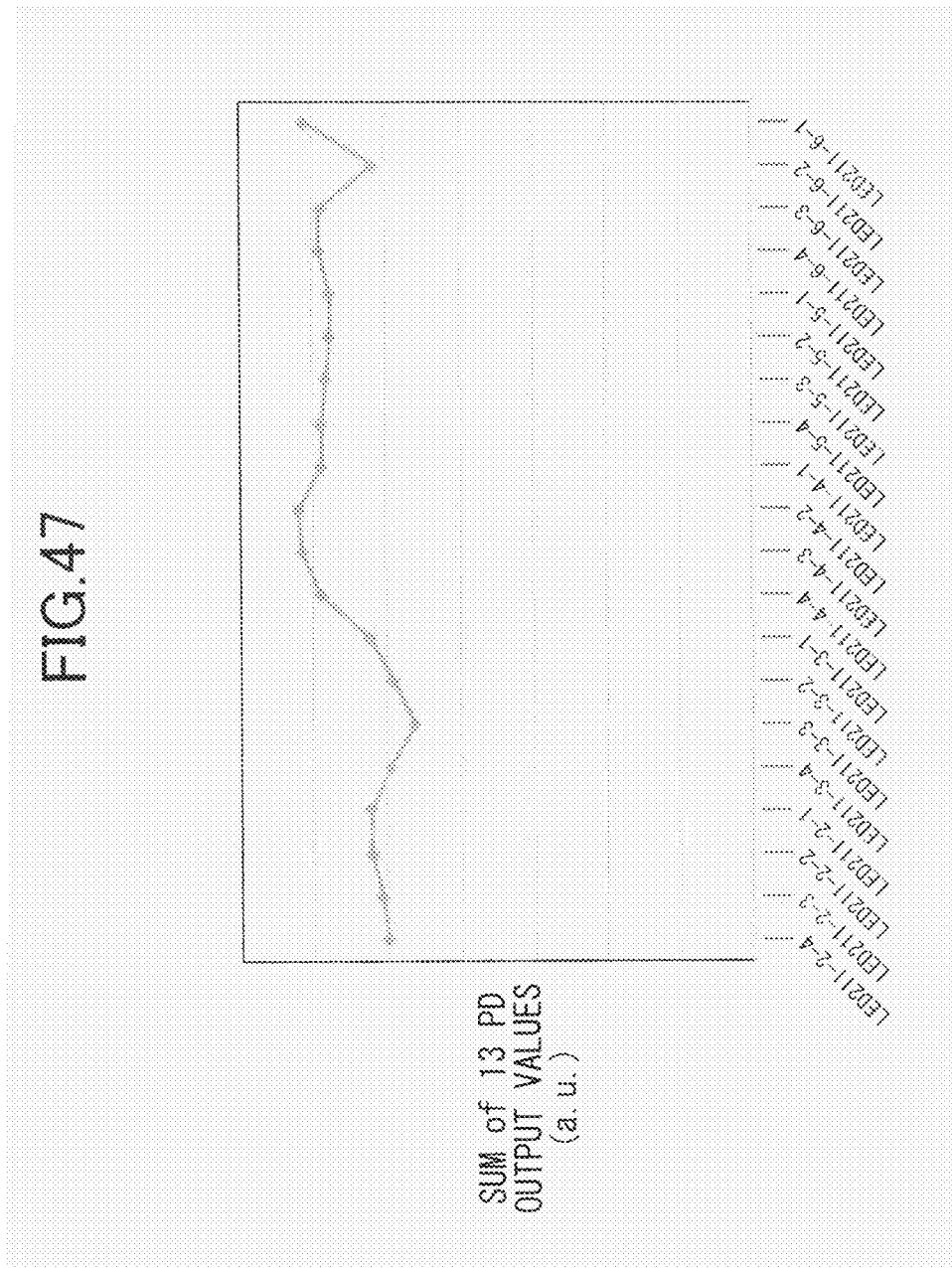
FIG. 47 is a graph showing a measured value or the sum of PD outputs of the reflective optical sensor corrected by the light variation correction coefficients.

FIG. 47 is a graph showing the results of detecting surface condition (sum of PD outputs relative to the LEDs only by the reflected light by the fixing belt 61) of the fixing belt 61 by the correction method after the start of the use of the color printer 100. It is seen from the graph that the degree of a scratch on a portion of the fixing belt 61 on which light spots from the LED 211-3-3 are formed is accurately detected.

As described above, the variations in the light amounts of the LEDs along with a thermal change are corrected. However, normally, the variations should be corrected along with a change in the property of the entire reflective optical sensor 200 including temporal variations in the light amounts of the LEDs, thermal and temporal variations in the light sensitivities of the PDs, and a thermal and temporal change in the property of the optical system.

In reality it is known that variations in the light sensitivities of the PDs are much smaller than variations in the light amounts of the LEDs, and a change in the property of the optical system by a thermal change is also small. This is the reason why the change in the light amounts of the LEDs is considered as the main cause of the change in the reflective optical sensor 200. However, the PD output values actually reflect the changes in the LEDs, optical system, and PDs, therefore, it can be said that they indicate a change in the light amount of the entire reflective optical sensor 200.

Next, the surface information detecting method for the fixing belt 61 by the surface condition controller 500A is described with reference to the flowcharts in FIGS. 48 and 49.

Figure 48:
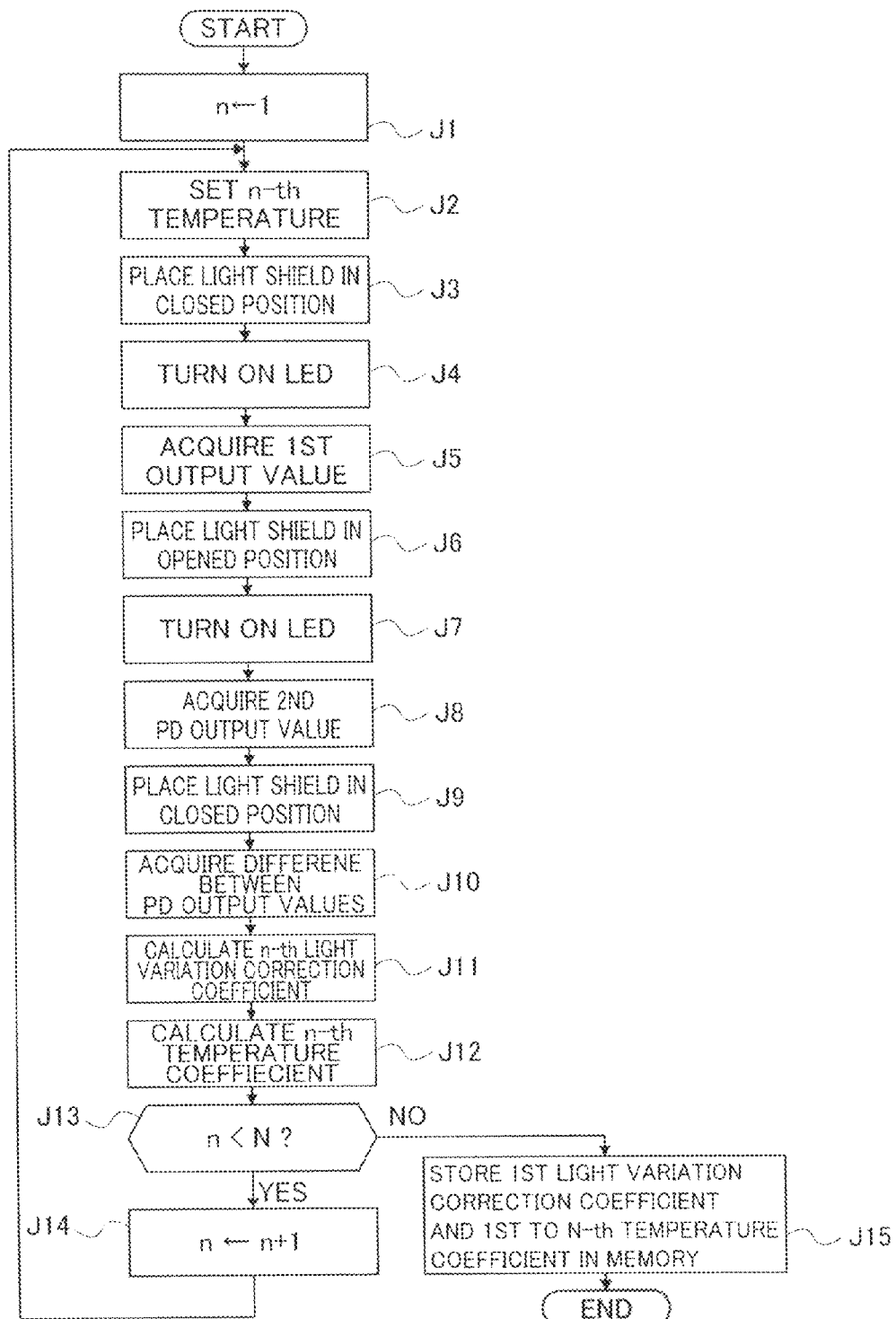
FIG. 48 is a flowchart for one example of surface information detecting method.

First, a series of operation before a start of the use of the color printer 100 is described referring to FIG. 48. Note that an unused fixing belt 61 is used for the reference reflector and the light shield 600 is initially in the opened position.

In step J1 n is set to 1.

In step J2 the temperature of the reflective optical sensor 200 is set to an n-th temperature (1≤n≤N). For example, the temperature of the reflective optical sensor 200 can be set to an arbitrary temperature in the range of 25 to 80° C. while a measured value of the thermal sensor 400 is monitored by adjusting the temperature of a thermal source H of the heating roller 62. Herein, 25, 40, 50, 60, 70, and 80° C. are set to the first to sixth temperatures, respectively. That is, N=6. Alternatively, the thermal setting of the reflective optical sensor 200 can be achieved by a thermal source other than the heating roller 62. The value of N should not be limited to 6 and can be 2 or more. The temperature range should not be limited to 25 to 80° C. The first to N-th temperatures are arbitrarily changeable.

In step J3 the light shield 600 is placed in the closed position.

In step J4 the LEDs 211 are turned on in order following the steps of FIG. 39. In step J5 a first PD output of each PD relative to the turning-on of each LED is acquired. The acquired first PD output is stored in the memory 300A of the surface information detector 300.

In step J6 the light shield 600 is placed in the opened position. In step J7 the LEDs 211 are turned on in order following the steps of FIG. 39. In step J8 a second PD output of each PD relative to the turning-on of each LED is acquired.

In step J9 the light shield 600 is placed in the closed position. Note that the light shield 600 does not need to be in the closed position. However, it is expected that the reflective optical sensor 200 can be protected by the closed light shield 600 from heat and dust. Preferably, the light shield 600 is always placed in the closed position except for the time when light is emitted to the fixing belt 61.

In step J10 a difference in the first and second PD outputs of each PD is calculated by subtracting the first PD output from the second PD output. Thus, it is able to obtain the PD output of each PD only by the reflected light by the unused fixing belt 61 as the reference reflector, by detecting the first and second PD outputs with the light shield 600 closed and opened, respectively, to find a difference between the first and second PD outputs.

In step J11 an n-th light variation correction coefficient is calculated. The n-th light variation correction coefficient is the sum of differences in the PD outputs of each PD relative to each LED at an n-th temperature.

In step J12 the n-th temperature coefficient is calculated. The n-th temperature coefficient is calculated by dividing the n-th light variation correction coefficient by a first light variation correction coefficient which represents a variation in the light amount of each LED at the first temperature.

In step J13 a determination is made on whether or not n is smaller than N. With YES in step J13, the flow proceeds to step J14. With NO in step J13, the flow proceeds to step J15.

In step J14 n is incremented, and the flow returns to step J2.

As described above, the series of operation is performed at each of the set temperatures to calculate the light variation correction coefficients and the temperature coefficients.

In step J15 the first light variation correction coefficient, the first to N-th temperature coefficients, and the first to N-th temperatures measured by the thermal sensor 400 are listed in a table and stored in the memory 300A of the surface information detector 300. In place of the first to N-th temperature coefficients, the second to N-th light variation correction coefficients can be stored in the memory 300A.

Figure 52A:
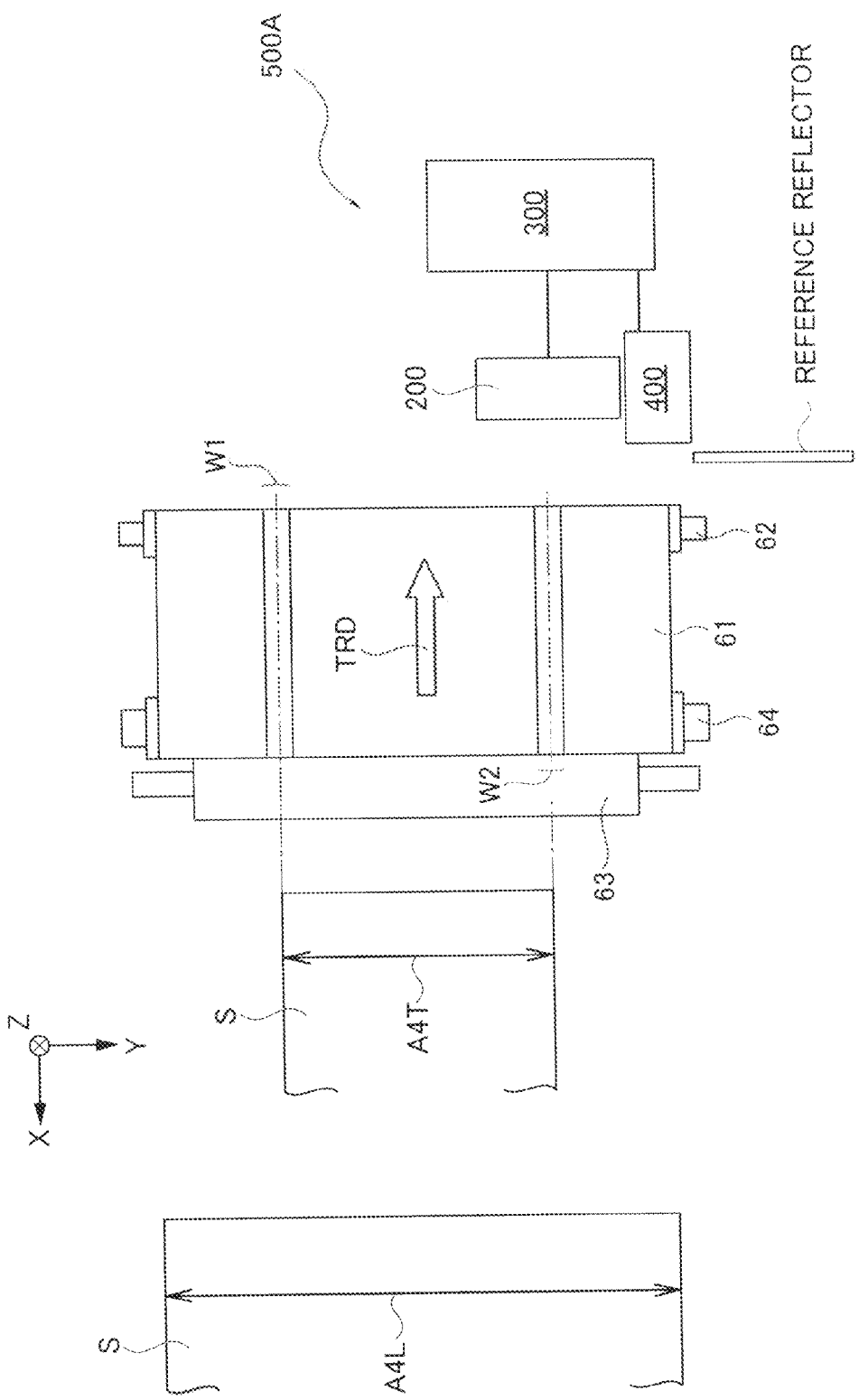

With use of a different element (for example, glass plate) other than the unused fixing belt 61 for the reference reflector, the reference reflector can be moved between a certain position between the reflective optical sensor 200 and the fixing belt 61 and another position separated from the certain position, as shown in FIGS. 52A and 52B. The surface condition controller 500A can be moved between a position where the reflective optical sensor 200 faces the fixing belt 61 and a position where the reflective optical sensor 200 faces the reference reflector, as shown in FIGS. 53A and 53B.

Further, with use of the glass plate as the reference reflector, an additional step in which the reference reflector is placed between the reflective optical sensor 200 and the fixing belt 61 or in which the reflective optical sensor 200 is placed to face the reference reflector is needed before step J7.

Figure 49:
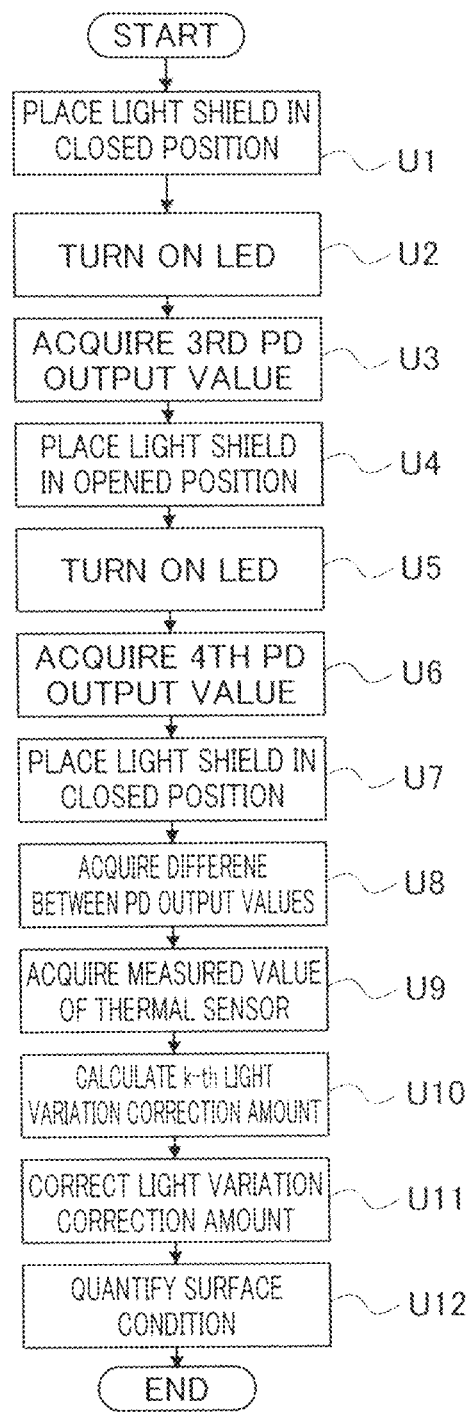
FIG. 49 is a flowchart for one example of surface information detecting method.

Next, a series of operation to perform at arbitrary timing after a start of the use of the color printer 100 is described, referring to FIG. 49. A glass plate is used for the reference reflector, for example. Initially, the light shield 600 is placed in the opened position.

Herein, after the start of the use of the color printer 100 signifies that an image generation (printing) including the fixing by the fixing unit 16 has been performed at least once. The arbitrary timing can be set to an instance at which a predetermined number of prints, for example, 1,000, are generated. Preferably, this operation is performed after completion of a job to print the predetermined number of papers for the purpose of preventing a decrease in productivity due to a termination of the job during printing.

In step U1 the light shield 600 is placed in the closed position.

In step U2 the LEDs 211 are turned on in order following the steps of FIG. 39. In step U3 a third PD output of each PD relative to the turning-on of each LED is acquired.

In step U4 the light shield 600 is placed in the opened position.

In step U5 the LEDs 211 are turned on in order following the steps of FIG. 39. In step U6 a fourth PD output of each PD relative to the turning-on of each LED is acquired In step U7 the light shield 600 is placed in the closed position. Here, the light shield 600 does not need to be in the closed position. However, it is expected that the reflective optical sensor 200 can be protected by the closed light shield 600 from heat and dust. Preferably, the light shield 600 is always placed in the closed position except for the time when light is emitted to the fixing belt 61.

In step U8 a difference in the third and fourth PD outputs of each PD is calculated by subtracting the third PD output from the fourth PD output. Thus, it is able to obtain the PD output of each PD only by the reflected light by the unused fixing belt 61, by detecting the third and fourth PD outputs with the light shield 600 closed and opened, respectively, to find a difference between the third and fourth PD outputs.

In step U9 the measured values of the thermal sensor 400 are acquired.

A k-th light variation correction coefficient is calculated on the basis of the measured values of the thermal sensor 400 and the table containing the first light variation correction coefficient, the first to N-th temperature coefficients, and the first to N-th temperatures stored in the memory 300A. Specifically, the k-th light variation correction coefficient is calculated by multiplying a k-th temperature coefficient for a k-th temperature most approximate to the measured value of the thermal sensor 400 among the first to N-th temperatures by the first light variation correction coefficient. If the second to N-th light variation correction coefficients are stored in the memory in step J12, the k-th light variation correction coefficient can be set to the light amount correction coefficient for the k-th temperature most approximate to the measured value among the second to the N-th temperatures.

In step U11 a variation in the light amount or the sum of the PD outputs is corrected by the k-th light variation correction coefficient.

In step U12 the corrected sum of the PD outputs is quantified as the surface information on the fixing belt 61. The quantification will be described later.

Figure 50:
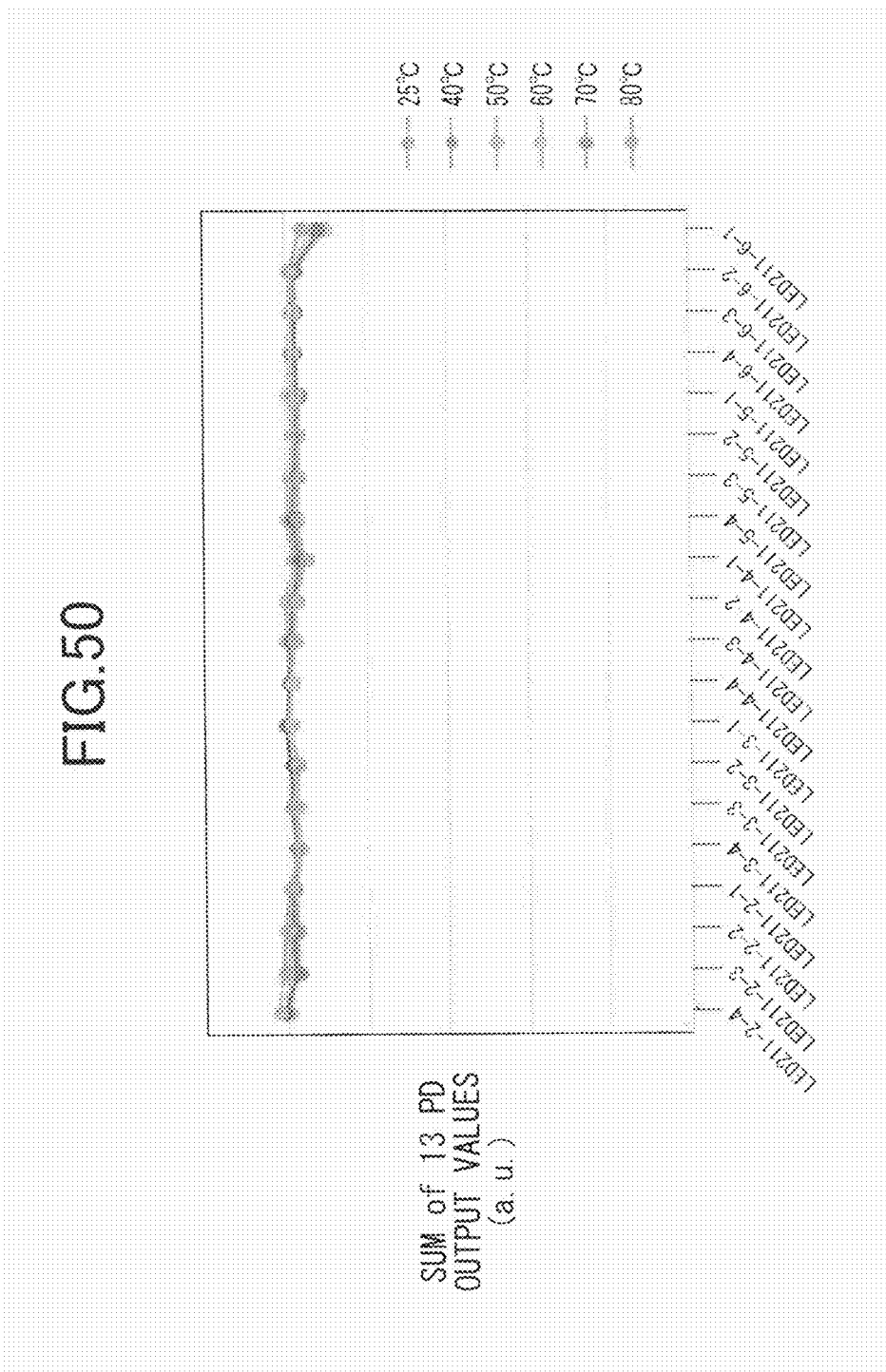
FIG. 50 is a graph showing a variation in the light amount of each LED at different temperatures obtained by the surface information method in FIGS. 48 and 49 when the reflective optical sensor is used for a long time.

FIG. 50 is a graph showing the corrected sum of PD outputs relative to each LED by the operation in FIG. 49 when the reflective optical sensor 200 is used for a long time enough to degrade LEDs after the use of the color printer 100 is started. As seen from the graph, a variation in the light amount is more increased, that is, insufficiently corrected in comparison with the sum of the PD outputs in FIG. 46 obtained when the reflective optical sensor 200 is almost new. Accordingly, the accuracy of the surface information on the fixing belt 61 is decreased.

Figure 51:
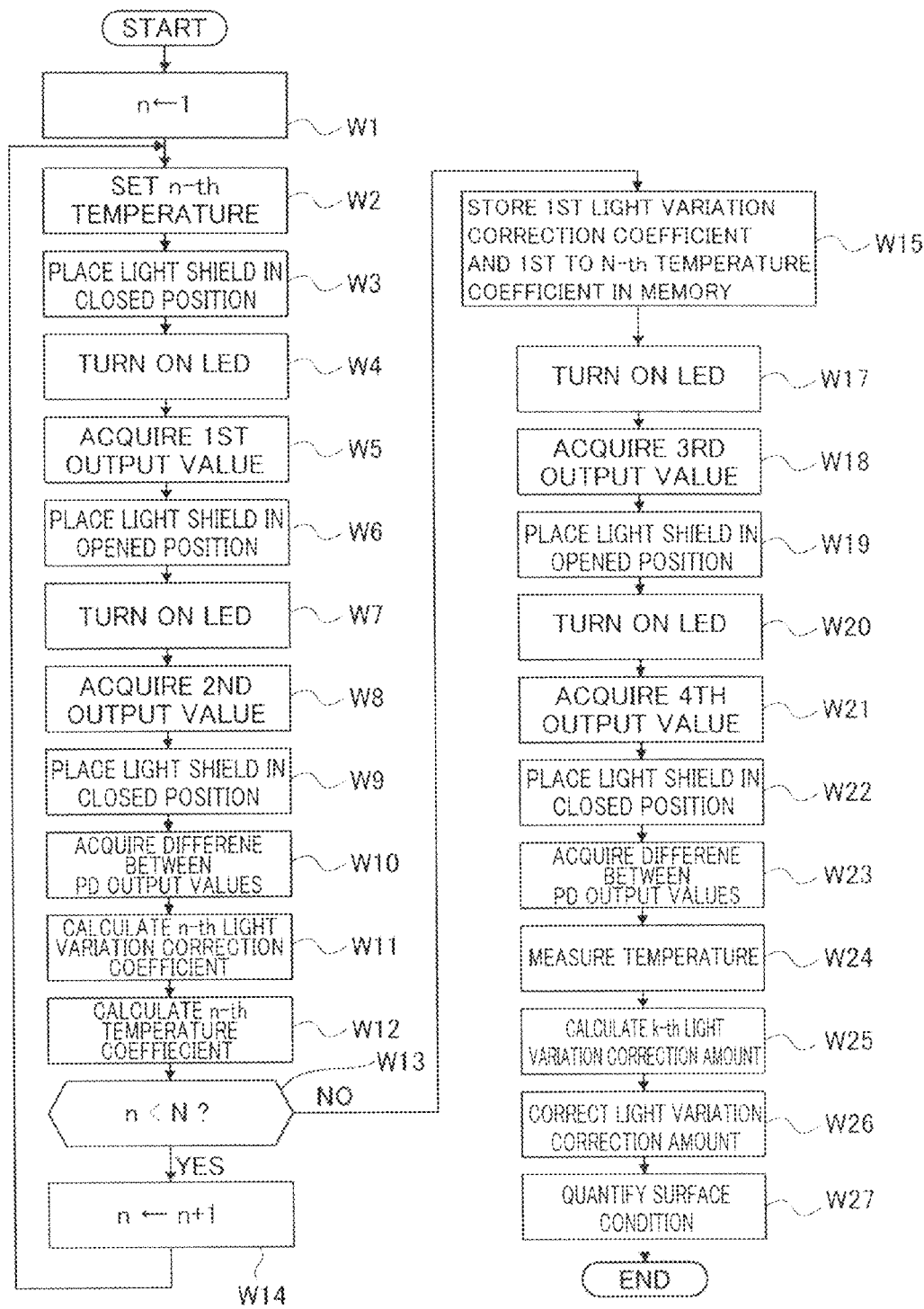
FIG. 51 is a flowchart for another example of surface information detecting method.

In view of this, a series of operation in steps W1 to W27 of FIG. 51 can be performed at certain timing after the start of the use of the color printer 100. Steps W1 to W15 of FIG. 51 correspond to steps J1 to J15 of FIG. 48 and steps W17 to W27 correspond to steps U2 to U12 of FIG. 48. At the start of step W17, the light shield 600 is placed in the closed position (step W9).

Although not explicitly described in FIG. 51, the reflective optical sensor 200 and the reference reflector are arranged to face each other before step W7 and released from facing each other between steps W8 and W17. After the use of the color printer 100, a scar or scratch may occur on the fixing belt 61, so that an element other than the fixing belt 61 needs to be used for the reference reflector. In these processes either of the reference reflector and the reflective optical sensor 200 can be moved.

By the series of operation in FIG. 51, a variation in the light amounts can be corrected with taking not only a thermal change but also a temporal change or degradation of each LED into account.

After the use of the color printer 100, periodically performing the operation in FIG. 51 makes it possible to correct a variation in the light amount with a degradation and a temperature of each LED at that time taken into account and accurately detect the surface information on the fixing belt 61 irrespective of the detection timing.

In FIG. 51 the operation in steps W1 to W15 and the operation in steps W17 to W27 are continuously performed. Alternatively, the operation in steps W17 to W27 is performed in a certain time after the operation in steps W1 to W15, for example. Only the operation steps W17 to W27 can be performed periodically once the operation in steps W1 to W15 is performed.

Preferably, after performing the steps W1 to W15, the operation in steps W17 to W27 is performed before the use or printing of the color printer 100. By performing steps W17 to W27 after step W15 and before the degradation of the LEDs, a variation in the light amount can be accurately corrected, thereby detecting the surface information on the fixing belt 61 accurately. Note that the inner temperature of the color printer 100 is increased upon every printing, which promotes degradation of the LEDs.

Further, for acquiring the first to fourth PD outputs, the LEDs 211 are turned on in order in a number of cycles to average the values with the number of cycles. Alternatively, the center value or median can be used for the purpose of excluding anomalous values. Thereby, the accuracy of the detection can be enhanced.

Further, it is preferable that the LEDs 211 be turned on in order in at least one cycle over one or more perimeter of the fixing belt 61. This can reduce a detection error due to a variation in the rotation of the fixing belt 61. In particular, anomalous values can be removed by performing the turning-on of the LEDs in five or more cycles and using data excluding maximal and minimal values obtained over three or more cycles.

Now, the light shield 600 is specifically described. In FIG. 54A the light shield 600 is in the closed position. In FIG. 54B the light shield 600 is in the opened position. FIGS. 54A and 54B omit showing the fixing belt 61.

The light shield 600 is movable by an actuator 700 between the opened position and the closed position in Z-direction. The light shield 600 is made from highly heat-resistant engineering plastic. A not-shown black low-reflector is adhered onto the reflective optical sensor 200.

The actuator 700 is automatically operated by the surface information detector 300 in synchronization with the operation timing of the reflective optical sensor 200. The light shield 600 can be manually moved.

The engineering plastic functions to shield the reflective optical sensor 200 from direct heat transfer from the fixing belt 61 when the light shield 600 is in the closed position.

Especially, highly heat-resistant super engineering plastic can be also used. A thin film can be used for the black low-reflector to absorb light from the reflective optical sensor 200 and prevent the reflection by incident light to the PDs 212. The black low-reflector is omissible when the engineering plastic has low reflective function.

The length of the light shield 600 in FIGS. 54A, 54B is approximately equal to or slightly longer than the total width of the fixing belt 61 in the Y-direction (main scanning direction) by way of example. Thereby, the heat transfer from the entire fixing belt 61 to the reflective optical sensor 200 is decreased.

Alternatively, for another example, the length of the light shield can be shorter than the total width of the fixing belt 61 and longer than the reflective optical sensor 200 in Y-direction. This light shield can reduce direct heat transfer from the portion of the fixing belt 61 facing the reflective optical sensor 200 but cannot reduce heat transfer from the periphery of the concerning portion. Therefore, the heat transfer reducing performance of this light shield is lower than that of the light shield 600 in FIGS. 54A, 54B. However, with use of the reflective optical sensor 200 having sufficient property, the downsizing of the light shield is prioritized over the reduction of heat transfer. This results in reducing the space in which the light shield is disposed and downsizing the color printer 100.

Figure 55:
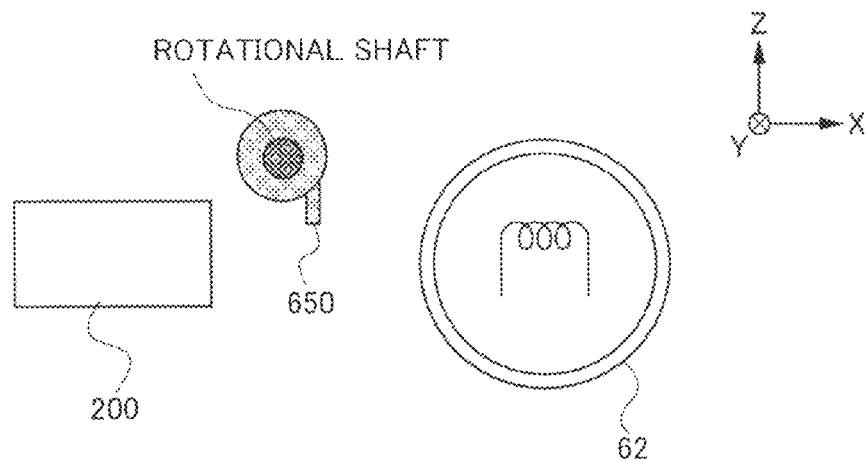
FIG. 55 shows still another example of the light shield.

FIG. 55 shows another example of the light shield. In FIG. 54B it is necessary to secure space corresponding to the moving area of the light shield 600 in the Z-direction. In view of this, a belt-type light shield 650 can be wound around a rotational shaft in parallel to Y-axis, as shown in FIG. 55. The rotational shaft of the light shield 650 is rotated by an actuator or manually, for example, to be rewound or pulled out. This results in conserving space. The rotational shaft can be rotated automatically or manually. FIG. 55 omits showing the fixing belt 61.

Normally, the surface temperature of the fixing belt is set to about one hundred several dozen to 200 degrees so that heat is directly transferred from the fixing belt to the reflective optical sensor facing the fixing belt. The reflective optical sensor includes LEDs, PDs, lenses, electric circuits, and a case accommodating these elements. At high temperatures, particularly, the performance of the sensor may deteriorate due to thermal deformation of the lenses or case or thermal property of the LEDs, PDs, and electric circuits. Another problem is that heat-resistant parts need to be selected in order to secure the sensor performance, which greatly increases the price of the reflective optical sensor.

Further, in terms of improving dust-proof performance of the reflective optical sensor, the longer the length of the light shield in the main scanning direction, the better. Meanwhile, in terms of downsizing, it is preferable that the length of the light shield be short in the main scanning direction or the light shield can be rewound and pulled out, as described above.

In terms of quantification of the surface condition of the fixing belt 61, i.e., the level and/or position of a scratch in step U12 of FIG. 49 and step W27 of FIG. 51, several methods are available. One of them will be described in the following.

Figure 56:
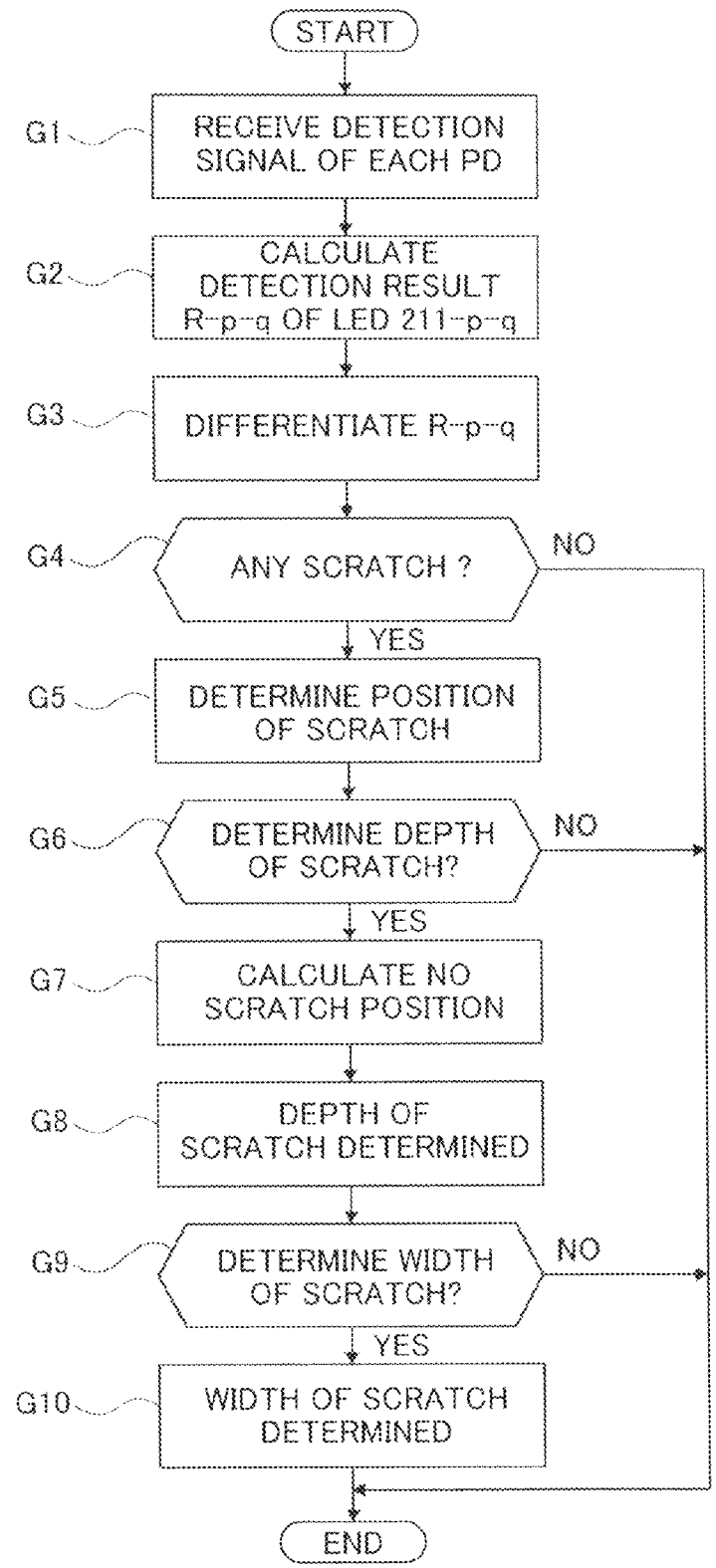
FIG. 56 is a flowchart for another example of the operation of the surface information detector.

The surface information detector 300 receives the detection signal (PD output) upon the turning-on of each LED 211-$p$-$q$, calculates the difference in signals, corrects the variation in the light amount as described above, and quantifies the surface condition of the fixing belt 61, following the flowchart in FIG. 56.

In step G1 the surface information detector 300 receives the detection signals of all the PDs 212-1 to 212-N. The number of detection signals is (2m+1) every time an LED turns on and off. In step G2 it calculates the sum of (2m+1) detection signals upon every receipt as a detection result R-$p$-$q$. Thus, the intensity of reflected light R-$p$-$q$ by the surface of the fixing belt 61 illuminated with light beams can be obtained.

Next, the surface information on the fixing belt 61 is detected on the basis of the detection result R-$p$-$q$. In general the reflected light by a scratch on the surface of the fixing belt 61 includes less specular reflective components and more diffuse reflective components than that by the surface free from scratch. When light spots from the LED 211-$p$-$q$ illuminate a scratch portion, specular reflective components by this portion are reduced. Accordingly, the light receiving amount of the PD 212-$n$ is reduced and that of the PDs 212-$n$-$m$ to $n$-1 and 212-$n$+1 to 212-$n$+$m$ around the PD 212-$n$ is increased. Generally, the detection result R-$p$-$q$ relative to a scratch portion is decreased from that relative to a no-scratch portion.

According to the property of the detection signals, presence or absence of a scratch, the level of a scratch, and the position of a scratch in the main scanning direction are quantified as surface information.

In step G3 the detection result R-$p$-$q$ is differentiated. Various kinds of differentiation are available. Here, the simplest differentiation, dividing a difference in the detection results of two neighboring PDs by the pitch of the PD array is described. That is, an inclination of the detection results of the two neighboring PDs is calculated.

Figure 57A:
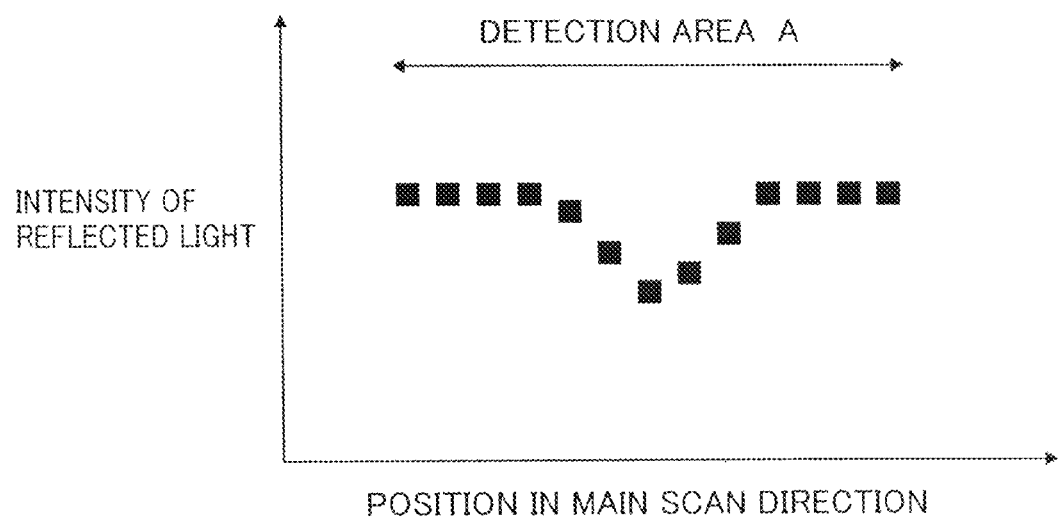
FIG. 57A is a graph showing intensity of reflected light from the fixing belt and FIG. 57B is a graph showing a differential value of the intensity of reflected light.

FIG. 57A is a graph showing an example of the detection results R-$p$-$q$ obtained when the LEDs 211 are turned on in order in one cycle. For the sake of simplicity, the graph shows 13 data points but the number of data points does not indicate any significance.

The reflective optical sensor 200 is able to obtain the intensity of reflected light at each position of the surface of the fixing belt 61 in the main scanning direction. Therefore, presence or absence of a scratch on the surface of the fixing belt 61 can be determined by comparing the intensities of reflected light in the main scanning direction with the surface information detector 300. Specifically, it is found that a position with a lower intensity of reflected light includes a scratch.

In FIG. 57A the value of the detection result R–p–q or intensity of reflected light is decreased in the vicinity of the center of the detection area A. This indicates presence of a scratch. Thus, presence of a scratch is detected as surface information. With no scratch present, the flow is completed in step G4.

Next, a detection or determination of the position of a scratch in step G5 is described.

Figure 57B:
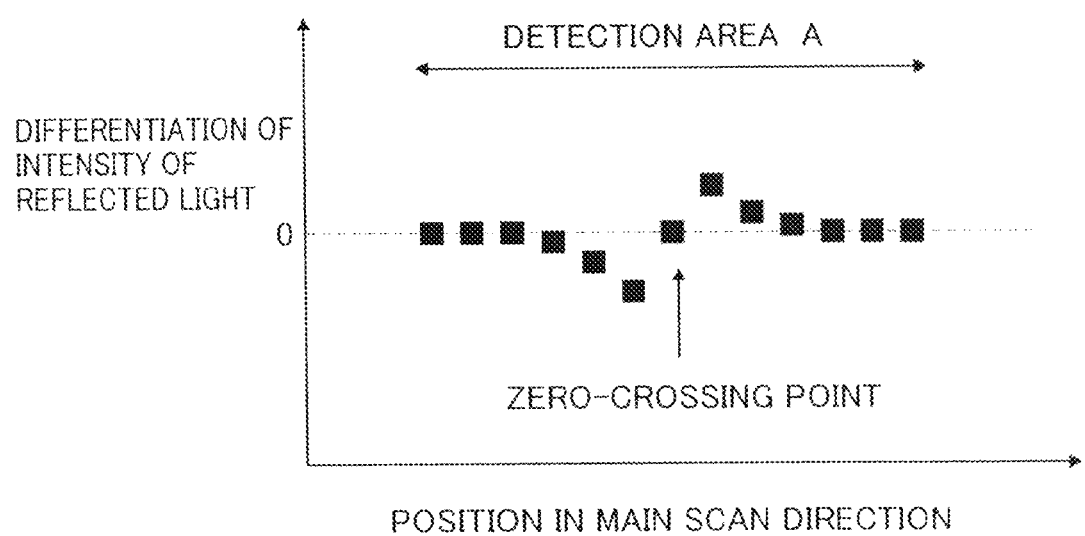

FIG. 57B shows the results of differentiation of the detection results in FIG. 57A. As apparent from a general differential theory, a differential value is 0 at the minimal position and the value gradually changes from negative to positive around the minimal position.

Accordingly, the position of a scratch can be detected or determined by finding a zero-crossing point where the differential value greatly changes from negative to positive, as shown in FIG. 57B.

The absolute value of a differential value smaller than a preset value indicates that a decrease in the intensity of reflected light is small. Thus, absence of a scratch is determined.

Now, one example is described. The reflective optical sensor 200 of FIGS. 35A and 35B is configured as follows.

The number of arrays N of the LEDs 211 and PDs 212 is 24. The number n of the LED 211 to turn on is 3 to 22. The pitch of the LED array and PD array is 1.0 mm.

Figure 58A:
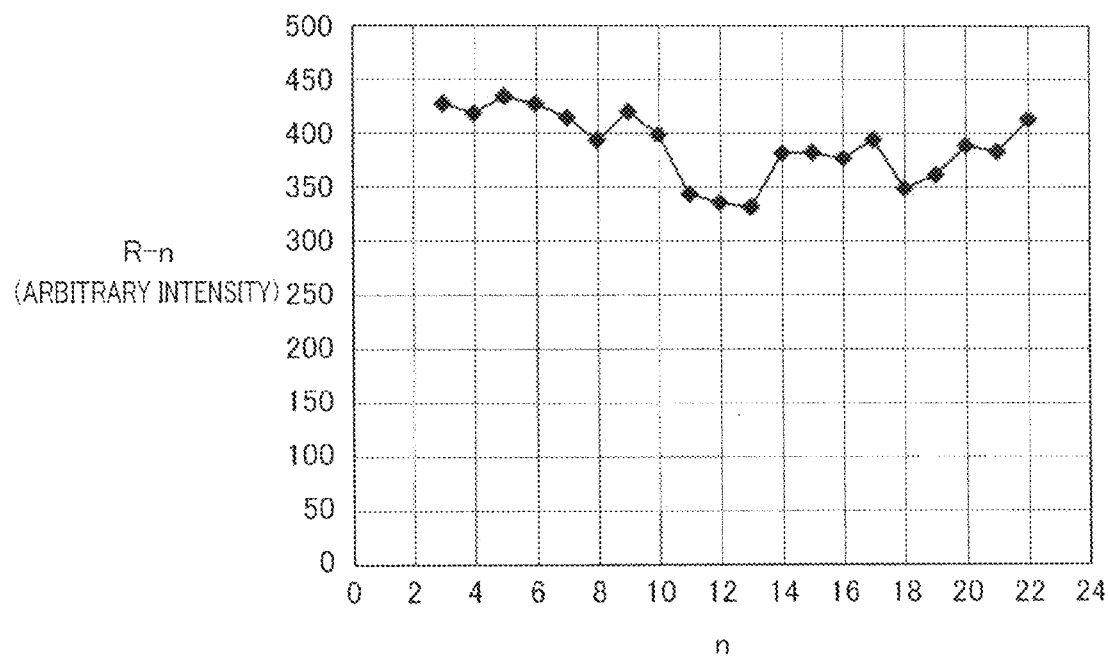
FIGS. 58A and 58B are graphs for acquiring information on a scratch on the fixing belt.

The reflective optical sensor 200 emits a light spot to the surface of the fixing belt 61 at a pitch of 1.0 mm. FIG. 58A shows a relationship between the detection results R–p–q by the reflective optical sensor 200 and the positions in the main scanning direction after the fixing belt 61 has fixed images on 400,000 A4 papers carried in the longitudinal direction.

The n in the abscissa axis of FIG. 58A is equivalent to the positions of the light spots in unit of millimeter.

Figure 58B:
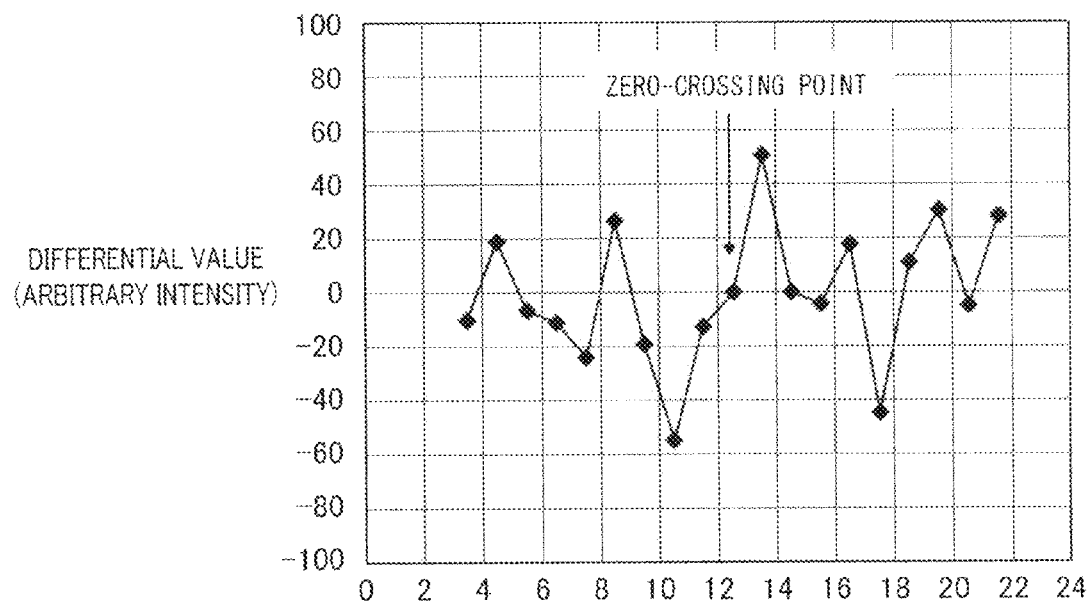

FIG. 58B shows the detection results of FIG. 58A differentiated in the main scanning direction.

Further, inclinations at three points, R–(n−1), R–n, and R–(n+1) can be calculated for the purpose of smoothing a differential value.

The zero crossing point in FIG. 58B is n=12.5. The position at 12.5 mm which is a middle of the light spots corresponding to the LEDs 211-12 and 211-13 can be detected as a scratch position.

Next, the detection of the level of a scratch is described. The level of a scratch includes the depth and width of the scratch. The depth of a scratch is described first. In step G6 the depth of a scratch is determined when needed. When the depth of a scratch is not determined, the flow is completed.

From a qualitative perspective, the deeper the depth of a scratch, the larger the roughness of the surface of the fixing belt 61 and the larger the decrease in the intensity of reflected light. Therefore, to detect the depth of a scratch, a decrease amount of the intensity of reflected light is obtained, referring to FIG. 59.

Figure 59:
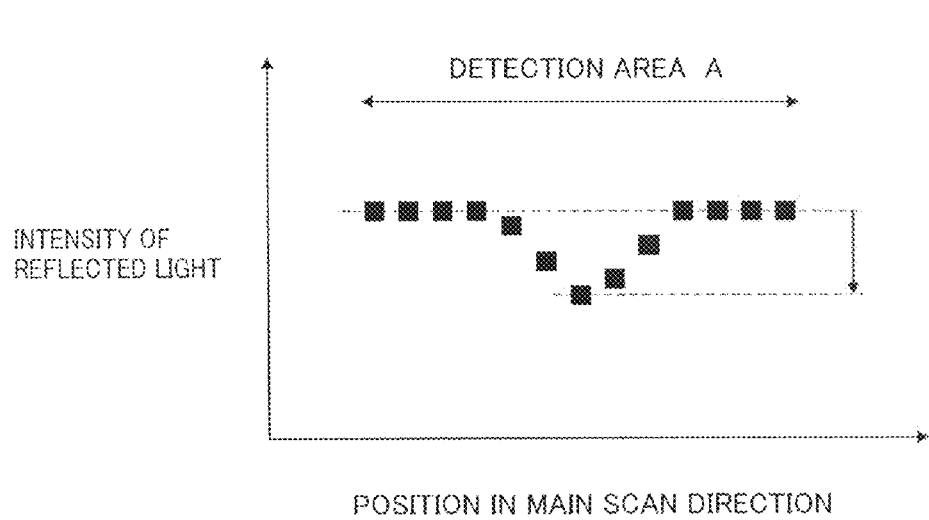
FIG. 59 is a graph showing how to obtain the depth of a scratch on the fixing belt.

When the detection result R–n (intensity of reflected light) in FIG. 59 is obtained, the minimal value of the detection result R–n can be simply obtained. There is a possibility that an inclination component is superimposed on the detection result R–n due to an inclination (accuracy of attachment) of the attached reflective optical sensor 200 or an inclination of the fixing belt 61.

The position of a scratch is detected as above. The position of no scratch is the position in the graph where the detection result R–n varies small or the differential values gather in the vicinity of 0. In view of this, in step G7 the position of no scratch is calculated from the results of differentiation in the main scanning direction.

Figure 60A:
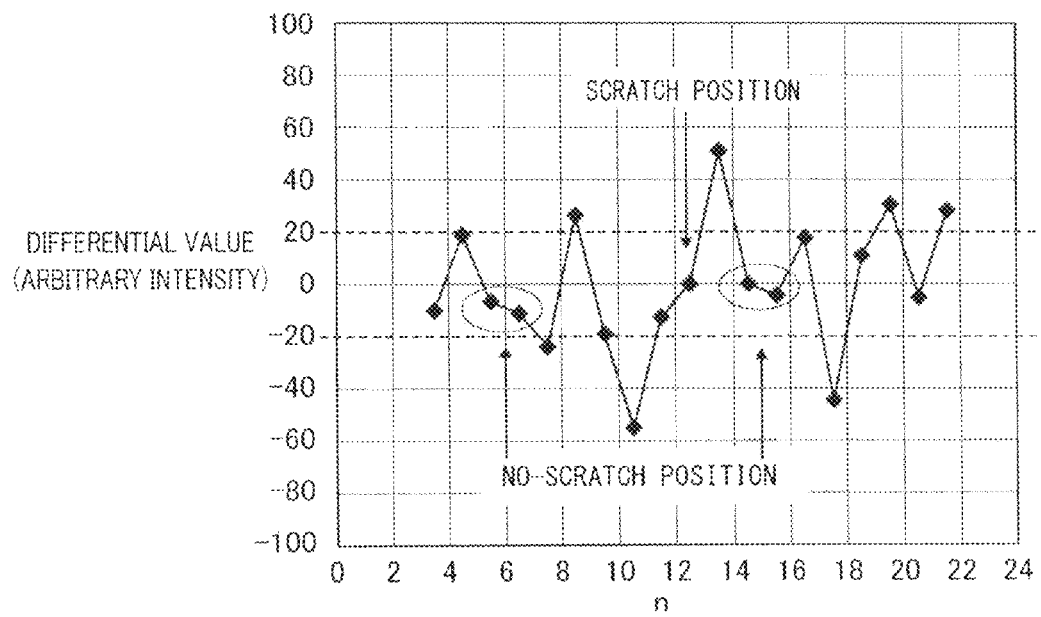
FIGS. 60A and 60B are graphs for acquiring information on a scratch on the fixing belt.
Figure 60B:
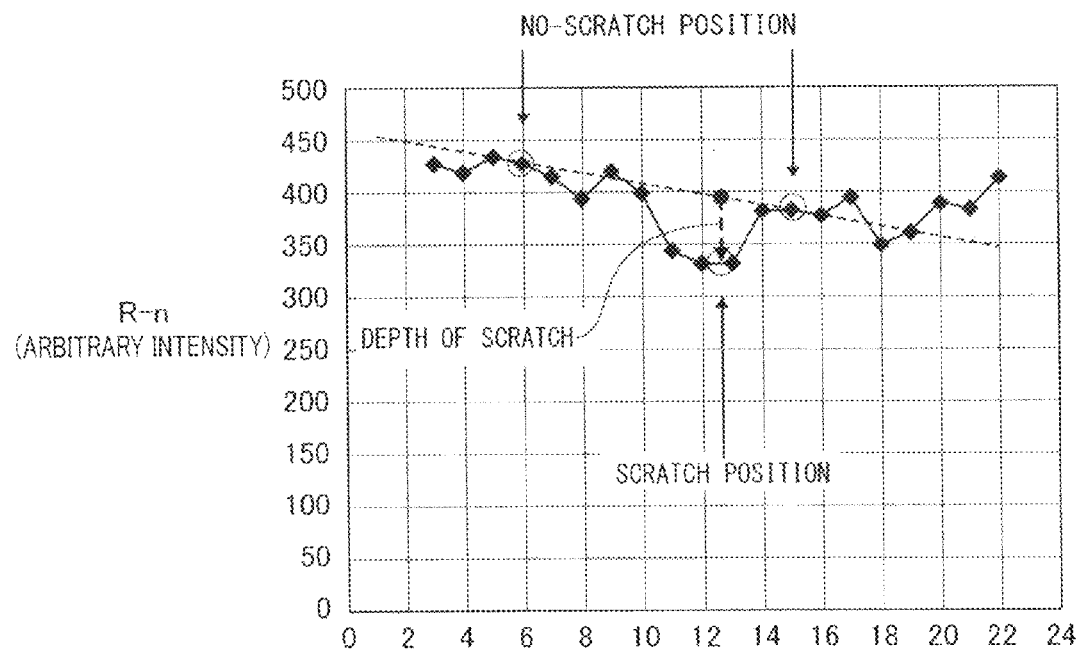

Referring to FIGS. 60A and 60B, one example of finding a decrease amount of the intensity of reflected light from the detection result R–n0 at the scratch position n0 and the detection results R–n1, R–n2 at the no-scratch position n1, n2 is described.

To subtract an inclination component superimposed on the detection result R–n, distances between an approximately straight line connecting detection results at no-scratch positions and detection results at scratch positions are calculated.

Now, this method applies to the results of FIGS. 58A and 58B to find the decrease amount of the intensity of reflected light.

FIG. 58A shows the positions in which data points gather in the range of small differential values ±20 relative to the scratch position, obtained from FIG. 58B. No-scratch positions n=6 and n=15 can be selected from FIG. 58A.

Then, the scratch position n0=12.5 and the no-scratch positions n1=6 and n2=15 are extracted to calculate the depth or roughness of the scratch from the respective detection results R–n in step G8.

In FIG. 60B the broken line is a straight line connecting Rn–n1 and Rn–n2 and the arrow corresponds to the depth of the scratch which is 63.1.

The decrease rate of the intensity of reflected light at the scratch position is 0.16 or 16%. The depth of a scratch refers to a quantified correlation between the scratch and an image anomaly due to the scratch, that is, a parameter representing the degree of image anomaly, as described above. Therefore, the obtained depth 63.1 is not a physical depth of the scratch but a degree of image anomaly such as lowered density corresponding to the depth of the scratch.

As seen from FIG. 60B, the depth of the scratch is superimposed on the inclination components indicated by the broken line.

Along with an increase in the level of the scratch (depth of scratch), the decrease in the intensity of reflected light is decreased.

Next, detection or determination of the width or size of a scratch is described. In step G9 determination of the width of a scratch is performed, when needed. When step G9 is not performed, the flow is completed.

The center of the scratch is detected as above. The positions where the intensity of reflected light corresponding to the depth of the scratch decreases in a certain amount (for example, 50%) is calculated from the detection result R–n at the scratch position.

Figure 61:
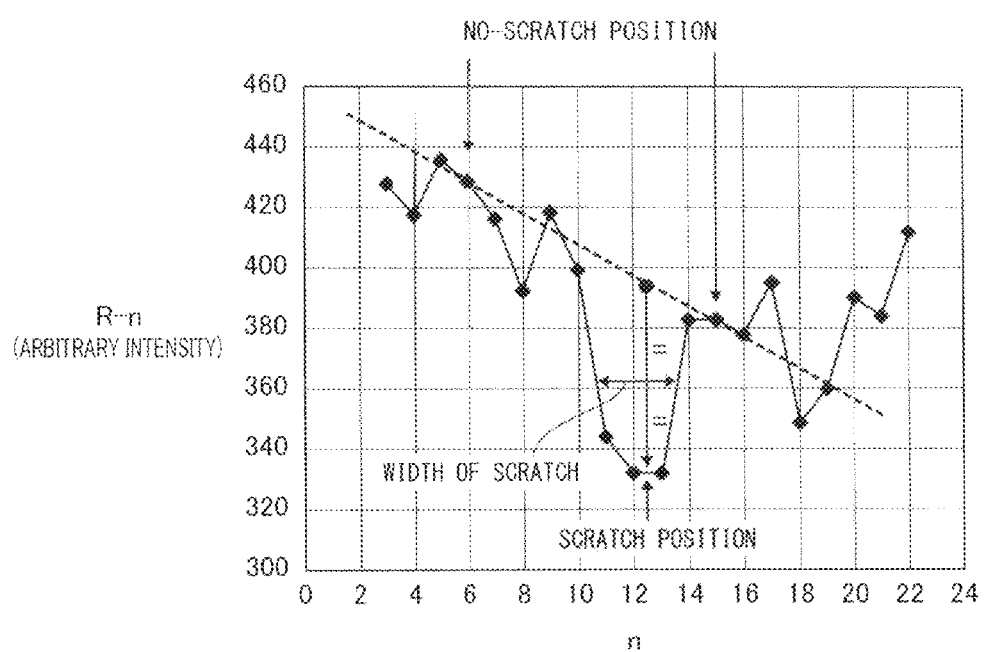
FIG. 61 is a graph for acquiring information on a scratch on the fixing belt.

FIG. 61 is the graph in FIG. 60B with an enlarged vertical axis. From the graph, the half-width of the scratch can be determined as 3 mm in step G10. After the execution of step G10, the flow ends.

As described above, with presence of a scratch, the surface information or parameters for surface condition including the depth and width of a scratch can be detected or only necessary parameters can be determined.

Hereinafter, the reasons for the inventors conceived the present embodiment will be described.

As described above, when the fixing belt is present, the PD output value includes the reflected light by the fixing belt and reflected light by the front side of the aperture element.

Meanwhile, with absence of the fixing belt, the PD output does not include the reflected light by the fixing belt and is therefore parallel to the light emission amount of the LED. The inventors paid attention to the fact that the PD output can be used for understanding a change in the light emission amount of the LED.

Further, in case of using a number of LEDs, the light amounts of the LEDs or light spots need to be equally adjusted. In general, current values and resistance values are adjusted to equalize the light amount of light spots having transmitted through lenses at factory default setting. However, decrease rates of the light amounts of the LEDs differ so that the light amounts of the LEDs become different after a certain length of time elapses. Further, the temperature dependencies of the light amounts of the LEDs are uneven. Under a temperature change, the light amounts of the LEDs differ.

If the LEDs are completely adjusted by the factory default setting to emit the same amount of light, the accuracy of the detection is not affected. However, this is extremely costly.

In view of reducing costs, it is necessary to correct the light emission of the LEDs with the light variation correction coefficient according to the amount of light spots, for example. This correction is applicable to the LEDs having an adjustment error or not subjected to the adjustment.

However, a dedicated measuring device such as an optical power meter is additionally needed to measure the amount of light spots, which brings an increase in the costs of manufacturing facility.

The inventors have developed the correction method as a combination of the calculation of the light variation correction coefficient before and after the start of use of the color printer and the correction of the light amount at arbitrary timing and temperature after the use of the color printer. Also, they have realized the surface information detector which can quantitatively, equally detect the light amount irrespective of a temporal or thermal change.

Especially, a special measuring device is unneeded for correcting a variation in the light amount since the results of the light receiver (PDs, for example) of the reflective optical sensor are used.

Furthermore, it is able to accurately detect linear scratches or scars caused by the contact of the fixing belt surface with a sheet-type recording medium in the carrying direction of the recording medium.

Further, it is able to provide an image forming apparatus which can form high quality images with no glossy lines by issuing a signal to notify a user of an exchange of the fixing belt or adjusting the surface condition of the fixing belt with an adjuster on the basis of a result of the detection of the surface information detector.

According to the above embodiments, the color printer 100 includes the fixing belt 61 which fixes a toner image transferred onto the paper S, the surface condition controller 500A which detects surface information on the fixing belt 61. The surface condition controller 500A includes the reflective optical sensor 200 including the light emitting systems having the LEDs to emit light to at least the reference reflector or at least the fixing belt 61 at different temperatures, the light receiving system to receive light reflected by the reference reflector or the fixing belt 61, the thermal sensor 400 which measures the temperature of the reflective optical sensor 200, and the surface information detector 300 which acquires the surface information according to a first light receiving result of the light receiving system receiving reflected light by the reference reflector at each of the temperatures, a first measurement result of the thermal sensor, a second light receiving result of the light receiving system receiving reflected light by the fixing belt 61 at each of the temperatures, and a second measurement result of the thermal sensor 400.

According to the above embodiments, the method of detecting surface information on the fixing belt 61 includes emitting light from the LEDs of the light emitting system of the reflective optical sensor 200 to at least the reference reflector at different temperatures, receiving reflected light by the reference reflector with the light receiving system of the reflective optical sensor 200, and measuring the temperature of the reflective optical sensor 200, emitting light from the light emitting system to the fixing belt 61, receiving reflected light by the fixing belt 61 with the light receiving system, and measuring a temperature of the reflective optical sensor 200, and acquiring the surface information according to a light receiving result and a measurement result obtained when emitting light to the reference reflector and according to a light receiving result and a measurement result obtained when emitting light to the fixing belt 61.

According to the above embodiments, the surface information on the fixing belt 61 can be obtained on the basis of the first light receiving result and the first measurement result which reflect the condition of the reflective optical sensor 200 at different temperatures and the second light receiving result and the second measurement result which reflect the surface condition of the fixing belt 61.

In detail, the light variation correction coefficient for each temperature is calculated from the first light receiving result and the first measurement result obtained at different temperatures. Then, the second light receiving result can be corrected according to the light variation correction coefficient corresponding to the second measurement result.

As a result, the color printer 100 and the surface information method according to the present embodiment can accurately, stably detect the surface information on the fixing belt 61.

Meanwhile, with use of an optical power meter to measure the light from the light emitting system, for example, manufacturing costs increase and it is not able to acquire data reflecting the characteristics of the light receiving system.

Further, the image forming apparatus disclosed in Japanese Patent No. 4632820 uses a number of photosensors. Therefore, a difference between the properties of the individual photosensors and a variation in the attachment of the photosensors are likely to occur, which causes a large variation in the measurements of the reflection rate. Also, a temporal change and a thermal change in the light emission amount of the LEDs are not taken into account.

By setting the unused fixing belt 61 of the color printer 100 for the reference reflector, the reflected light used for calculating the light variation correction coefficient can be the same as the reflected light used for detecting the surface information on the fixing belt 61 except for a surface condition of the fixing belt 61 at the time of the light reflection. This achieves further accurate detection. Also, since an additional element for the reference reflector is not needed, it is made possible to simplify the structure of the color printer and facilitate the calculation of the light variation correction coefficient and the detection of the surface information.

Further, the use of the glass plate for the reference reflector is advantageous in terms of temporal and thermal stability and surface evenness. Thus, accurate detection can be realized.

Moreover, the reflective optical sensor 200 includes the aperture element having apertures through which the principal rays of the light from the light emitters individually pass and which reflects the periphery portions of the principal rays. Accordingly, the aperture element can block flares from each LED. Further, the aperture element can be used for the reference reflector to correct a variation in the light amount of each LED 211.

The surface condition controller 500A further includes the light shield 600 movable between the closed position and the opened position. The closed position is on the optical path between the aperture element and the fixing belt 61 or between the fixing belt 61 and the light receiving system.

In this case it is possible to detect two kinds of the PD output obtained with the light shield 600 opened and closed. Therefore, components not ascribable to the fixing belt 61 can be removed from the two PD outputs. The light variation correction coefficient can be calculated from the PD output detected before and after the start of the use of the color printer 100 with the light shield 600 closed. The light shield 600 also functions to reduce heat transfer from the fixing belt 61 to the reflective optical sensor 200 and prevent powder dust from entering the reflective optical sensor 200.

The detection results of the PDs 212 are selectable from the PD output value obtained by subtracting a minimal value from a maximal value (removing an influence of electric noise), the sum of PD output values (decrease of error), and the PD output values obtained by subtracting a minimal value from the sum of PD output values around the maximal value (removing an influence of electric noise and decrease of error) in accordance with the specification of the reflective optical sensor 200. Thus, precise light variation correction coefficients can be calculated.

Further, the color printer 100 is an image forming apparatus forming images on papers S and includes the fixing belt 61 which fixes toner images on the paper S, and the reflective optical sensor 200 for the fixing belt 61 according to the present embodiment.

Thus, the color printer 100 can accurately detect a damage such as a scratch or a scar on the surface of the fixing belt and prevent degradation in image quality.

Also, the color printer 100 can quantitatively detect presence or absence of a damage by use of the light variation correction coefficient unlike a related-art image forming apparatus.

Further, the color printer 100 can detect the position and width of a damage on the surface portion 61S of the fixing belt 61 corresponding to the detection area A from the detection result, unlike a related-art image forming apparatus.

Further, the color printer 100 can detect the level (depth and width) and the position of a damage in the main scanning direction at the same time, unlike a related-art image forming apparatus which can detect only the depth of a damage.

Sixth Embodiment

Hereinafter, a surface information method with the reflective optical sensor 200 according to a sixth embodiment will be described, referring to FIG. 62.

Figure 63A:
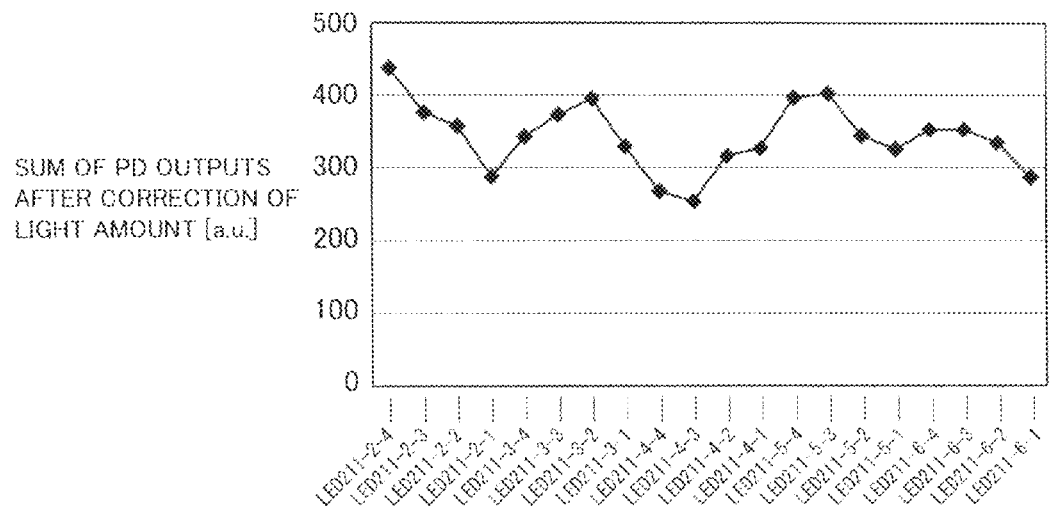
FIGS. 63A and 63B are graphs for acquiring information on a scratch on the fixing belt.

The surface information on the fixing belt 61 is detected according to detection results R-p-q shown in FIG. 63A.

Figure 62:
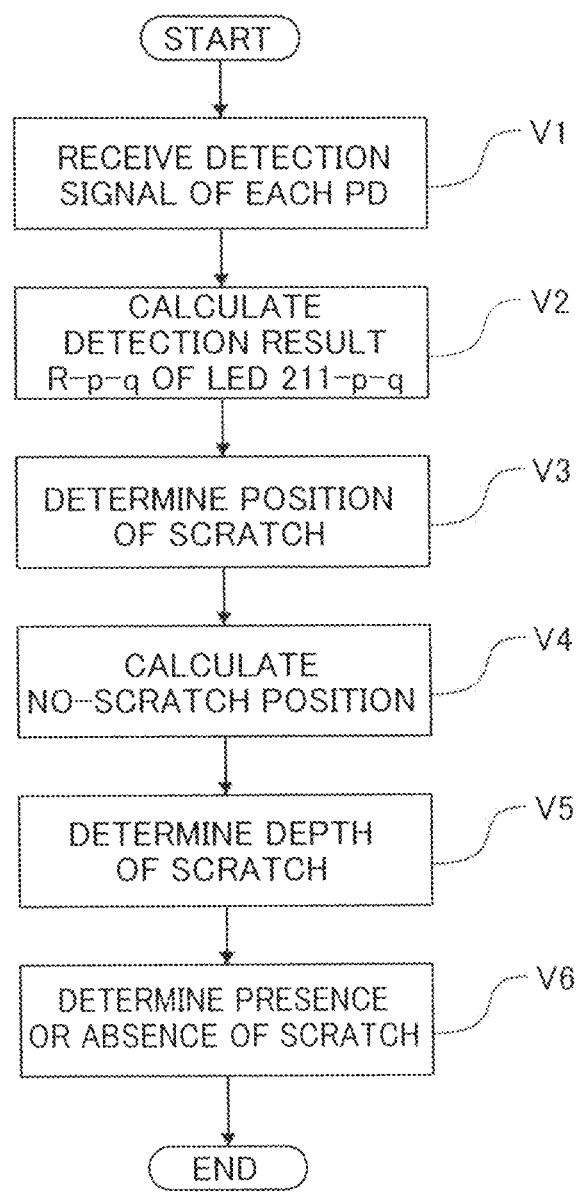
FIG. 62 is a flowchart for still another example of the operation of the surface information detector.

Note that the LED 211-p-q (p=2 to 6, q=1 to 4) in FIG. 63A indicates the results R-p-q (FIG. 63B) and are read as R-p-q in FIG. 62.

In the sixth embodiment presence or absence of a scratch is determined last instead of first in the fifth embodiment.

In step V1 each PD detection signal is received as in step G1 in FIG. 56.

In step V2 a detection result R-p-q relative to the LED 211-p-q is calculated as in step G2 of FIG. 56.

In step V3 the position of a scratch is determined.

Specifically, the position of a largest scratch at which the sum of PD outputs at R-p-q is smallest is set to the position of a scratch. The position of a scratch is found to be R-4-3 in FIG. 63B.

Figure 63B:
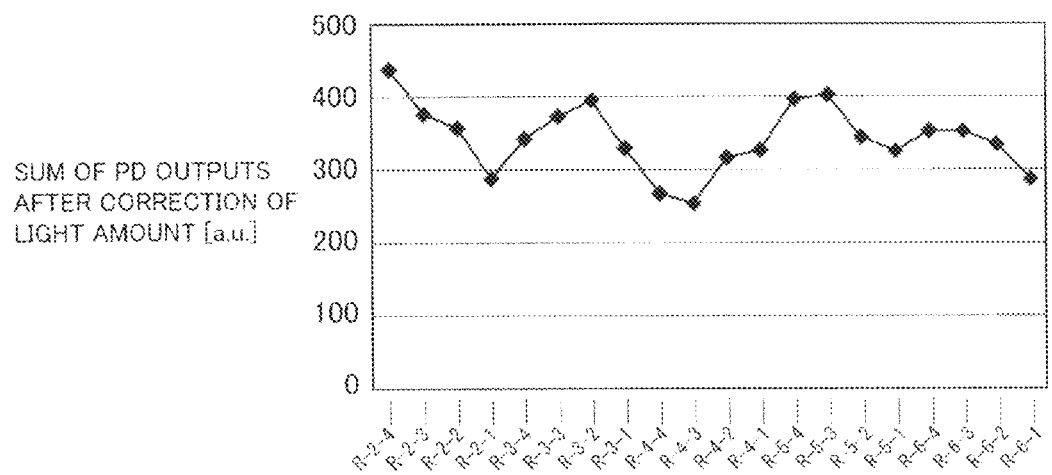

In step V4 a no-scratch position is calculated. The right and left sides of the scratch position R-4-3 in FIG. 63B are searched for the no-scratch position. It is set to the position at which the sum of PD outputs is a second largest value. The no-scratch position is found to be R-3-2 and R-5-4 in FIG. 63B.

One of the reasons why the position having the largest PD output value is not selected is as follows. Assumed that the number of scratches is one and both ends of the scratch position are no-scratch positions, its value should be ideally constant (FIG. 57A). However, in reality measuring variations include a variation in the fixing belt 61 or the reflective optical sensor 200 so that the value may contain some kind of anomalous value. Thus, the second largest value is selected in order to remove an anomalous value.

In step V5 the depth of the scratch is determined. The depth of the scratch corresponds to a value obtained by subtracting the sum of PD outputs at R-4-3 from the mean value of the sum of the PD outputs at R-3-2 and R-5-4.

The presence or absence of the scratch is determined from the depth of the scratch in step V6.

Here, the correlation between the depth of a scratch and an anomalous image is found in advance through experiments to set a value of the depth to be determined as a scratch. By comparing a detected depth with a set value, presence or absence of a scratch is determined.

Note that in the reflective optical sensor 200 the LEDs 211 can be concurrently turned on in place of sequentially turned on in the fifth embodiment. The PDs 212 are controlled to receive reflected light in synchronization with the concurrent turning-on.

In this case the surface information detector does not calculate the sum of the detection signals of the PDs 212 but uses the detection signal of the PD 212-n corresponding to the LED 211-p-q as a detection result R-p-q.

Accordingly, it is possible to obtain the intensity of reflected light by the light spots separately formed in the main scanning direction, that is, each point on the surface of the fixing belt 61 in the main scanning direction.

Further, the structure of the reflective optical sensor should not be limited to the one of the reflective optical sensor 200. It can be arbitrarily structured as long as it can emit light spots separately on the surface of the fixing belt 61 in the main scanning direction and receive reflected light thereby.

Further, by placing the reflective optical sensor 200 as structured above oppositely to the ends of a small-size paper, the size of the detection area A including the ends of the paper can be decreased. Accordingly, the downsizing of the reflective optical sensor 200 can be realized. The reflective optical sensor 200 can be roughly positioned in a direction orthogonal to the direction in which a small-size (A4 size, for example) paper is carried in the longitudinal direction.

By the placement of the reflective optical sensor 200 as above, the detection area A can contain the width ends of the paper even if the length of the detection area A in the main scanning direction is shortened. Accordingly, the reflective optical sensor 200 can be advantageously downsized in the main scanning direction.

The width of a scratch is about several hundred μm to several mm. The range of a variation in the scratch position is about several mm. Thus, the size of the detection area A is preferably about 5 mm to 15 mm in the main scanning direction.

The color printer 100 can use various sizes of paper including A3, A4, and A5, for example.

In general, the largest feedable size of paper S is A3 and A3-size papers are often carried in the longitudinal direction. A linear scratch caused by small-size papers will be a target of detection as the surface information.

If A2 or larger size papers are feedable in the longitudinal direction, a linear scratch caused by the other-size papers S except for A2 size is a target of detection as the surface information.

According to the above embodiments the number of the reflective optical sensor 200 is one. However, two reflective optical sensors 200 are provided to face both ends of the A4-size paper S in a direction orthogonal to the carrying direction of the paper S. Also, a larger number of reflective optical sensors 200 can be provided for different sizes of papers.

However, the reflective optical sensor for only either of both ends of the paper is sufficient since linear scratches similarly occur at both ends of the paper and the scratch levels do not differ largely, as described The reflective optical sensor 200 can be configured to detect approximately the entire fixing belt 61 in the main scanning direction in order to adapt to various sizes of papers, for example.

For example, for an image forming apparatus in which A1-size papers can be fed in portrait position, the reflective optical sensor is designed to be long in the main scanning direction so as to be able to detect the surface condition of a portion of the fixing belt 61 contacting the width ends of A2 to A5 and B2 to B5 size papers.

In other words, the reflective optical sensor is set to be sufficiently large along the light emitting lens array enough to adapt to various sizes of papers as a recording medium. Thereby, it is possible to prevent a failure in detecting scratches or scars occurring in different locations of the fixing belt 61 depending on a paper size.

One reflective optical sensor 200 can properly detect the surface information on the fixing belt 61 irrespective of a variation in the properties or arrangement of different reflective optical sensors 200.

In the present embodiment the light spots by the reflective optical sensor 200 are arranged in the main scanning direction orthogonal to the paper carrying direction (FIG. 64A). The arrangement of the light spots S-N in FIG. 35A should not be limited thereto. The light spots have only to be arranged to cross the paper carrying direction.

FIG. 64B shows an example where the arrangement of the light spots SP is inclined at 45 degrees relative to the carrying direction or Y-direction. The detection area A' in the main scanning direction is $1/\sqrt{2}$ of the detection area A and shorter than that. The pitch of the arrangement of the light spots in the main scanning direction can be set to $1/\sqrt{2}$ of the detection area A. This can accordingly improve the position resolution of the detection results.

Further, in the above embodiments a linear scratch on the fixing belt 61 is set to a main target to detect, however, a target should not be limited thereto and can be an offset or a scratch, scar or abrasion caused by contacting with a thermistor or a peeler, for example.

For example, an offset can be detected from a condition of toner attached on the surface of the fixing belt 61. If the toner is in a film-like condition, a detection result, i.e., a decrease in the intensity of reflected light R-p-q is relatively small and occurs in a wide area. Thus, an offset can be detected from such property.

A scratch caused by contacting a thermistor or a peeler is several 10 μm to several 100 μm in width and tends to occur at almost the same position. Since the width of a linear scratch is several 100 μm to several mm, the two kinds of scratches can be distinguished from each other from the detected positions and widths of scratches.

Further, the above embodiments have described the fixing belt as an example of the fixing element. Alternatively, a fixing roller can be also used for the fixing element.

Further, with use of a fixing belt having a surface layer made from a material with a high hardness such as PFA, it is very easily scratched or scars so that it is important to detect surface information. The detection of the surface information by the reflective optical sensor 200 makes it easier to manage replacement of the belt and the like.

The surface information on the fixing element can be information on a linear scratch in the carrying direction of a sheet-type recording medium caused by the contact of the recording medium and fixing element. In this case the level of a scratch including depth and width and the position in the main scanning direction can be concurrently detected as the surface information.

When the surface information is both the level and position of a scratch, the position of the scratch is identified by differentiating detection results R-p-q along the light spots, as described above. Thereby, inflection points (valley values) can be accurately calculated to accurately calculate the scratch position.

Further, as described above, the level of a scratch is determined from a result at the position of a scratch and results at at least two positions where the absolute values of differential values gather in the vicinity of zero, that is, no-scratch positions. Thereby, a superimposing inclination component can be removed, which can further accurately calculate the level of a scratch.

Further, crosstalk (a single PD's simultaneous reception of reflected light by the LEDs) will be eliminated by emitting light spots to the fixing belt with an interval in a direction crossing the carrying direction rather than by simultaneously emitting. This makes it possible to improve the accuracy of the detection results obtained at each light spot in the main scanning direction.

Further, the reflective optical sensor can include N ($\geq 1$) LEDs arranged in one direction, a lens array including M ($N \geq M \geq 1$) condensing lenses to condense the light from the LEDs onto the surface of the fixing element as light spots, and K ($\geq 1$) photosensors to receive reflected light by each light spot on the fixing element.

In this case a single condensing lens corresponds to a number of LEDs, which can simplify the structure of the lens array and reduce the number of photosensors. This leads to reducing the number of electric parts including an operation amplifier, and it is therefore advantageous in terms of cost performance. Further, photosensors having a single light receiving surface can be also used. A larger-size condensing lens can also function as a light receiving lens to guide the reflected light to the photosensors.

In the above embodiments, 20 LEDs 211-2-4 to 211-6-1 of the 28 LEDs 211 are turned on in order to obtain 28 PD outputs when the light shield 600 is in the closed position before and after the start of use of the color printer 100. However, it is possible to calculate the light variation correction coefficient when the light shield 600 is in the opened position.

However, if a degree of damage of the fixing belt 61 is serious, the accuracy of a calculated light variation correction coefficient is affected by the damage and lowered. Therefore, it is preferable to obtain the detection results of the PDs 212 when the light shield 600 is in the closed position to exclude the reflected light by the fixing belt 61.

Figure 65A:
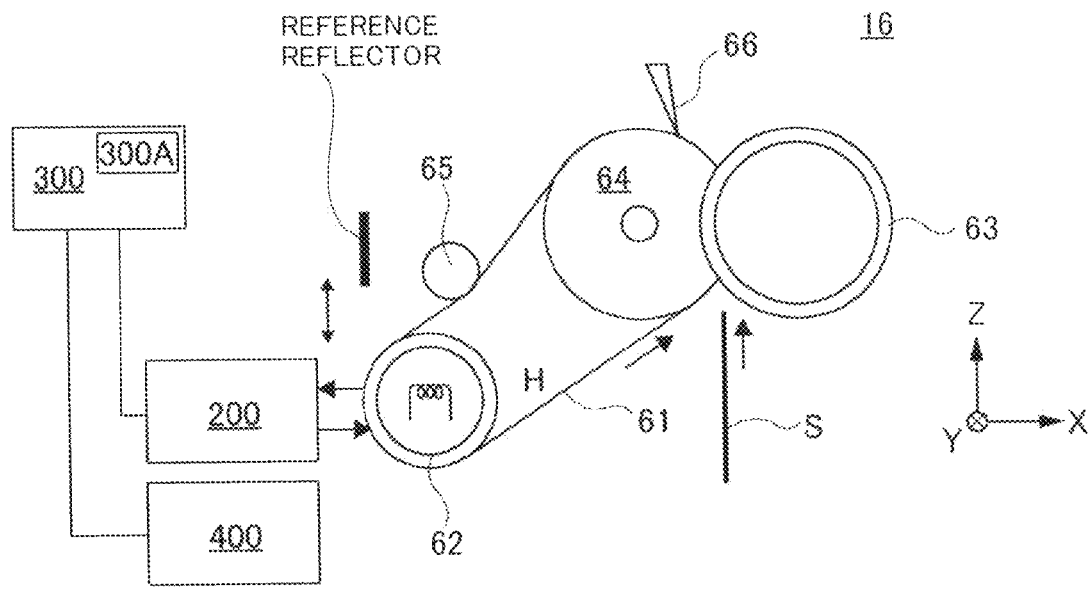
FIGS. 65A and 65B show the moving operation of the reflective optical sensor.
Figure 65B:
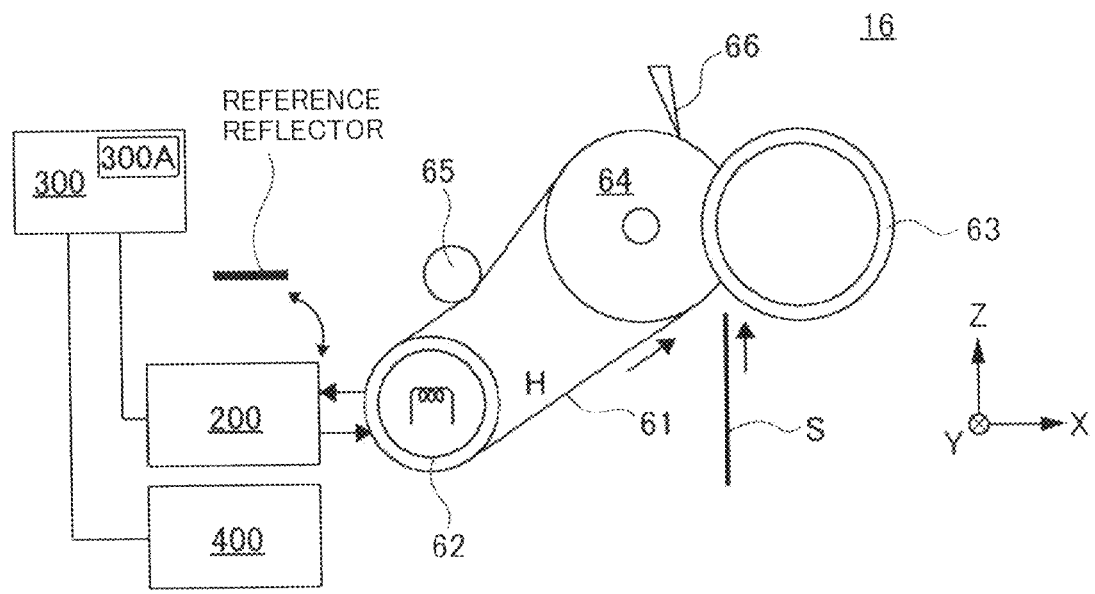

FIGS. 65A and 65B show an example where the reflective optical sensor 200 is moved relative to the fixing belt 61 in FIG. 33. The reflective optical sensor 200 is movable by an actuator. The actuator can be an arbitrary element including a moving stage, a rotary stage, a solenoid mechanism, a feed screw, a linear motor, and a cylinder.

Specifically, as shown in FIG. 65A, the reflective optical sensor 200 can be moved between a position opposite to the fixing belt 61 and a separated position from the opposite position. In this case a reference reflector such as a glass plate can be placed on the optical path from the reflective optical sensor 200 in the separated position.

As shown in FIG. 65B, the reflective optical sensor 200 can be rotatably provided between the position facing the fixing belt 61 and the position facing the reference reflector.

As a result, the position of the reflective optical sensor 200 is changeable between one illuminating the fixing belt 61 and the other not illuminating the same. This can eliminate the necessity for the light shield 600 moved by the actuator and reduce the number of parts and elements accordingly.

Further, according to the reflective optical sensor 200 of the above embodiments, the LEDs and PDs correspond to each other one by one. Alternatively, the reflective optical sensor can be configured to additionally include an optical deflector to deflect a laser beam and at least one PD to receive reflected light by the surface of the fixing belt 61. Or, it can be configured to include a LED and a PD and can be driven by a driver in the main scanning direction.

The parameters including the arrangement pitches of the LEDs and PDs and lens curvature radius should not be limited to the numeric values described above.

Further, a single PD can correspond to a plurality of LEDs instead of the LEDs individually corresponding to the PDs in the above embodiments.

Further, a single PD including a number of light receiving areas can correspond to the LEDs.

Further, the light receiving lens can be arbitrarily structured as long as it can converge the reflected light by the fixing belt 61 in the direction orthogonal to the Y-direction.

Further, the light receiving lenses and light emitting lenses of the light emitting systems can be separately provided rather than integrated.

The aperture element does not need to be always provided between the LED array and the light emitting lenses.

With no use of the aperture element, steps J3 to J6, and J10 in FIG. 48, steps U1 to U4 and U8 in FIG. 49, and steps W3 to W6, W10, W17 to W19 and W23 in FIG. 51 are unneeded.

Further, light can be emitted to at least two positions concurrently in place of sequential light emission to the positions of the fixing belt 61 along the Y-axis.

Further, a target of the detection of the surface information detector should not be limited to the fixing belt. The target can be any object from which the surface information needs to be detected. For example, the transfer belt 11 is set as a target and the surface information thereon can be detected to reduce unevenness of a toner image on a paper S by controlling a charge condition of the charger, exposure condition of the optical scanner 13, develop condition of the developing unit, and transfer condition of the transfer unit according to the surface information on the transfer belt 11.

Further, a polishing unit can be additionally provided in the image forming apparatus to polish the surface of the fixing belt. The polishing unit can polish and reduce a scratch on the surface of the fixing belt. The image forming apparatus can be configured to adjust the position, length of time, and force of polishing by the polishing unit on the basis of a result of detection by the reflective optical sensor to polish the fixing belt to a smooth surface. Thereby, fixing unevenness can be prevented, improving image quality.

According to the above embodiments, the optical scanner 13 as an exposing unit is controlled according to a result of the detection by the reflective optical sensor. Alternatively, a develop bias of the developing unit, a transfer potential of the transfer unit, and a charge potential of the charger can be controlled, for example, to apply a larger toner amount on a scratch portion on the fixing belt 61 than a no-scratch portion.

Further, the image forming apparatus can be a color printer including five or more photoconductor drums or a monochrome printer including a single photoconductor drum.

Further, the light emitter of the reflective optical sensor 200 can be an organic EL element, an edge emitting laser, a surface emitting laser, or another laser, for example, in place of LEDs.

Further, in place of the optical scanner 13 as an image write unit (exposure unit), an optical print head can be adopted. Such an optical print head includes light emitters arrayed in one direction (for example, Y-direction) to emit light beams modulated according to image information to photoconductor drums and form latent images. In this case the light amount of at least one light emitter can be controlled on the basis of a result of the detection by the reflective optical sensor to increase a toner amount on a scratch position on the fixing belt from that on a no-scratch position.

In addition to the glass plate, aperture element, and unused fixing belt 61, the reference reflector is preferably an element not reflecting the surface information on the fixing belt 61 in use, and more preferably an element with even reflectivity in a light receiving area.

Although the present invention has been described in terms of exemplary embodiments, it is not limited thereto. It should be appreciated that variations or modifications may be made in the embodiments described by persons skilled in the art without departing from the scope of the present invention as defined by the following claims. The numbers, locations, shapes, and the like of the elements should not be limited to the above examples, and they can be arbitrarily decided to appropriately implement the present invention.

What is claimed is:

1. A reflective optical sensor for detecting surface information corresponding to a moving element moving in a moving direction, comprising:
   a light emitting system including a plurality of light emitters;

a light emitting lens provided between the plurality of light emitters and a surface of the moving element and formed to become conjugated with the plurality of light emitters, a length of the light emitting lens in a vertical direction relative to the moving direction being longer than a width of the light emitting lens in the moving direction;

at least one light receiver; and a light receiving lens provided between the at least one light receiver and the surface of the moving element, wherein the light emitting system includes a plurality of light emitter groups, and a first light emitter group and a second light emitter group are disposed such that a space between a light emitter of the first light emitter group positioned closest to the second light emitter group and a light emitter of the second light emitter group positioned closest to the first light emitter group is greater than an alignment interval between light emitters in the first light emitter group.

2. The reflective optical sensor according to claim 1, wherein
the length of the light emitting lens in the vertical direction relative to the moving direction is longer than a distance from the plurality of light emitters to the surface of the moving element.

3. The reflective optical sensor according to claim 1, wherein
the plurality of light emitters form light spots at different positions in a direction crossing the moving direction.

4. The reflective optical sensor according to claim 1, wherein
the plurality of light emitters emit light simultaneously.

5. The reflective optical sensor according to claim 1, further comprising:
a plurality of light emitting lenses being arranged in an array, wherein
a vertical direction relative to the array of the light emitting lenses matches the moving direction of the moving element.

6. The reflective optical sensor according to claim 1, further comprising:
a plurality of light receivers being arranged in an array, wherein
an effective diameter of the light receiving lens in a vertical direction relative to the array of light receivers is larger than an effective diameter of the light emitting lens in a vertical direction relative to an array of the light emitting lenses.

7. The reflective optical sensor according to claim 1, further comprising:
a plurality of light receivers being arranged in an array, wherein
a principal ray reflected by the moving element passes a center of an effective diameter area of the light receiving lens in a vertical direction relative to the array of light receivers.

8. An image forming apparatus comprising the reflective optical sensor according to claim 1 which detects the surface information corresponding to the moving element which fixes an image on a recording medium.

9. The image forming apparatus according to claim 8, wherein
the reflective optical sensor is placed at or adjacent to an end of the recording medium carried by the moving element, to detect the surface information corresponding to a portion of the moving element on which the end of the recording medium passes.

10. The image forming apparatus according to claim 8, wherein
the moving element is a fixing belt.

11. The image forming apparatus according to claim 10, further comprising
a heating roller which heats the fixing belt, wherein
the reflective optical sensor is configured to detect the surface information corresponding to the fixing belt moving on the heating roller.

12. An image forming apparatus comprising:
a fixing element which fixes a toner image transferred onto a recording medium;
a detector which detects surface information corresponding to the fixing element, including
a reflective optical sensor including a light emitting system and a light receiving system to receive light reflected by a reference reflector or the fixing element,
a thermal sensor which measures a temperature of the reflective optical sensor, and
a surface information detector which acquires the surface information corresponding to the fixing element according to a first light receiving result of the light receiving system receiving light reflected by the reference reflector at each of a plurality of temperatures, a first measurement result of the thermal sensor, a second light receiving result of the light receiving system receiving light reflected by the fixing element at each of the plurality of temperatures, and a second measurement result of the thermal sensor.

13. The image forming apparatus according to claim 12, wherein
the surface information detector includes a memory in which a value of the first light receiving result and the first measurement result are stored, and acquires, when the light emitting system emits light to the fixing element, the surface information based on the value of the first light receiving result and the first measurement result stored in the memory as well as the second light receiving result and the second measurement result.

14. The image forming apparatus according to claim 13, wherein
the light emitting system emits light to the fixing element before the image forming apparatus is used and after a use of the image forming apparatus is started, and the value of the first light receiving result and the first measurement result are stored in the memory.

15. The image forming apparatus according to claim 12, wherein
the reference reflector includes a glass plate.

16. The image forming apparatus according to claim 12, wherein
the reference reflector is the fixing element in non-use state.

17. The image forming apparatus according to claim 12, wherein
the reflective optical sensor includes an aperture element having apertures through which principal rays of light from a plurality of light emitters individually pass, the aperture element reflects periphery portions of the principal rays, wherein
the surface information detector includes a light shield which is movable between a closed position and an opened position, the closed position being on an optical path between the aperture element and the fixing element or between the fixing element and the light receiving system, and the opened position being separated from the closed position.

18. The image forming apparatus according to claim 12, wherein the reflective optical sensor is movable between a position in which light from the light emitting system illuminates, not the fixing element, but the reference reflector when the light emitting system emits the light to the reference reflector at different temperatures, and a position in which light from the light emitting system illuminates, not the reference reflector, but the fixing element when the light emitting system emits the light to the fixing element.

19. The image forming apparatus according to claim 12, wherein the reference reflector is movable between a position in which light from the light emitting system illuminates, not the fixing element, but the reference reflector when the light emitting system emits the light to the reference reflector at different temperatures, and a position in which light from the light emitting system illuminates, not the reference reflector, but the fixing element when the light emitting system emits the light to the fixing element.

20. A method of detecting surface information corresponding to an object, comprising:

emitting light from a light emitting system of a reflective optical sensor to at least a reference reflector at different temperatures, receiving light reflected by the reference reflector at a light receiving system of the reflective optical sensor, and measuring a first temperature of the reflective optical sensor;

emitting light from the light emitting system to the object, receiving light reflected by the object at the light receiving system, and measuring a second temperature of the reflective optical sensor; and acquiring the surface information corresponding to the object according to a first light receiving result and a first measurement result obtained when light is emitted to the reference reflector, and according to a second light receiving result and a second measurement result obtained when light is emitted to the object.

21. The reflective optical sensor according to claim 1, wherein plurality of light emitter groups are arranged linearly in the vertical direction relative to the moving direction.

* * * * *